(12) United States Patent
Yamaguchi et al.

(10) Patent No.: US 10,183,374 B2
(45) Date of Patent: Jan. 22, 2019

(54) BUFFING APPARATUS, AND SUBSTRATE PROCESSING APPARATUS

(71) Applicant: EBARA CORPORATION, Tokyo (JP)

(72) Inventors: Kuniaki Yamaguchi, Tokyo (JP); Toshio Mizuno, Tokyo (JP); Itsuki Kobata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 265 days.

(21) Appl. No.: 14/834,195

(22) Filed: Aug. 24, 2015

(65) Prior Publication Data

US 2016/0059376 A1 Mar. 3, 2016

(30) Foreign Application Priority Data

| Aug. 26, 2014 | (JP) | 2014-171859 |
| Oct. 15, 2014 | (JP) | 2014-210949 |
| Dec. 9, 2014 | (JP) | 2014-248993 |
| Dec. 18, 2014 | (JP) | 2014-256473 |

(51) Int. Cl.
  *B24B 37/04* (2012.01)
  *B24B 37/10* (2012.01)
  *B24B 37/20* (2012.01)
  *B24B 41/00* (2006.01)

(52) U.S. Cl.
  CPC .............. *B24B 37/04* (2013.01); *B24B 37/10* (2013.01); *B24B 37/20* (2013.01); *B24B 41/002* (2013.01)

(58) Field of Classification Search
  CPC ......... B24B 37/04; B24B 37/10; B24B 37/20; B24B 37/22; B24B 37/24; B24B 41/002
  USPC ...................................... 451/41, 65, 285, 287
  See application file for complete search history.

(56) References Cited

U.S. PATENT DOCUMENTS

| 2,309,016 | A | * | 1/1943 | Ryan | B24D 7/14 |
| | | | | | 451/548 |
| 5,888,120 | A | * | 3/1999 | Doran | B24B 37/005 |
| | | | | | 451/285 |
| 6,135,858 | A | * | 10/2000 | Takahashi | B24B 37/30 |
| | | | | | 451/288 |
| 6,248,006 | B1 | * | 6/2001 | Mukhopadhyay | B24B 37/20 |
| | | | | | 451/285 |
| 6,336,849 | B1 | * | 1/2002 | Konnemann | B24B 41/04 |
| | | | | | 451/259 |
| 6,386,956 | B1 | * | 5/2002 | Sato | B24B 27/0076 |
| | | | | | 451/57 |
| 6,390,905 | B1 | * | 5/2002 | Korovin | B24B 37/30 |
| | | | | | 451/286 |

(Continued)

FOREIGN PATENT DOCUMENTS

| JP | 08-071511 A | 3/1996 |
| JP | 2001-135604 A | 5/2001 |

(Continued)

*Primary Examiner* — Eileen Morgan
(74) *Attorney, Agent, or Firm* — Baker & Hostetler LLP

(57) ABSTRACT

A buffing module for buffing a substrate is provided. The buffing module comprises a buff table for supporting the substrate, the buff table being rotatable; and a buff head to which a buff pad is attached, being rotatable and movable in a direction of approaching the buff table and a direction of moving away from the buff table. The buff pad includes a first part and a second part arranged so as to surround the first part on an outer side of the first part, the first part and the second part have different characteristics from each other.

9 Claims, 37 Drawing Sheets

(56) References Cited

U.S. PATENT DOCUMENTS

| | | | | |
|---|---|---|---|---|
| 6,857,947 B2* | 2/2005 | Wang | ............... | B24B 21/04 |
| | | | | 451/288 |
| 6,905,398 B2* | 6/2005 | Jeong | ............... | B24B 37/20 |
| | | | | 451/259 |
| 7,004,823 B2* | 2/2006 | Kisboll | ............... | B24B 37/26 |
| | | | | 451/461 |
| 7,014,540 B2* | 3/2006 | Nagel | ............... | B24B 7/16 |
| | | | | 451/268 |
| 7,014,542 B1* | 3/2006 | Lu | ............... | B24B 13/01 |
| | | | | 451/461 |
| 7,121,933 B2* | 10/2006 | Kim | ............... | B24B 37/16 |
| | | | | 451/285 |
| 7,261,621 B2* | 8/2007 | Moon | ............... | B24B 53/017 |
| | | | | 451/287 |
| 2004/0023606 A1* | 2/2004 | Wang | ............... | B24B 21/04 |
| | | | | 451/296 |
| 2005/0020198 A1* | 1/2005 | Nagel | ............... | B24B 7/16 |
| | | | | 451/548 |
| 2012/0058709 A1* | 3/2012 | Fukushima | ............... | B24B 37/015 |
| | | | | 451/5 |
| 2014/0342640 A1* | 11/2014 | Fukushima | ............... | B24B 37/005 |
| | | | | 451/24 |

FOREIGN PATENT DOCUMENTS

| | | | |
|---|---|---|---|
| JP | 2001-237206 A | | 8/2001 |
| JP | 2001-310254 A | | 11/2001 |
| JP | 2003-181759 A | | 7/2003 |
| JP | 2010-050436 A | | 3/2010 |
| JP | 2014-53355 | * | 3/2014 |

* cited by examiner

FIG. 9

|  | S10 | S20 | S30 | S40 | S50 |
|---|---|---|---|---|---|
| PROCESSING | PRELOADING | LIGHT POLISHING (SLURRY) | LIQUID REPLACEMENT | CHEMICAL CLEANING (CHEMICAL) | WATER POLISHING (DIW) |
| INNER PAD | ELEVATED | LOWERED | LOWERED | LOWERED | LOWERED |
| OUTER PAD | LOWERED | LOWERED | ELEVATED | ELEVATED | ELEVATED |

FIG. 21

|  | S2-10 | S2-20 | S2-30 | S2-40 | S2-50 |
|---|---|---|---|---|---|
| PROCESSING | PRELOADING | LIGHT POLISHING (SLURRY) | LIQUID REPLACEMENT | CHEMICAL CLEANING (CHEMICAL) | WATER POLISHING (DIW) |
| INNER PAD | ELEVATED | LOWERED | LOWERED | LOWERED | LOWERED |
| OUTER PAD | LOWERED | LOWERED | ELEVATED | ELEVATED | ELEVATED |

BUFFING APPARATUS, AND SUBSTRATE PROCESSING APPARATUS

BACKGROUND OF THE INVENTION

Technical Field

The present invention relates to a substrate buffing technology.

Background Art

In the manufacture of a semiconductor device, a chemical mechanical polishing (CMP) apparatus that polishes a surface of a substrate is known. A substrate processing system including the CMP apparatus includes a polishing unit (CMP unit) for performing substrate polishing processing, a cleaning unit for performing substrate cleaning processing and drying processing, a loading/unloading unit for delivering a substrate to the polishing unit and receiving the substrate cleaned and dried by the cleaning unit, and the like. In the polishing unit, a polishing pad is stuck to an upper surface of a polishing table, and a polishing surface is formed. The polishing unit presses a polishing target surface of the substrate held by a top ring to the polishing surface, and rotates the polishing table and the top ring while supplying slurry as a polishing liquid to the polishing surface. Thus, the polishing surface and the polishing target surface are slidably and relatively moved, and the polishing target surface is polished. Further, the applicant has applied for additionally polishing the substrate slightly and cleaning it by providing a finishing processing unit that presses a contact member smaller in diameter than the substrate to the substrate after being polished and relatively moving it, inside the CMP apparatus separately from a main polishing unit (Japanese Patent Laid-Open No. 8-71511).

Also, the CMP apparatus sometimes includes a buffing unit for performing buffing to a processing object. The buffing unit includes a buff table for installing the processing object, and a buff head to which a buff pad smaller in diameter than the processing object is attached, and performs buffing to the processing object by bringing the buff pad into contact with the processing object and relatively moving it. Here, in order to uniformize a buffing state, it is needed to control a contact state of the buff pad to the processing object.

In this respect, in prior art, a technology of pressurizing a pad to the processing object using an elastic member is disclosed. That is, in the prior art, the pad is attached to the elastic member, an end of the elastic member is held, and a space is formed on a side where the pad is not attached of the elastic member. Then, in the prior art, by injecting a fluid to the space and bending the elastic member to a processing object side, the pad is pressurized to the processing object.

Also, for the purpose of removing polishing liquid and polishing residual or the like on a surface of the processing object after polishing processing, the CMP apparatus is sometimes provided with a processing unit including a table for installing the processing object, a head to which a pad with a diameter smaller than that of the processing object is attached, and an arm that holds the head and is horizontally moved within a processing object surface. The processing unit performs predetermined processing to the processing object by bringing the pad into contact with the processing object and relatively moving it.

As described in Japanese Patent Laid-Open No. 2001-310254, the processing unit sometimes includes a grindstone for chamfering the pad. For the grindstone, a part to be in contact with a corner of the pad is formed into a curved surface of a predetermined curvature. By pressing the corner of the pad to the curved surface of the grindstone while rotating the pad, the processing unit chamfers the corner of the pad.

CITATION LIST

Patent Literature

[Patent Literature 1] Japanese Patent Laid-Open No. 2010-50436

[Patent Literature 2] Japanese Patent Laid-Open No. 8-71511

[Patent Literature 3] Japanese Patent Laid-Open No. 2001-237206

[Patent Literature 4] Japanese Patent Laid-Open No. 2001-310254

In a conventional finishing processing unit, a process liquid is not sufficiently supplied at an interface of the substrate and the contact member brought into contact with the substrate, a polishing speed cannot be sufficiently raised for example, and there is room for improvement in an effect of cleaning. Also, it is desirable that a substrate processing apparatus can perform flexible processing according to situations. Further, it is desirable to improve a processing rate in the substrate processing apparatus.

In a technology of pressurizing the pad to the processing object using the elastic member described above, there is a problem in precise control of the contact state of the pad to the processing object.

That is, in the prior art, by injecting the fluid into the space adjacent to the elastic member and bending the elastic member to the processing object side, the pad is pressurized to the processing object. Here, in the prior art, a side face of a bent part of the elastic member (an expanded part of the space) is not supported, and thus, when the fluid is injected to the space and the pad is rotated and swung while the pad is pressurized to the processing object, there is a risk that a position of the pad is shifted along a surface direction of the processing object. When the position of the pad is shifted, the pad is twisted and distorted due to the position shift, the pad is damaged, the contact state becomes non-uniform, the contact position of the pad and the processing object is shifted, and as a result, there is a risk that accuracy of processing performed by the contact of the pad and the processing object becomes poor.

Therefore, one subject of the claimed invention is to provide a buff head capable of precisely controlling the contact state of a buff pad to a processing object in buffing and improve uniformity of the buffing to the processing object.

In the technology disclosed in Japanese Patent Laid-Open No. 2001-310254, it is not taken into consideration to suppress deterioration of the uniformity of the processing speed due to contact pressure concentration of the processing object and the pad, and to uniformly condition a contact surface of the pad with the processing object.

That is, when the buff pad is brought into contact with the processing object and is relatively moved, a high pressure is generated at a peripheral edge part of the contact surface of the pad in contact with the processing object, compared to the other parts. In other words, the pressure is concentrated at the peripheral edge part of the contact surface of the pad in contact with the processing object. As a result, since the part in contact with the peripheral edge part of the contact surface of the pad in the processing object is processed excessively compared to the other parts, there is a risk that the uniformity of the buffing speed is damaged.

Also, in the technology disclosed in Japanese Patent Laid-Open No. 2001-310254, a grindstone side is fixed, and chamfering is executed by rotation and angle adjustment on a pad side. In the case of executing conditioning of the entire pad surface by this system, since the grindstone side is fixed, even if the grindstone becomes large and is abutted to the entire contact surface of the pad, it is difficult to fix a relative speed distribution within the pad surface just by the rotation of the pad. Therefore, it is difficult to uniformly condition a polishing surface of the pad other than a chamfering part. Here, the non-uniformity of conditioning of the polishing surface of the pad affects the non-uniformity of a polishing performance such as a polishing speed and a flattening performance in polishing thereafter. Also, in the prior art, dust when chamfering the pad is vacuum-sucked, however, complete suction is not guaranteed, and there is a risk that some flows into the pad surface. Also, specific processing for preventing the dust from flowing into the pad surface is not described. Therefore, in the prior art, there is a risk of causing a problem in maintaining cleanness of the pad other than the chamfering part.

Therefore, one subject of the claimed invention is to suppress deterioration of the uniformity within a processing object surface of the processing speed due to press concentration on a buff pad in contact with the processing object, and uniformly condition the contact surface of the pad with the processing object.

SUMMARY OF INVENTION

The present invention is implemented in order to solve at least part of the problems described above, and can be achieved as the following forms.

[Form 1]

According to a form 1 of the present invention, a buff pad for buffing a substrate is provided. The buff pad includes a first part, and a second part arranged so as to surround the first part on an outer side of the first part. The first part and the second part have different characteristics from each other.

The buff pad can be used in a buffing apparatus for buffing a substrate. The buffing apparatus can perform post-processing of the substrate processed in a chemical mechanical polishing apparatus. According to the buffing apparatus as a post-processing apparatus, by performing polishing with a polishing load smaller than that of the chemical mechanical polishing apparatus, final polishing can be performed while suppressing damages (defects) of the substrate, or damages generated in the chemical mechanical polishing apparatus can be removed. Or, compared to conventional roll cleaning or pen cleaning, highly adhesive foreign matters or the like can be efficiently cleaned and removed. Also, since at least one of a physical characteristic and a processing performance differs between the first part and the second part, that is, between the inner side and the outer side, in the buff pad, more advanced buffing can be performed. In the present application, an expression of buffing a substrate includes, other than buffing the substrate itself, buffing a pattern or the like formed at a specific part on the substrate.

[Form 2]

According to a form 2 of the present invention, in the form 1, the characteristics include at least one of a material, hardness, a density, a difference between a single layer and stacked layers, a thickness, a groove shape, compressibility, a pore density, a pore size, a foam structure, water repellency, and hydrophilicity. According to the form, advanced buffing can be performed using a difference between the first part and the second part.

[Form 3]

According to a form 3 of the present invention, in the form 2, Shore hardness D is lower in the second part than in the first part. According to the form, distribution of a process liquid becomes difficult between the second part and the substrate compared to between the first part and the substrate. Therefore, in the case that the process liquid is supplied from the center of the first part through the inside of the first part, the process liquid spreading from the first part to the outer side is easily held on the inner side of the second part. As a result, the process liquid does not easily become insufficient between the first part and the substrate, and the substrate is not easily damaged. Or, a buffing rate can be improved.

[Form 4]

According to a form 4 of the present invention, a buffing apparatus for buffing a substrate is provided. This buffing apparatus includes a buff table for supporting the substrate, the buff table being rotatabe, and one buff head to which the buff pad in one of the form 1 to the form 3 is attached, the one buff head being rotatable and movable in a direction of approaching the buff table and a direction of separating from the buff table, and having an internal supply line for supplying a process liquid for the buffing to the substrate formed inside the buff head. The first part and the second part are attached to the one buff head. By the buffing apparatus, effects similar to that of the form 1 to the form 3 are presented.

[Form 5]

According to a form 5 of the present invention, in the form 4, the first part and the second part are arranged at spaced-apart. According to the form, the process liquid can be made to stay between the first part and the second part. That is, the process liquid spreading from the first part to the outer side is easily held on the inner side of the second part. Therefore, the process liquid does not easily become insufficient between the first part and the substrate, and the substrate is not easily damaged. Or, the buffing rate can be improved.

[Form 6]

According to a form 6 of the present invention, a buffing apparatus for buffing a substrate is provided. This buffing apparatus includes a buff table for supporting the substrate, the buff table being rotatable, a first buff head to which a part of the buff pad in one of the form 1 to the form 3 is attached, the first buff head being rotatabe and movable in a direction of approaching the buff table and a direction of separating from the buff table, and having an internal supply line for supplying a process liquid for the buffing to the substrate formed inside the first buff head, and an annular second buff head to which the other one part of the buff pad in one of the form 1 to the form 3 is attached, the second buff head being arranged so as to surround the first buff head on the outer side of the first buff head, being rotatable, and being movable in the direction of approaching the buff table and the direction of separating from the buff table. The first part is attached to the first buff head, and the second part is attached to the second buff head. According to the buffing apparatus, since a second buff pad attached to the second buff head is brought into contact with the substrate, outflow of the process liquid supplied from the internal supply line formed inside the first buff head to the outside of the second buff pad is suppressed. In other words, a certain amount of the process liquid can be held in an inner side area of the second buff pad. Therefore, a sufficient amount of the process liquid can be uniformly supplied between the first buff pad and the substrate. Thus, the damages of the substrate can be further suppressed. Or, buffing efficiency can be improved.

[Form 7]

According to a form 7 of the present invention, a substrate processing apparatus is provided. The substrate processing apparatus includes a chemical mechanical polishing apparatus, and the buffing apparatus in one of the form 4 to the form 6 for performing post-processing of a substrate processed in the chemical mechanical polishing apparatus. According to the substrate processing apparatus, the effects similar to that of one of the form 1 to the form 6 are presented.

[Form 8]

According to a form 8 of the present invention, a buffing method for buffing a substrate by a buffing apparatus is provided. The buffing method includes a step of attaching, to a buff head, a buff pad including a first part and a second part arranged so as to surround the pad first part on an outer side of the pad first part, a step of arranging a pad substrate at a buff table for supporting the pad substrate, and a step of buffing the pad substrate while supplying a pad process liquid from an internal supply line for supplying the process liquid for buffing to the pad substrate, which is provided inside the pad buff head and the pad first part. The pad first part and the pad second part have different characteristics from each other. According to the method, the effects similar to that of the form 4 are presented.

[Form 9]

According to a form 9 of the present invention, a buffing method for buffing a substrate by a buffing apparatus is provided. The buffing method includes a step of attaching a first buff pad to a first buff head where an internal supply line for supplying a process liquid for buffing to the pad substrate is formed, and attaching a second buff pad to a second buff head arranged so as to surround the first buff head on the outer side of the pad first buff head, a step of arranging the pad substrate at a buff table for supporting the substrate, and a step of buffing the pad substrate while supplying the pad process liquid from the pad internal supply line. A pad first part and a pad second part have different characteristics from each other. According to the method, the effects similar to that of the form 6 are presented.

[Form 10]

According to a form 10 of the present invention, a buffing apparatus for buffing a substrate is provided. This buffing apparatus includes a buff table for supporting the substrate, the buff table being rotatable, a first buff head to which a first buff pad for buffing the substrate is attachable, the first buff head being rotatable and movable in a direction of approaching the buff table and a direction of separating from the buff table, and including an internal supply line for supplying a process liquid for the buffing to the substrate formed inside the first buff head, and an annular second buff head to which a second buff pad for buffing the substrate is attachable, the second buff head being arranged so as to surround the first buff head on the outer side of the first buff head, being rotatable, and being movable in the direction of approaching the buff table and the direction of separating from the buff table.

According to the buffing apparatus, post-processing of the substrate processed in a chemical mechanical polishing apparatus can be performed. According to the buffing apparatus, final polishing can be performed while suppressing damages (defects) of the substrate, or damages generated in the chemical mechanical polishing apparatus can be removed. Or, compared to conventional roll cleaning or pen cleaning, highly adhesive foreign matters or the like can be efficiently cleaned and removed. Also, since the buffing apparatus includes the second buff head on the outer side of the first buff head, the second buff pad attached to the second buff head comes in contact with the substrate and thereby outflow of the process liquid supplied from the internal supply line formed inside the first buff head to the outside of the second buff pad is suppressed. In other words, a certain amount of the process liquid can be held in an inner side area of the second buff pad. Therefore, a sufficient amount of the process liquid can be uniformly supplied between the first buff pad and the substrate. Thus, the damages of the substrate can be further suppressed. Or, buffing efficiency can be improved. In the present application, an expression of buffing a substrate includes, other than buffing the entire substrate, buffing only a specific part on the substrate.

[Form 11]

According to a form 11 of the present invention, in the form 10, the second buff head is movable in the direction of approaching the buff table and the direction of separating from the buff table independent of the first buff head. According to the form, flexible processing can be performed according to situations (for example, a step or quality to be achieved or the like) by selectively using one or both of the first buff head and the second buff head.

[Form 12]

According to a form 12 of the present invention, in the form 10 or the form 11, a control unit configured to control an operation of the buffing apparatus is provided. The control unit may be provided exclusively for the buffing apparatus, or may be provided to be used together by a chemical mechanical polishing apparatus.

[Form 13]

According to a form 13 of the present invention, in the form 12, the control unit is configured to control the buffing apparatus, when performing buffing, so as to arrange the first buff head at a position for bringing the first buff pad into contact with the substrate, arrange the second buff pad at a position for bringing the second buff pad into contact with the substrate, and rotate at least the first buff pad. According to the form, during buffing, a certain amount of the process liquid can be held in the inner side area of the second buff pad. Therefore, a sufficient amount of the process liquid can be uniformly supplied between the first buff pad and the substrate. Thus, the damages of the substrate can be further suppressed.

[Form 14]

According to a form 14 of the present invention, in the form 12 or the form 13, the control unit is configured to control the buffing apparatus so as to arrange the first buff head at a position for bringing the first buff pad into contact with the substrate, arrange the second buff pad at a position for not bringing the second buff pad into contact with the substrate, and rotate at least the first buff pad when performing cleaning after buffing. According to the form, a cleaning liquid used for cleaning can be promptly discharged to the outer side of the second buff pad. Therefore, discharge of products (polished and removed objects or cleaned and removed objects) generated by buffing from the top of the substrate can be accelerated.

[Form 15]

According to a form 15 of the present invention, in one of the form 12 to the form 14, the control unit is configured so as to arrange the second buff pad at a position to be in contact with the substrate and supply the process liquid through the internal supply line before starting buffing. According to the form, a certain amount of the process liquid can be held in the inner side area of the second buff pad before starting buffing. Therefore, a sufficient amount of the process liquid can be preloaded (supplied beforehand) and the damages of the substrate can be suppressed, or cleaning efficiency can be improved.

[Form 16]

According to a form 16 of the present invention, in one of the form 12 to the form 15, the control unit is configured to control the buffing apparatus such that a second pressure of pressurizing the substrate through the second buff pad by the second buff head is different from a first pressure of pressurizing the substrate through the first buff pad by the first buff head, when performing buffing in a state that the first buff pad is arranged at a position for bringing the first buff pad into contact with the substrate and the second buff pad is arranged at a position for bringing the second buff pad into contact with the substrate. According to the form, the first buff head can be used for a purpose of buffing, and the second buff head can be used mainly for a purpose of holding the process liquid. For example, while optimizing the pressure of the first buff head for buffing, the pressure of the second buff head can be controlled to be the minimum pressure required for holding the process liquid.

[Form 17]

According to a form 17 of the present invention, in one of the form 10 to the form 16, the second buff head is rotatable independent of the first buff head. According to the form, further flexible buffing can be performed. For example, while optimizing a rotation number of the first buff head for buffing, a rotation number of the second buff head can be optimized in order to suppress scattering of the process liquid.

[Form 18]

According to a form 18 of the present invention, in one of the form 10 to the form 17, the buffing apparatus further includes the first buff pad attached to the first buff head and the second buff pad attached to the second buff head. The first buff pad and the second buff pad have different characteristics. According to the form, further flexible buffing can be performed. For example, the first buff pad may be determined on the basis of a demanded buffing performance, and as the second pad, a buff pad which is highly adhesive, that is, flexible, may be used in order to improve a process liquid holding performance. Or, by being in combination with the form 11, buffing can be performed using a buff pad of the different characteristic for each area of the substrate.

[Form 19]

According to a form 19 of the present invention, a substrate processing apparatus is provided. The substrate processing apparatus includes a chemical mechanical polishing apparatus, and the buffing apparatus in one of the form 10 to the form 18 for performing post-processing of a substrate processed in the chemical mechanical polishing apparatus. According to the substrate processing apparatus, the effects similar to that of one of the form 10 to the form 18 are presented.

[Form 20]

According to a form 20 of the present invention, a buffing method for buffing a substrate by a buffing apparatus is provided. The method includes a step of arranging the substrate at a buff table for supporting the substrate, and a step of performing buffing while supplying a process liquid from an internal supply line, in a state that a first buff pad attached to a first buff head where the internal supply line for supplying the process liquid for buffing to the substrate is formed is brought into contact with the substrate, and a second buff pad attached to a second buff head arranged so as to surround the first buff head on the outer side of the first buff head is brought into contact with the substrate. According to the method, the effects similar to that of the form 10 are presented.

[Form 21]

According to a form 21 of the present invention, a buffing method for buffing a substrate by a buffing apparatus is provided. The method includes a step of arranging the substrate at a buff table for supporting the substrate, a step of supplying a process liquid from an internal supply line, in a state that a second buff pad attached to a second buff head arranged so as to surround a first buff head on the outer side of the first buff head where the internal supply line for supplying the process liquid for buffing to the substrate is formed is brought into contact with the substrate, and a step of performing buffing while the first buff pad attached to the first buff head is brought into contact with the substrate, after the step of supplying the process liquid. According to the method, the effects similar to that of the form 15 are presented.

[Form 22]

According to a form 22 of the present invention, the buffing method according to the form 20 or the form 21 further includes a step of performing cleaning while supplying a cleaning liquid from the internal supply line, in a state that the first buff pad is brought into contact with the substrate and the second buff pad is not brought into contact with the substrate, after the step of the buffing. According to the method, the effects similar to that of the form 14 are presented.

[Form 23]

According to a form 23 of the claimed invention, a buffing module includes a buff table configured to hold a processing object, and a buff head to which a buff pad for performing buffing to the processing object by being in contact with the processing object and relatively moving is attached, and the buff head includes an elastic member to which the buff pad is attached, a pressurizing mechanism capable of adjusting contact force of the buff pad to the processing object by supplying a fluid to the elastic member, and a guide member that surrounds the entire side face of the elastic member.

[Form 24]

According to a form 24 of the claimed invention, in the form 23 of the buffing module, the guide member can surround the entire side face of the elastic member in a state of supplying the fluid to the elastic member.

[Form 25]

According to a form 25 of the claimed invention, in the buffing module in the form 23 or the form 24, the elastic member may include a bag body whose volume changes according to a supply amount of the fluid, the bag body may include a plurality of spaces where the fluid is not mutually communicated, and the pressurizing mechanism may be able to independently supply the fluid to the plurality of spaces.

[Form 26]

According to a form 26 of the claimed invention, in the buffing module in the form 25, the plurality of spaces may be concentrically arranged.

[Form 27]

According to a form 27 of the claimed invention, in the buffing module in any one of the form 23 to the form 26, a support member attached to a surface on a side to be in contact with the processing object of the elastic member may be provided further, and the buff pad may be attached to the elastic member through the support member.

[Form 28]

According to a form 28 of the claimed invention, in the buffing module in any one of the form 23 to the form 27, the buff pad may be smaller in diameter than the processing object, and further include a driving mechanism capable of rotating the buff table, and a buff arm capable of holding the buff head, rotating the buff head and also swinging it along a plate surface of the processing object.

[Form 29]

According to a form 29 of the claimed invention, a processing apparatus includes a polishing module configured to perform polishing to the processing object, the buffing module in any one of the form 23 to the form 28 configured to perform buffing to the processing object, a cleaning module configured to perform cleaning to the processing object, and a drying module configured to perform drying to the processing object.

[Form 30]

According to a form 30 of the claimed invention, a processing module is for performing predetermined processing to a processing object by bringing the processing object and a buff pad smaller in diameter than the processing object into contact and relatively moving them, the processing module includes a buff table configured to hold the processing object, a head to which the buff pad is attached and configured to pressurize the buff pad to the processing object, an arm for holding the head and relatively moving it with the processing object, and a chamfering structure for chamfering a peripheral edge part of a contact surface in contact with the processing object of the buff pad, and the chamfering structure includes a conditioning part including a dresser for conditioning the buff pad, and a dress table for holding the dresser, and configured to chamfer the peripheral edge part of the contact surface while conditioning the contact surface of the buff pad by the conditioning part.

[Form 31]

According to a form 31 of the claimed invention, in the processing module in the form 30, the chamfering structure is configured to chamfer the peripheral edge part of the contact surface by conditioning the peripheral edge part of the contact surface more strongly than parts other than the peripheral edge part, while conditioning the contact surface of the buff pad by the conditioning part.

[Form 32]

According to a form 32 of the claimed invention, in the processing module in the form 30 or the form 31, the chamfering structure can include: a projection formed at a part where the peripheral edge part of the buff pad is in contact, of the contact surface in contact with the buff pad of the dresser.

[Form 33]

According to a form 33 of the claimed invention, in the processing module in the form 30 or the form 31, the chamfering structure may be realized by arranging the dresser such that the peripheral edge part of the buff pad and the peripheral edge part of the contact surface in contact with the buff pad of the dresser are in contact, when conditioning the buff pad.

[Form 34]

According to a form 34 of the claimed invention, in the processing module in any one of the form 30 to the form 33, the chamfering structure may include a bag body arranged between the head and the buff pad, and a pressurizing mechanism capable of adjusting a pressure of the bag body by supplying a fluid to the bag body, the bag body may include a plurality of spaces arranged such that the fluid is not mutually communicated, and the pressurizing mechanism may be capable of adjusting the pressures of the plurality of spaces such that the pressure of the space at the outermost periphery among the plurality of spaces becomes higher than the pressures of the other spaces.

[Form 35]

According to a form 35 of the claimed invention, in the processing module in any one of the form 30 to the form 34, a processing object may be processed by supplying a process liquid to the processing object, rotating the table and the head, bringing the buff pad into contact with the processing object, and relatively moving the buff pad of the arm and the processing object.

The present invention can be achieved in various forms such as a method for buffing a substrate, in addition to the forms described above.

BRIEF DESCRIPTION OF DRAWINGS

FIG. 9 is a chart illustrating a control example of the buff head in each step of buffing;

FIG. 21 is a chart illustrating a control example of the buff head in each step of buffing;

DESCRIPTION OF EMBODIMENTS

Hereinafter, a buffing apparatus and a substrate processing apparatus relating to one embodiment of the claimed invention will be described on the basis of FIG. 1-FIG. 10.

Figure 1:
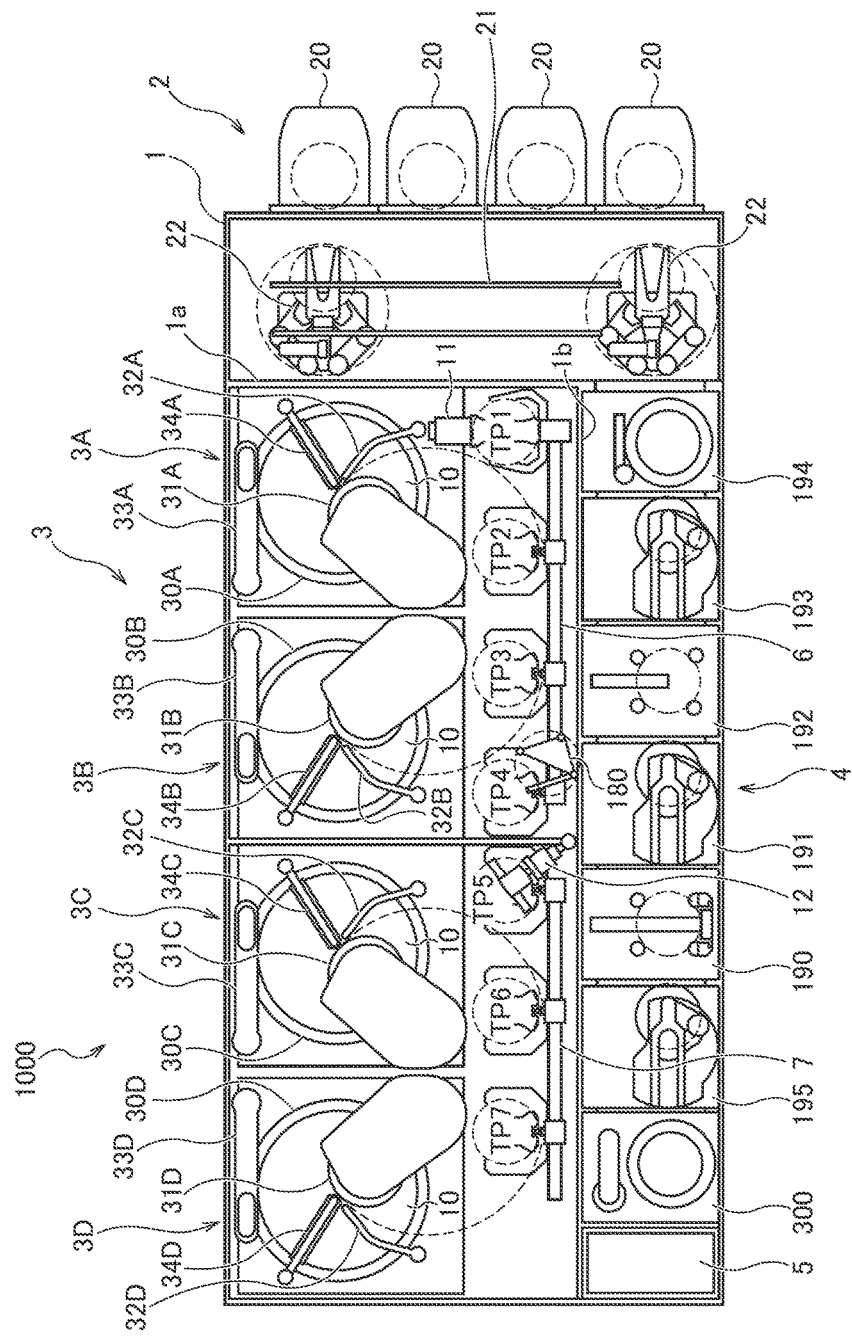
FIG. 1 is a schematic plan view illustrating the entire configuration of a substrate processing apparatus as one embodiment of the present invention.

A. Embodiment:

FIG. 1 is a plan view illustrating the entire configuration of the substrate processing apparatus relating to one embodiment of the present invention. As illustrated in FIG. 1, a substrate processing apparatus 1000 includes a roughly rectangular housing 1. The inside of the housing 1 is sectioned into a loading/unloading unit 2, a polishing unit 3, and a cleaning unit 4 by partitions 1a and 1b. The loading/unloading unit 2, the polishing unit 3 and the cleaning unit 4 are respectively independently assembled, and independently exhausted. Also, the cleaning unit 4 includes a power supply unit (omitted in the figure) that supplies power to the substrate processing apparatus, and a controller 5 that controls a substrate processing operation.

The loading/unloading unit 2 includes two or more (four, in this embodiment) front loading units 20 where a wafer cassette that stocks many wafers (substrates) is mounted. These front loading units 20 are arranged adjacently to the housing 1, and arrayed along a width direction (a direction vertical to a longitudinal direction) of the substrate processing apparatus. The front loading units 20 are configured so as to load an open cassette, an SMIF (Standard Manufacturing Interface) pod or an FOUP (Front Opening Unified Pod).

Also, at the loading/unloading unit 2, a traveling mechanism 21 is arranged along an array of the front loading units 20. On the traveling mechanism 21, two transport robots 22 movable along an array direction of the wafer cassettes are installed. The transport robots 22 are configured so as to access the wafer cassettes loaded on the front loading units 20 by moving on the traveling mechanism 21. Each transport robot 22 takes out a wafer before processing from the wafer cassette, and returns a processed wafer to the wafer cassette.

The polishing unit 3 is an area where the wafer is polished (flattened). The polishing unit 3 includes a first polishing unit 3A, a second polishing unit 3B, a third polishing unit 3C, and a fourth polishing unit 3D. These polishing units 3A-3D are arrayed along the longitudinal direction of the substrate processing apparatus, as illustrated in FIG. 1.

As illustrated in FIG. 1, the first polishing unit 3A includes a polishing table 30A to which a polishing pad 10 having a polishing surface is attached, a top ring 31A for holding the wafer and polishing it while pressurizing it to the polishing pad 10 on the polishing table 30A, a polishing liquid supply nozzle 32A for supplying a polishing liquid or a dressing liquid (for example, pure water) to the polishing pad 10, a dresser 33A for dressing the polishing surface of the polishing pad 10, and an atomizer 34A that jets a fluid mixture of the liquid (for example, the pure water) and a gas (for example, a nitrogen gas) or the liquid (for example, the pure water) to the polishing surface in a mist shape.

Similarly, the second polishing unit 3B includes a polishing table 30B, a top ring 31B, a polishing liquid supply nozzle 32B, a dresser 33B, and an atomizer 34B. The third polishing unit 3C includes a polishing table 30C, a top ring 31C, a polishing liquid supply nozzle 32C, a dresser 33C, and an atomizer 34C. The fourth polishing unit 3D includes a polishing table 30D, a top ring 31D, a polishing liquid supply nozzle 32D, a dresser 33D, and an atomizer 34D.

Since the first polishing unit 3A, the second polishing unit 3B, the third polishing unit 3C and the fourth polishing unit 3D have the mutually same configuration, only the first polishing unit 3A will be described hereinafter.

Figure 2:
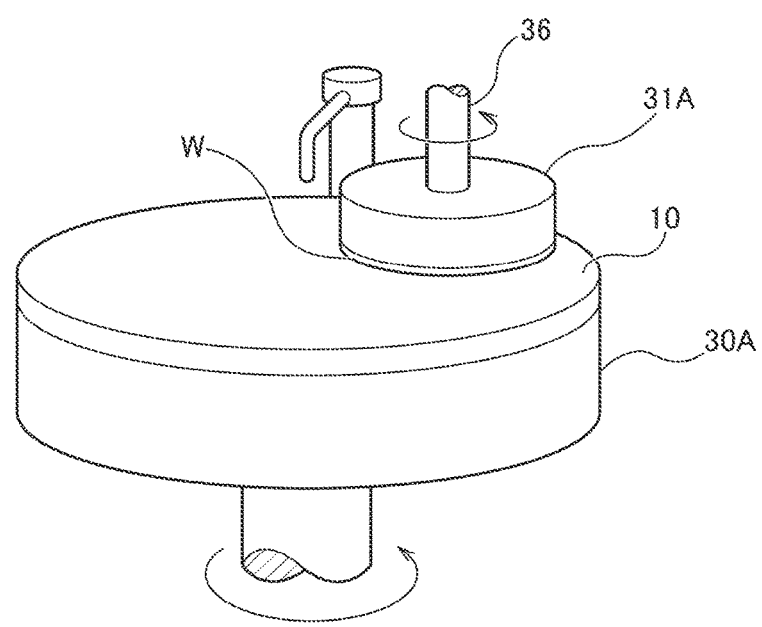
FIG. 2 is a perspective view schematically illustrating a polishing unit.

FIG. 2 is a perspective view schematically illustrating the first polishing unit 3A. The top ring 31A is supported by a top ring shaft 36. To an upper surface of the polishing table 30A, the polishing pad 10 is stuck. An upper surface of the polishing pad 10 forms a polishing surface that polishes a wafer W. Instead of the polishing pad 10, fixed abrasive can be also used. The top ring 31A and the polishing table 30A are configured so as to be rotated around the axial center as illustrated by arrows. The wafer W is held by vacuum suction at a lower surface of the top ring 31A. During polishing, the polishing liquid is supplied from the polishing liquid supply nozzle 32A to the polishing surface of the polishing pad 10, and the wafer W which is a polishing object is pressurized to the polishing surface by the top ring 31A and polished.

Next, a transport mechanism for transporting the wafer will be described. As illustrated in FIG. 1, a first linear transporter 6 is arranged adjacently to the first polishing unit 3A and the second polishing unit 3B. The first linear transporter 6 is a mechanism that transports the wafer among four transport positions (a first transport position TP1, a second transport position TP2, a third transport position TP3, and a fourth transport position TP4 in order from a loading/unloading unit side) along an array direction of the polishing units 3A and 3B.

Also, adjacently to the third polishing unit 3C and the fourth polishing unit 3D, a second linear transporter 7 is arranged. The second linear transporter 7 is a mechanism that transports the wafer among three transport positions (a fifth transport position TP5, a sixth transport position TP6, and a seventh transport position TP7 in order from the loading/unloading unit side) along an array direction of the polishing units 3C and 3D.

The wafer is transported to the polishing units 3A and 3B by the first linear transporter 6. The top ring 31A of the first polishing unit 3A is moved between a polishing position and the second transport position TP2 by a swing operation of a top ring head. Therefore, the wafer is delivered to the top ring 31A at the second transport position TP2. Similarly, the top ring 31B of the second polishing unit 3B is moved between the polishing position and the third transport position TP3, and the wafer is delivered to the top ring 31B at the third transport position TP3. The top ring 31C of the third polishing unit 3C is moved between the polishing position and the sixth transport position TP6, and the wafer is delivered to the top ring 31C at the sixth transport position TP6. The top ring 31D of the fourth polishing unit 3D is moved between the polishing position and the seventh transport position TP7, and the wafer is delivered to the top ring 31D at the seventh transport position TP7.

At the first transport position TP1, a lifter 11 for receiving the wafer from the transport robot 22 is arranged. The wafer is delivered from the transport robot 22 to the first linear transporter 6 through the lifter 11. Among the first linear transporter 6, the second linear transporter 7 and the cleaning unit 4, a swing transporter 12 is arranged. The swing transporter 12 has a hand movable between the fourth transport position TP4 and the fifth transport position TP5. The wafer is delivered from the first linear transporter 6 to the second linear transporter 7 by the swing transporter 12. The wafer is transported to the third polishing unit 3C and/or the fourth polishing unit 3D by the second linear transporter 7. Also, the wafer polished in the polishing unit 3 is transported to a temporary base 180 by the swing transporter 12. The wafer mounted on the temporary base 180 is transported to the cleaning unit 4.

Figure 3A:
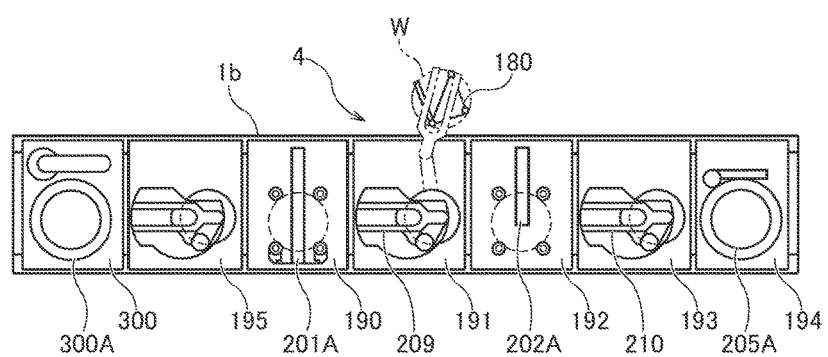
FIG. 3A is a schematic plan view of a cleaning unit.
Figure 3B:
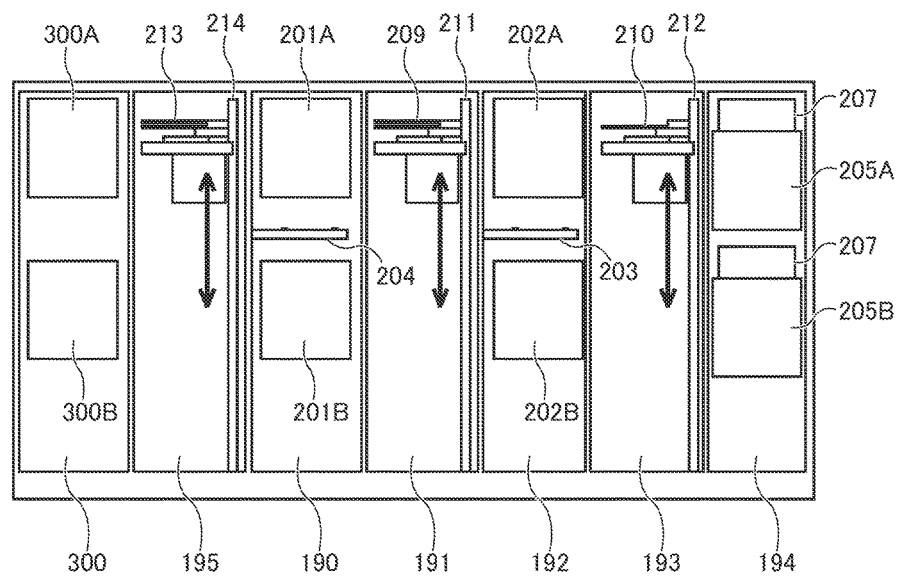
FIG. 3B is a schematic side view of the cleaning unit.

FIG. 3A is a plan view illustrating the cleaning unit 4, and FIG. 3B is a side view illustrating the cleaning unit 4. As illustrated in FIG. 3A and FIG. 3B, the cleaning unit 4 is sectioned into a roll cleaning chamber 190, a first transport chamber 191, a pen cleaning chamber 192, a second transport chamber 193, a drying chamber 194, a buffing chamber 300, and a third transport chamber 195.

Inside the roll cleaning chamber 190, an upper side roll cleaning module 201A and a lower side roll cleaning module 201B arrayed along a longitudinal direction are arranged. The upper side roll cleaning module 201A is arranged above the lower side roll cleaning module 201B. The upper side roll cleaning module 201A and the lower side roll cleaning module 201B are cleaners that clean the wafer by respectively pressing two rotating roll sponges to front and back surfaces of the wafer while supplying a cleaning liquid to the front and back surfaces of the wafer. Between the upper side roll cleaning module 201A and the lower side roll cleaning module 201B, a temporary base 204 of the wafer is provided.

Inside the pen cleaning chamber 192, an upper side pen cleaning module 202A and a lower side pen cleaning module 202B arrayed along the longitudinal direction are arranged.

The upper side pen cleaning module 202A is arranged above the lower side pen cleaning module 202B. The upper side pen cleaning module 202A and the lower side pen cleaning module 202B are cleaners that clean the wafer by pressing a rotating pencil sponge to the front surface of the wafer and swinging it in a radial direction of the wafer while supplying the cleaning liquid to the front surface of the wafer. Between the upper side pen cleaning module 202A and the lower side pen cleaning module 202B, a temporary base 203 of the wafer is provided.

Inside the drying chamber 194, an upper side drying module 205A and a lower side drying module 205B arrayed along the longitudinal direction are arranged. The upper side drying module 205A and the lower side drying module 205B are isolated from each other. At upper parts of the upper side drying module 205A and the lower side drying module 205B, filter fan units 207 and 207 that supply clean air into the drying modules 205A and 205B respectively are provided.

In the first transport chamber 191, a vertically movable first transport robot (transport mechanism) 209 is arranged. In the second transport chamber 193, a vertically movable second transport robot 210 is arranged. In the third transport chamber 195, a vertically movable third transport robot (transport mechanism) 213 is arranged. The first transport robot 209, the second transport robot 210, and the third transport robot 213 are freely movably supported respectively by support shafts 211, 212 and 214 extending in the longitudinal direction. The first transport robot 209, the second transport robot 210 and the third transport robot 213 have a drive mechanism such as a motor inside, and are configured vertically movably along the support shafts 211, 212 and 214. The first transport robot 209 has hands in two upper and lower stages. The first transport robot 209 is arranged at such a position that the hand on the lower side can access the above-described temporary base 180 as illustrated by a dotted line in FIG. 3A.

The first transport robot 209 is operated so as to transport the wafer W among the temporary base 180, the upper side roll cleaning module 201A, the lower side roll cleaning module 201B, the temporary base 204, the temporary base 203, the upper side pen cleaning module 202A, and the lower side pen cleaning module 202B. The first transport robot 209 uses the hand on the lower side when transporting the wafer before cleaning (the wafer to which slurry is stuck), and uses the hand on the upper side when transporting the wafer after cleaning.

The second transport robot 210 is operated so as to transport the wafer W among the upper side pen cleaning module 202A, the lower side pen cleaning module 202B, the temporary base 203, the upper side drying module 205A, and the lower side drying module 205B. The second transport robot 210 is provided with only one hand since it transports only the cleaned wafer. The transport robot 22 illustrated in FIG. 1 takes out the wafer from the upper side drying module 205A or the lower side drying module 205B using the hand on the upper side, and returns the wafer to the wafer cassette.

The buffing chamber 300 includes an upper side buffing module 300A, and a lower side buffing module 300B. The third transport robot 213 is operated so as to transport the wafer W among the upper side roll cleaning module 201A, the lower side roll cleaning module 201B, the temporary base 204, the upper side buffing module 300A, and the lower side buffing module 300B.

In the present embodiment, an example that the buffing chamber 300, the roll cleaning chamber 190, and the pen cleaning chamber 192 are arranged in order from a side far from the loading/unloading unit 2 inside the cleaning unit 4 is illustrated, however, it is not limited thereto. An arranging form of the buffing chamber 300, the roll cleaning chamber 190, and the pen cleaning chamber 192 can be appropriately selected according to quality of the wafer and throughput or the like. Since the upper side buffing module 300A and the lower side buffing module 300B are of the similar configuration, hereinafter, only the upper side buffing module 300A will be described.

Figure 4:
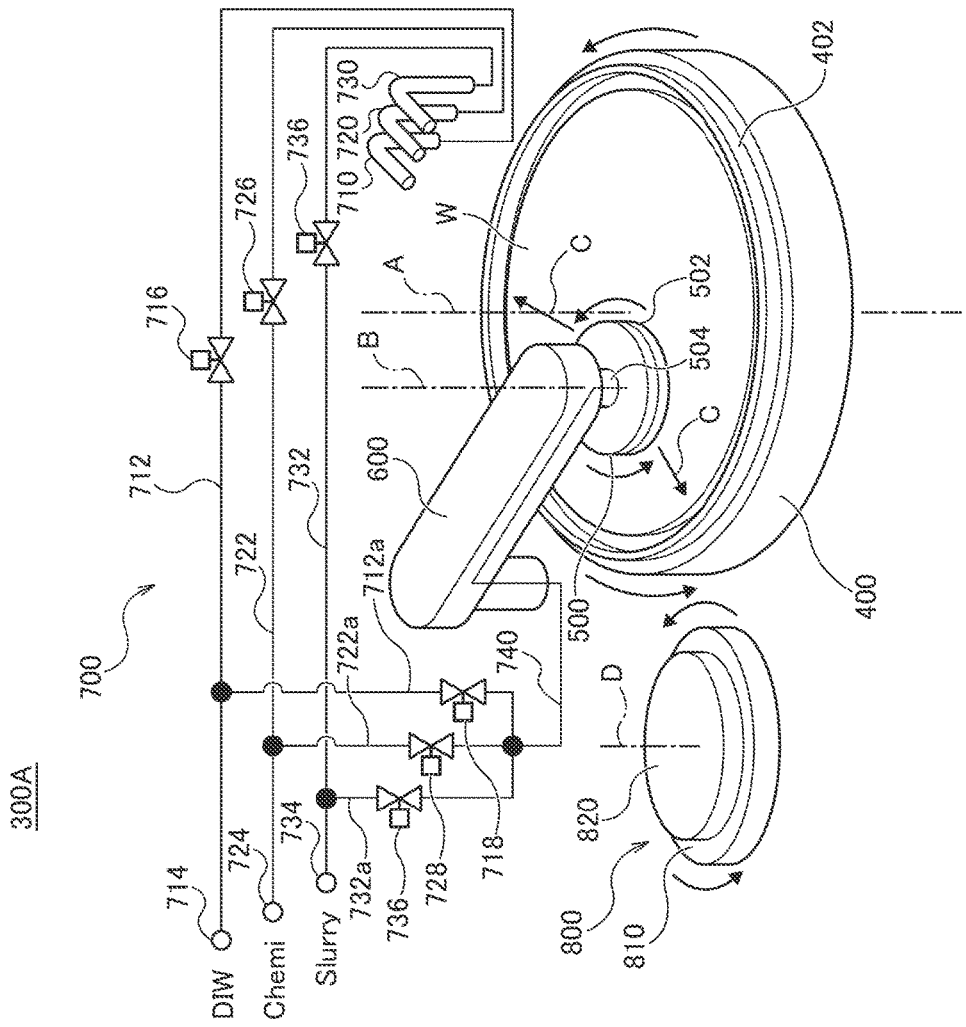
FIG. 4 is a diagram illustrating a schematic configuration of a buffing module.

FIG. 4 is a diagram illustrating a schematic configuration of the upper side buffing module. As illustrated in FIG. 4, the buffing module 300A includes a buff table 400 for supporting the wafer W as one kind of the substrate, a buff head 500 to which a buff pad 502 for performing buffing to a processing surface of the wafer W is attached, a buff arm 600 for holding the buff head 500, a liquid supply system 700 for supplying various kinds of process liquids, and a conditioning unit 800 for performing conditioning (setting) of the buff pad 502.

The buff table 400 has a mechanism that holds the wafer W. The wafer holding mechanism is a vacuum suction system in the present embodiment, however, it can be an arbitrary system. For example, the wafer holding mechanism may be a clamp system of clamping the front surface and back surface of the wafer W at at least one part of a peripheral edge part of the wafer W, or may be a roller chuck system of holding a side face of the wafer W at at least one part of the peripheral edge part of the wafer W. In the present embodiment, the buff table 400 holds the wafer W so that a machining surface of the wafer W is turned upwards.

Also, the buff table 400 is configured so as to be rotated around a rotary axis A by a drive mechanism not shown in the figure. At the buff arm 600, the buff pad 502 for buffing the wafer W is attached to a surface facing the buff table 400 of a rotatably configured shaft 504. The buff arm 600 is configured so as to rotate the buff head 500 around a rotary axis B. Also, since an area of the buff pad 502 is smaller than an area of the wafer W (or, the buff table 400), in order to uniformly buff the wafer W, the buff arm 600 is configured so as to swing the buff head 500 in the radial direction of the wafer W as illustrated by an arrow C. Also, the buff arm 600 is configured so as to swing the buff head 500 to a position at which the buff pad 502 faces the conditioning unit 800. The buff head 500 is configured movably in a direction of approaching the buff table 400 and a direction of separating from the buff table 400 (in the present embodiment, vertically) by an actuator (not shown in the figure). Thus, the buff pad 502 can be pressurized to the wafer W with a predetermined pressure. The configuration may be achieved by expansion and contraction of the shaft 504, or may be achieved by vertical movement of the buff arm 600.

The liquid supply system 700 includes a pure water external nozzle 710 for supplying pure water (in the figure, displayed as DIW) to the processing surface of the wafer W. The pure water external nozzle 710 is connected through pure water piping 712 to a pure water supply source 714. The pure water piping 712 is provided with an on-off valve 716 capable of opening and closing the pure water piping 712. The controller 5 can supply the pure water to the processing surface of the wafer W at arbitrary timing by controlling opening and closing of the on-off valve 716.

Also, the liquid supply system 700 includes a chemical external nozzle 720 for supplying chemical (in the figure, displayed as Chemi) to the processing surface of the wafer W. The chemical external nozzle 720 is connected through chemical piping 722 to a chemical supply source 724. The chemical piping 722 is provided with an on-off valve 726 capable of opening and closing the chemical piping 722. The controller 5 can supply the chemical to the processing surface of the wafer W at arbitrary timing by controlling opening and closing of the on-off valve 726.

Also, the liquid supply system 700 includes a slurry external nozzle 730 for supplying slurry (in the figure, displayed as Slurry) to the processing surface of the wafer W. The slurry external nozzle 730 is connected through slurry piping 732 to a slurry supply source 734. The slurry piping 732 is provided with an on-off valve 736 capable of opening and closing the slurry piping 732. The controller 5 can supply the slurry to the processing surface of the wafer W at arbitrary timing by controlling opening and closing of the on-off valve 736.

In the present embodiment, the external nozzles 710, 720 and 730 are all position-fixed, and supply the pure water, the chemical or the slurry toward a predetermined fixed position. These process liquids are supplied to such a position that the process liquids are efficiently supplied to the buff pad 502 by rotation of the wafer W. The external nozzles 710, 720 and 730 may be configured as one or two nozzles in common to two or more of the various kinds of process liquids. Also, the external nozzle may be configured to supply at least one kind of the process liquid among the pure water, the chemical and the slurry.

The buffing module 300A is further configured so as to selectively supply the process liquid (the pure water, the chemical, or the slurry) to the processing surface of the wafer W through the buff arm 600, the buff head 500, and the buff pad 502. That is, branch pure water piping 712a is branched from between the pure water supply source 714 and the on-off valve 716 in the pure water piping 712. Similarly, branch chemical piping 722a is branched from between the chemical supply source 724 and the on-off valve 726 in the chemical piping 722. Branch slurry piping 732a is branched from between the slurry supply source 734 and the on-off valve 736 in the slurry piping 732. The branch pure water piping 712a, the branch chemical piping 722a and the branch slurry piping 732a are merged to liquid supply piping 740. The branch pure water piping 712a is provided with an on-off valve 718 capable of opening and closing the branch pure water piping 712a. The branch chemical piping 722a is provided with an on-off valve 728 capable of opening and closing the branch chemical piping 722a. The branch slurry piping 732a is provided with an on-off valve 736 capable of opening and closing the branch slurry piping 732a.

Figure 5:
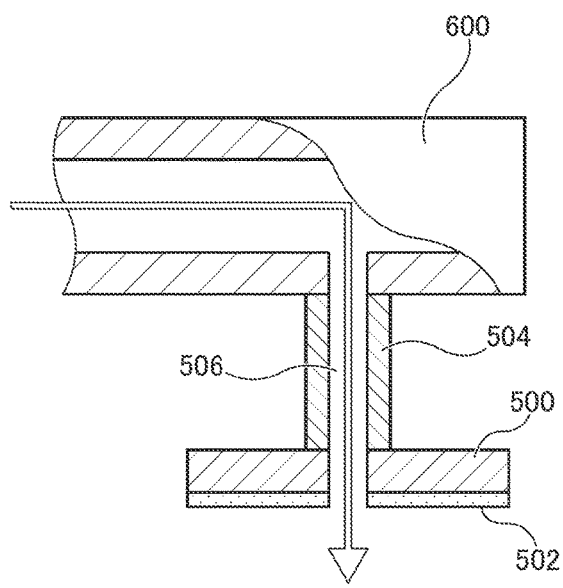
FIG. 5 is a schematic diagram illustrating an internal structure of a buff head.

The liquid supply piping 740 is communicated with an inner part of the buff arm 600, a center inner part of the buff head 500, and a center inner part of the buff pad 502. Specifically, as illustrated in FIG. 5, an internal supply line 506 is formed inside the buff arm 600, the buff head 500 and the buff pad 502, and the internal supply line 506 is communicated with the liquid supply piping 740. The internal supply line 506 is opened toward an upper surface of the buff table 400 (the processing surface of the wafer W). By the configuration, during the buffing, the process liquid is supplied from the center of the buff pad 502 through the internal supply line 506, and can be uniformly spread between the buff pad 502 and the wafer W by centrifugal force by the rotation of the buff head 500 and a supply pressure of the process liquid.

In the case of supplying the process liquid from the nozzle provided outside the buff head 500 to the wafer W, there is a risk that the process liquid is not sufficiently spread to the center of the buff pad 502 when the buff table 400 is rotated at a high speed. This is due to increase of the centrifugal force by the high-speed rotation. Also, in the case of performing the buffing to the wafer W with a relatively large diameter (for example, buffing chamber 300 mm), the diameter of the buff head 500 also becomes relatively large (for example, 100 mm) in order to efficiently perform the buffing. Therefore, when the process liquid is supplied outside the buff pad 502, there is a risk that the process liquid is not sufficiently spread to the center of the buff pad 502. When these events occur, a buffing rate (a polishing rate or a cleaning rate) declines. However, by the configuration of supplying the process liquid from the internal supply line 506 in the present embodiment, since the process liquid is uniformly spread between the buff pad 502 and the wafer W as described above, decline of the buffing rate due to insufficiency of the process liquid can be suppressed. Also, the damages of the wafer W by the insufficiency of the process liquid can be suppressed.

In the present embodiment, only one opening of the internal supply line 506 is provided on the center of the buff pad 502, however, the plurality of openings may be provided. For example, the internal supply line 506 may be branched toward the plurality of openings that are dispersedly arranged, through a water pool jacket structure formed inside the buff head 500. The plurality of openings may be dispersedly arranged so that their positions in the radial direction are different. The controller 5 can supply one of the pure water, the chemical and the slurry or a liquid mixture of an arbitrary combination of them to the processing surface of the wafer W at the arbitrary timing by controlling opening and closing of the on-off valve 718, the on-off valve 728, and the on-off valve 736. As it is clear from the above description, the buffing module 300A includes process liquid supply means of two systems that are the external nozzles 710, 720 and 730 and the internal supply line 506. One or both of the two systems can be selectively used.

The buffing module 300A can perform the buffing to the wafer W by supplying the process liquid to the wafer W through at least one of the external nozzles 710, 720 and 730 and the internal supply line 506, rotating the buff table 400 around the rotary axis A, pressurizing the buff pad 502 to the processing surface of the wafer W, and swinging the buff head 500 in the direction of the arrow C while rotating it around the rotary axis B. In the present embodiment, an operation of the buffing module 300A is controlled by the controller 5. The buffing module 300A may be controlled by a control module exclusive for the buffing module 300A instead of the controller 5. The relative movement of the buff table 400 and the buff head 500 during the buffing is not limited to the above-described example, and may be achieved by at least one of rotary movement, translational movement, circular arc movement, reciprocating movement, scroll movement, and angle rotary movement (movement of rotating only by a predetermined angle smaller than 360 degrees).

In the present application, the buffing includes at least one of buff polishing and buff cleaning. The buff polishing is processing of polishing and removing the processing surface of the wafer W by relatively moving the wafer W and the buff pad 502 while bringing the buff pad 502 into contact with the wafer W and interposing the slurry between the wafer W and the buff pad 502. In the buff polishing, normally, so-called final polishing is performed after main polishing performed for a purpose of flattening ruggedness on the surface of the wafer or removing an excessive film formed on the surface other than a trench or a via inner part. A removal machining amount of the buff polishing is about several nanometers to more than ten nanometers for example. As the buff pad 502, for example, a pad for which foamed polyurethane and nonwoven fabric are laminated (specifically, for example, IC1000®/SUBA® system that can be obtained in a market) or a suede-like porous polyurethane non-fibrous pad (specifically, for example, POLITEX® that can be obtained in a market) or the like can be used. The buff polishing is the processing capable of adding, to the wafer W, physical acting force stronger than physical acting force added to the wafer W by the roll sponge composed of PVA in the roll cleaning chamber 190 and physical acting force added to the wafer W by the pen sponge composed of the PVA in the pen cleaning chamber 192. By the buff polishing, removal of a surface layer part with damages such as a scratch or a surface layer part to which foreign matters are stuck, additional removal of a part not removed in the main polishing in the polishing unit 3, or improvement of morphology such as ruggedness of a minute area or a film thickness distribution after the main polishing can be achieved.

The buff cleaning is final processing of removing foreign matters on the surface of the wafer W and reforming the processing surface by relatively moving the wafer W and the buff pad 502 while bringing the buff pad 502 into contact with the wafer W and interposing a cleaning process liquid (the chemical, the pure water, or the mixture thereof) between the wafer W and the buff pad 502. As the buff pad 502, the above-described IC1000®/SUBA® system or POLITEX® or the like is used. The buff cleaning is the processing capable of adding, to the wafer W, the physical acting force stronger than the physical acting force added to the wafer W by the roll sponge composed of the PVA in the roll cleaning chamber 190 and the physical acting force added to the wafer W by the pen sponge composed of the PVA in the pen cleaning chamber 192. By the buff cleaning, highly adhesive foreign matters that cannot be removed just by bringing a sponge material composed of the PVA into contact can be efficiently cleaned and removed. Also, it is possible to use a PVA sponge as the buff pad for the buff cleaning in the present invention.

By adopting such buffing as post-processing of the wafer W to which chemical mechanical polishing is performed, the final polishing can be performed while suppressing the damages of the wafer W, or the damages generated by the chemical mechanical polishing can be removed. Or, compared to conventional roll cleaning or pen cleaning, highly adhesive foreign matters or the like can be efficiently cleaned and removed.

The conditioning unit 800 is a member for conditioning (dressing) the surface of the buff pad 502. In the present embodiment, the conditioning unit 800 is arranged outside the buff table 400. As an alternative form, the conditioning unit 800 may be moved to an upper part of the buff table 400 and a lower part of the buff head 500, and condition the buff pad 502. In this case, it is desirable that conditioning is performed after the processed wafer W is carried away. The conditioning unit 800 includes a dress table 810, and a dresser 820 installed to the dress table 810. The dress table 810 is configured so as to be rotated around a rotary axis D by a drive mechanism not shown in the figure. The dresser 820 is, for example, formed of a diamond dresser, a brush dresser, or the combination thereof.

The buffing module 300A turns the buff arm 600 until the buff pad 502 is at a position facing the dresser 820 when conditioning the buff pad 502. The buffing module 300A conditions the buff pad 502 by rotating the dress table 810 around the rotary axis D, also rotating the buff head 500, and pressing the buff pad 502 to the dresser 820. Such a conditioning operation can be performed while replacing the buffed wafer W with the wafer W to be buffed next, for example.

Figure 6A:
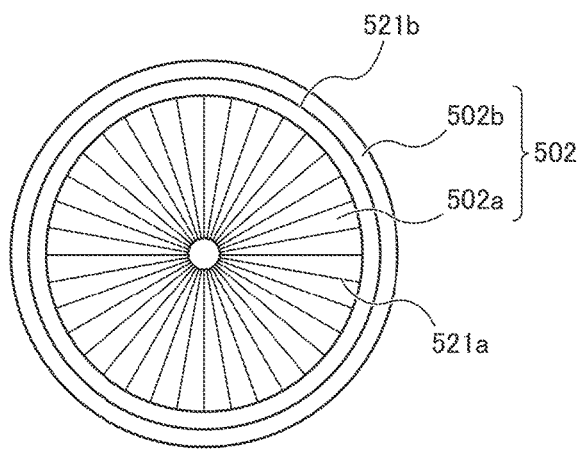
FIG. 6A is an illustration diagram illustrating one example of a configuration of a buff pad.
Figure 6B:
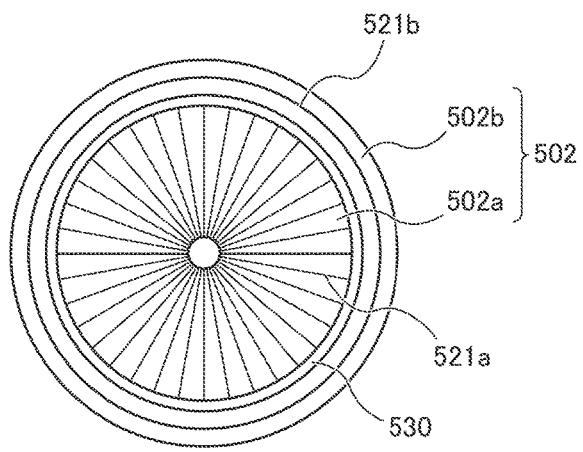
FIG. 6B is an illustration diagram illustrating another example of the configuration of the buff pad.

FIG. 6A and FIG. 6B are illustration diagrams illustrating examples of the configuration of the buff pad. In the example illustrated in FIG. 6A, the buff pad 502 includes a first part 502a and a second part 502b. The second part 502b is arranged so as to surround the periphery of the first part 502a on an outer side of the first part 502a. In this example, the second part 502b is arranged without a gap on the outer periphery of the first part 502a. At the first part 502a, a plurality of grooves 521a formed radially from an opening at the center are formed. The grooves 521a are formed in order to easily guide a supply liquid supplied from the opening to a radial direction outer side, that is, in order to make the supply liquid easily spread over the entire first part 502a. At the second part 502b, an annular groove 521b is formed along the circumferential direction. The groove 521b is formed in order to capture the supply liquid moved toward the radial direction outer side and make it difficult to flow out to the outer side of the groove 521b. In this way, the first part 502a and the second part 502b have different groove shapes. In other words, at the first part 502a and the second part 502b, a shape of the processing surface is different. The shapes of the grooves 521a and 521b can be an arbitrary shape according to the purpose. Also, at least one of the grooves 521a and 521b may not be formed. The first part 502a and the second part 502b may be integrally molded, or may be individually molded. In the case that they are individually molded, the first part 502a and the second part 502b may be integrated by an adhesive agent or the like, or may be separate. In the case of being separate, the first part 502a and the second part 502b may be separately attached to the buff head 500.

In the present embodiment, further, the first part 502a and the second part 502b have different characteristics. Specifically, the first part 502a and the second part 502b are selected such that easiness of distribution of the supply liquid between the second part 502b and the wafer W becomes less than the easiness of the distribution of the supply liquid between the first part 502a and the wafer W. The difference between them is, for example, provided by differences of various physical characteristics other than the shape of the processing surface described above. Such physical characteristics include, for example, a material, hardness (Shore hardness D for example), a density, a single layer/stacked layers (a combination of a lower layer/an upper layer), a thickness, a groove shape, compressibility, a pore density (the number of pores), a pore size, a foam structure (an open cell or a closed cell), water repellency/hydrophilicity or the like. By the configuration, the process liquid supplied from the internal supply line 506 does not easily flow out to the outside of the second part 502b. As a result, since the process liquid is uniformly spread between the first part 502a and the wafer W, the decline of the buffing rate due to the process liquid insufficiency can be further suppressed. Also, the damages of the wafer W by the processing liquid insufficiency can be further suppressed.

FIG. 6B illustrates another example of the buff pad 502. A difference from FIG. 6A is that the first part 502a and the second part 502b are separated. That is, an outer diameter of the first part 502a is smaller than an inner diameter of the second part 502b. Thus, between the first part 502a and the second part 502b, a gap 530 is formed. When such a buff pad 502 is used, since the process liquid can be made to stay in the gap 530, the effects of the configuration in FIG. 6A can be further improved.

Figure 7:
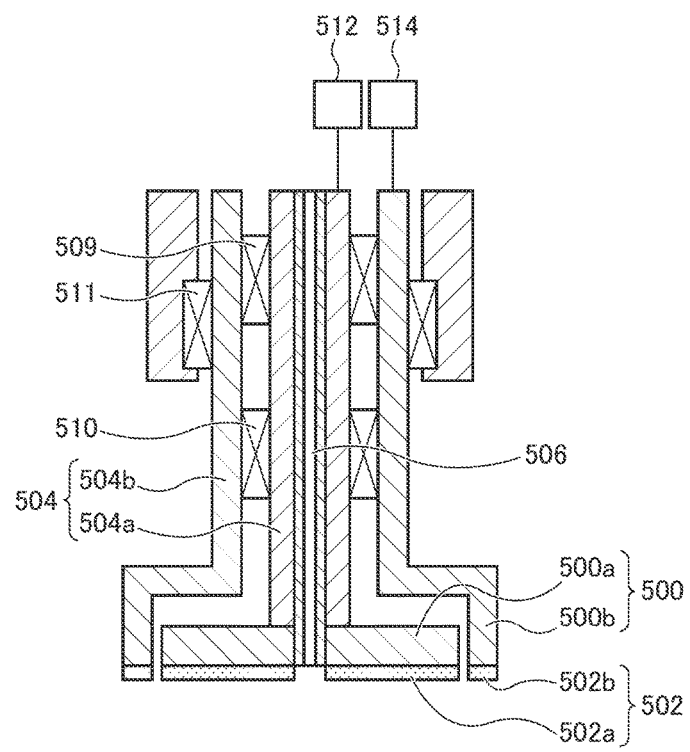
FIG. 7 is a sectional view illustrating details of the buff head and the buff pad, as an alternative configuration.

FIG. 7 is a schematic diagram of an alternative configuration of the buff head 500 and the buff arm 600. As illustrated in the figure, the buff head 500 includes a first buff head 500a and a second buff head 500b. The first buff head 500a has a disk shape for which an opening of the internal supply line 506 is formed at the center. The second buff head 500b has an annular shape, and is arranged so as to surround the first buff head 500a on the radial direction outer side of the first buff head 500a. Therefore, the first buff head 500a is also called an inner head 500a, and the second buff head 500b is also called an outer head 500b. The inner head 500a and the outer head 500b are arranged at spaced-apart.

The inner head 500a is connected to a shaft 504a extending at the upper part. Similarly, the outer head 500b is connected to a shaft 504b extending at the upper part. The shaft 504b has a hollow columnar shape, and surrounds the periphery of the shaft 504a through bearings 509 and 510. The shaft 504b is attached to a stationary part of the buff arm 600 through a bearing 511.

Figure 8:
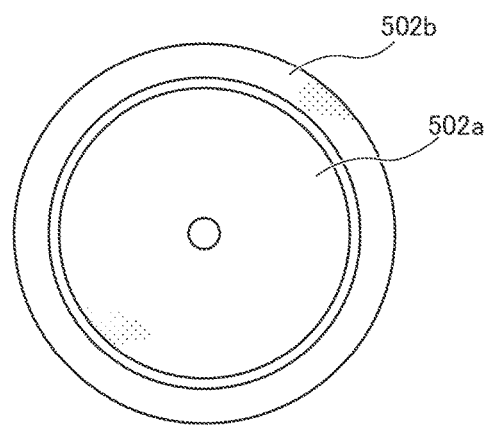
FIG. 8 is a diagram viewing the buff pad from below.

To a lower surface (a surface opposite to the shaft 504a) of the first buff head 500a, a first buff pad 502a (also called an inner pad 502a) is attached. To a lower surface of the second buff head 500b, a second buff pad 502b (also called an outer pad 502b) is attached. FIG. 8 is a diagram viewing the inner pad 502a and the outer pad 502b from below. As illustrated in the figure, the inner pad 502a and the outer pad 502b have a shape following the lower surfaces of the inner head 500a and the outer head 500b respectively. In the present embodiment, at the inner pad 502a and the outer pad 502b, grooves are not formed. However, the grooves may be formed as in FIG. 6A and FIG. 6B. In the example illustrated in FIG. 7 and FIG. 8 as well, for the inner pad 502a and the outer pad 502b, the first part 502a and the second part 502b are selected such that the easiness of the distribution of the supply liquid between the second part 502b and the wafer W becomes less than the easiness of the distribution of the supply liquid between the first part 502a and the wafer W.

The shaft 504a is connected to an actuator 512. By the actuator 512, the shaft 504a and the inner head 500a are configured rotatably and movably in the direction of approaching the buff table 400 and the direction of separating from the buff table 400 (in the present embodiment, a vertical direction). The shaft 504b is connected to an actuator 514. By the actuator 514, the shaft 504b and the outer head 500b are configured rotatably and movably in the direction of approaching the buff table 400 and the direction of separating from the buff table 400 (in the present embodiment, the vertical direction). In the present embodiment, the inner head 500a and the outer head 500b are configured movably in the vertical direction independent of each other. Further, in the present embodiment, the inner head 500a and the outer head 500b are configured rotatably independent of each other. That is, the inner head 500a and the outer head 500b can perform the operations different from each other.

Figure 10A:
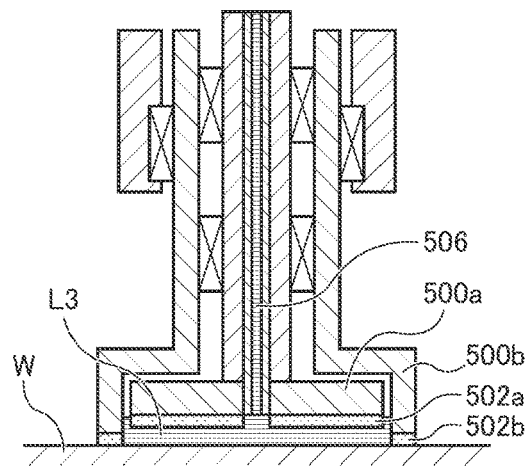
FIG. 10A is an illustration diagram illustrating a state of the buff head in each step illustrated in FIG. 9.
Figure 10B:
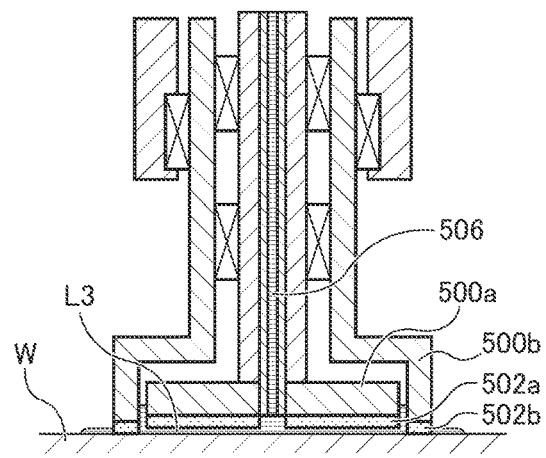
FIG. 10B is an illustration diagram illustrating a state of the buff head in each step illustrated in FIG. 9.
Figure 10C:
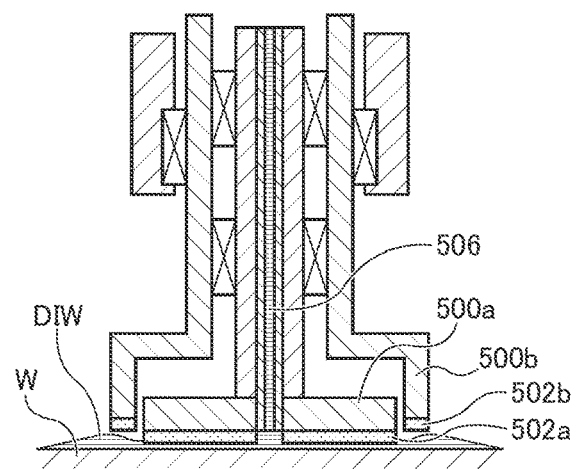
FIG. 10C is an illustration diagram illustrating a state of the buff head in each step illustrated in FIG. 9.

FIG. 9 illustrates a control example of the buff head 500 in each step of buffing by the buffing module 300A described above. FIGS. 10A-10C illustrate a state of the buff head 500 in each step illustrated in FIG. 9. As illustrated in FIG. 9, in this example, when the buffing is started, preloading is performed first (step S10). The preloading is the processing of supplying the process liquid onto the wafer W beforehand. In the preloading, as illustrated in FIG. 9 and FIG. 10A, the inner head 500a is positioned at a position (also called an elevated position, hereinafter) elevated upwards so that the inner pad 502a is not brought into contact with the wafer W. That is, the inner head 500a and the inner pad 502a are in the state of being withdrawn upwards. On the other hand, the outer head 500b is positioned at a position (also called a contact position, hereinafter) for bringing the outer pad 502b into contact with the wafer W. That is, the outer head 500b and the outer pad 502b are at a lowered position. In the state, the process liquid is supplied from the internal supply line 506. Since the outer pad 502b is in contact with the wafer W, outflow of the process liquid to the outside of the second buff pad 502b is suppressed. That is, the large portion of the process liquid is held on the inner side of the second buff pad 502b. By the configuration, when starting the buffing, the sufficient amount of the process liquid is uniformly spread between the inner pad 502a and the wafer W already. As a result, the damages exerted to the wafer W by scratches generated on the wafer W can be suppressed.

In the present embodiment, in step S10, the rotation of the inner head 500a and the outer head 500b is stopped. Further, the rotation of the buff table 400, that is, the wafer W, is also stopped. After the sufficient amount of a process liquid L3 is stored on the inner side of the outer pad 502b, the buff table 400 is rotated. The rotation of the inner head 500a is also started simultaneously with the rotation of the buff table 400, and the inner head 500a starts to lower further, shifting to the next step. In this way, by performing the preloading in the state that the rotation of the buff table 400 is stopped, the supplied process liquid L3 is not scattered by the centrifugal force, and the sufficient amount of the process liquid L3 can be uniformly spread between the inner pad 502a and the wafer W. Also, the preloading may be performed in the state of rotating the buff table 400. In this case, it is desirable to start supply of the process liquid L3 from the internal supply line 506 before the outer pad 502b is brought into contact with the wafer W. Thus, the damages of the wafer W by the insufficiency of the process liquid when the outer pad 502b and the wafer W are brought into contact can be prevented. In the preloading in step S10, the outer head 500b may be rotated or may not be rotated. By rotating the outer head 500b and bringing it into contact with the wafer W with a pressure lower than that during the main polishing (step S20 below), frictions of the outer pad 502b and the wafer W can be reduced.

When the preloading is completed, next, light polishing, that is, the buff polishing, is executed (step S20). Instead of the buff polishing, the buff cleaning may be performed. In step S20, as illustrated in FIG. 9 and FIG. 10B, the inner head 500a and the outer head 500b are both positioned at the contact position. That is, the buffing is executed while suppressing the outflow of the process liquid to the outside of the outer pad 502b. By the configuration, the sufficient amount of the process liquid is uniformly spread between the inner pad 502a and the wafer W during the buffing. Therefore, generation of scratches can be suppressed. Also, even in the case that the buff table 400 is rotated at a relatively high speed, since the sufficient amount of the process liquid can be held between the inner pad 502a and the wafer W, the buffing rate can be improved.

In step S20, the buffing is achieved by the inner pad 502a, and the outer pad 502b does not greatly contribute to the buffing performance. The outer pad 502b is mainly used to hold the process liquid in the inner side area. Therefore, the controller 5 optimizes the pressure to be made to act on the wafer W by the inner head 500a through the inner pad 502a according to the demanded buffing performance. On the other hand, the controller 5 controls the pressure to be made to act on the wafer W by the outer head 500b through the outer pad 502b to the absolute minimum pressure for holding the process liquid. For example, the pressure by the outer head 500b is controlled to be smaller than the pressure by the inner head 500a. Similarly, the controller 5 optimizes a rotation number of the inner head 500a according to the demanded buffing performance. On the other hand, the controller 5 optimizes the rotation number of the outer head 500b for preventing scattering of the process liquid. For example, the outer head 500b is controlled to be a stop state, or the rotation number smaller than that of the inner head 500a. The outer head 500b may not be rotated.

In step S20, the process liquid may be supplied from the internal supply line 506 continuously or intermittently. A supply amount and supply timing of the process liquid may be set such that the sufficient amount of the process liquid is held in the inner side area of the outer pad 502b, in consideration of an outflow amount of the process liquid from the outer pad 502b.

As the alternative form, the outer head 500b may be moved to the elevated position in a latter period of the buffing. By such a configuration, outflow of products generated by the buffing to the outside can be accelerated. As a result, the damages of the wafer W by the products can be suppressed. In this case, a larger amount of the process liquid than in the first period of the buffing may be supplied.

When the buffing is completed, next, the cleaning liquid (here, the pure water) is supplied from the internal supply line 506, and liquid replacement is performed (step S30). By the liquid replacement, mixing of the slurry used in the buff polishing and the chemical used in chemical cleaning (step S40), generation of reaction products and adverse effects on cleaning by the reaction products (for example, damaging the substrate) can be suppressed. In step S30, as illustrated in FIG. 9 and FIG. 10C, the inner head 500a is positioned at the contact position, and the outer head 500b is elevated and positioned at a withdrawn position. By the configuration, discharge to the outside of the slurry used in the buff polishing and the cleaning liquid used in the liquid replacement is accelerated. Therefore, the discharge of the products generated by the buffing from the top of the wafer W can be accelerated.

When the liquid replacement is completed, next, the chemical is supplied from the internal supply line 506, and the chemical cleaning is performed (step S40). The positions of the inner head 500a and the outer head 500b are the same as in step S30, as illustrated in FIG. 9. However, depending on the demanded processing performance, the outer head 500b may be at the contact position. Then, when the chemical cleaning is completed, the pure water is supplied from the internal supply line 506, and pure water cleaning (water polishing) is performed (step S50). The positions of the inner head 500a and the outer head 500b are the same as in step S30, as illustrated in FIG. 9.

As described above, according to the buffing module 300A, holding or discharge of various kinds of liquids are suitably controlled in each processing step, and flexible processing can be performed.

B. Modification:

B-1. Modification 1:

The buffing module 300A may have an external nozzle provided outside the buff head 500 in addition to the internal supply line 506, as the process liquid supply means. In this case, the external nozzle may be complementarily used or may be used instead of the internal supply line 506, according to situations.

B-2. Modification 2:

In the configuration illustrated in FIG. 7, the difference in the characteristics between the inner pad 502a and the outer pad 502b may be a difference in the buffing performance. For example, the inner pad 502a may be determined on the basis of the demanded buffing performance, and as the outer pad 502b, a highly adhesive, that is, flexible, buff pad may be used in order to increase the performance of holding the process liquid. Or, a pad having the characteristic suitable for one of the buff polishing and the buff cleaning may be adopted as the inner pad 502a, and a pad having the characteristic suitable for the other may be adopted as the outer pad 502b. By the configuration, by selectively using one of the inner pad 502a and the outer pad 502b, the buffing according to the demanded quality can be performed without changing the buff pad. Or, different processing can be performed in each area of the wafer W and highly accurate buffing can be achieved. For example, a pad for which hard foamed polyurethane is arranged in a surface layer can be used as the inner pad 502a, and a suede-like porous polyurethane non-fibrous pad can be used as the outer pad 502b. Or, the same suede-like pads with different pore sizes or pore densities may be used respectively for the inner pad 502a and the outer pad 502b.

B-3. Modification 3:

In the configuration illustrated in FIG. 7, the inner pad 502a and the outer pad 502b may not be always configured to be controlled independent of each other. That is, the inner pad 502a and the outer pad 502b may not be configured so as to be independently controlled to be elevated and lowered, and may not be configured so as to be independently controlled to be rotated. For example, even in the case that the inner pad 502a and the outer pad 502b are not configured so as to be independently controlled to be elevated and lowered, the effect of holding the process liquid in the inner side area of the outer pad 502b is obtained. In this case, when it is desired to accelerate the discharge of the process liquid, the inner pad 502a and the outer pad 502b may be temporarily elevated.

B-4. Modification 4:

In the above-described embodiment, the configuration of holding the processing surface of the wafer W upwards and performing the buffing is illustrated, however, the wafer W may be held in an arbitrary direction. For example, the wafer W may be held so that the processing surface is turned downward. In this case, the buff table 400 is arranged in a direction opposite to that in the above-described embodiment, and the buff head 500 is arranged below the buff table 400. Or, the wafer W may be held so that the processing surface is turned to a horizontal direction. In this case, the process liquid may be supplied from the external nozzle as well. For example, in the configuration illustrated in FIG. 7, the buff table 400 is arranged so that a holding surface of the wafer W is turned to the horizontal direction, and the buff head 500 is configured movably in the horizontal direction. Even in these configurations, by bringing the outer pad 502b into contact with the wafer W, the process liquid can be held in the inner side area of the outer pad 502b.

B-5. Modification 5:

The buffing modules 300A and 300B may be included in the polishing unit 3, without being limited to the configuration of being included in the cleaning unit 4.

Above, together with FIG. 1-FIG. 10, the embodiment of the present invention is described on the basis of some embodiments, however, the embodiments of the invention described above are intended to facilitate understanding of the present invention, and do not limit the present invention.

It is apparent that the present invention may be modified or improved without departing from the scope thereof, and the present invention includes equivalents thereof. Also, in the scope that at least part of the above-described problems can be solved or the scope that at least part of the effects is presented, various components described in the scope of claims and specifications can be arbitrarily combined, or omitted.

Hereinafter, a buffing apparatus and a substrate processing apparatus relating to one embodiment of the claimed invention will be described on the basis of FIG. 11-FIG. 23.

Figure 11:
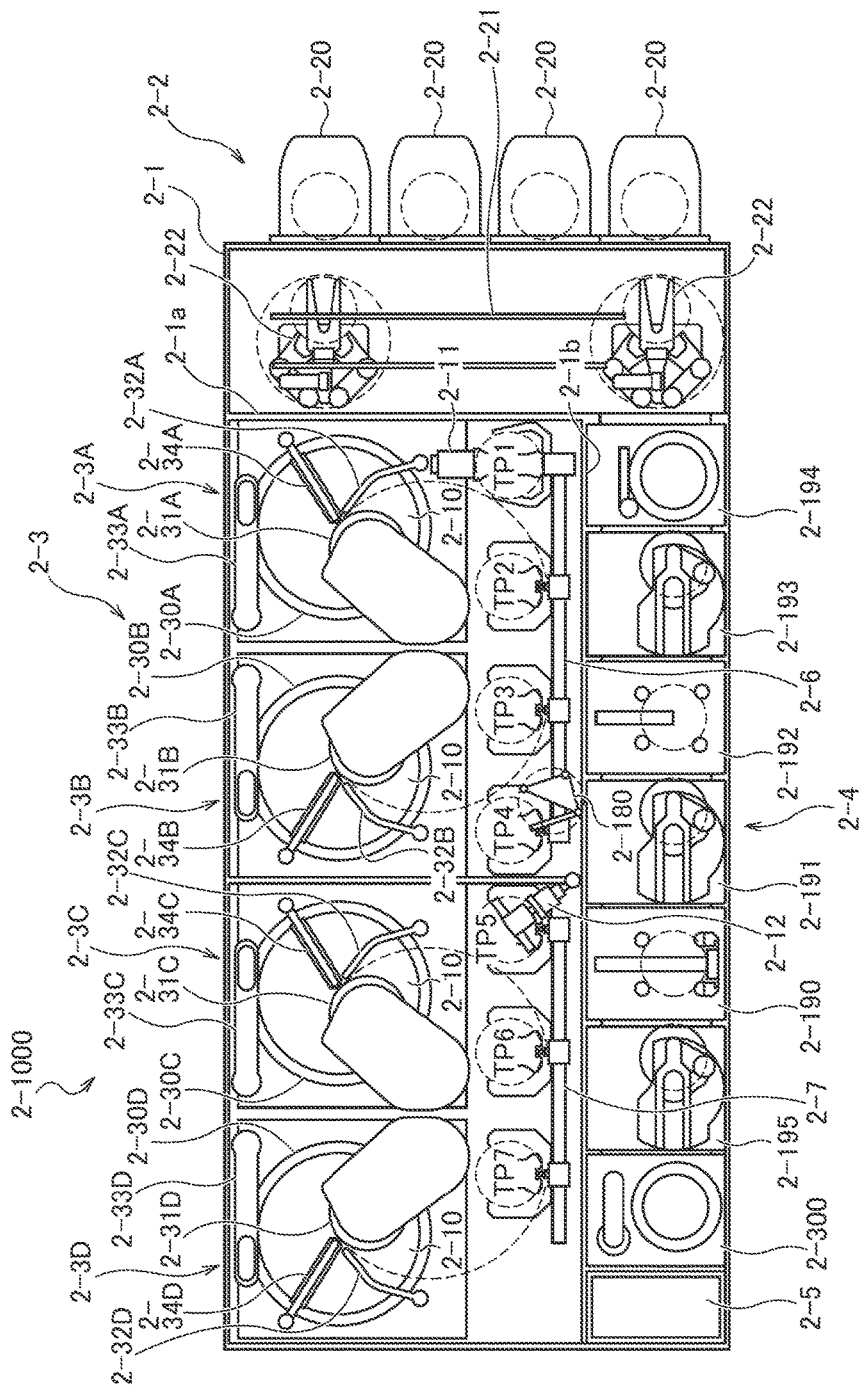
FIG. 11 is a schematic plan view illustrating the entire configuration of a substrate processing apparatus as one embodiment of the present invention.

A. Embodiment:

FIG. 11 is a plan view illustrating the entire configuration of the substrate processing apparatus relating to one embodiment of the present invention. As illustrated in FIG. 11, a substrate processing apparatus 2-1000 includes a roughly rectangular housing 2-1. The inside of the housing 2-1 is sectioned into a loading/unloading unit 2-2, a polishing unit 2-3, and a cleaning unit 2-4 by partitions 2-1a and 2-1b. The loading/unloading unit 2-2, the polishing unit 2-3 and the cleaning unit 2-4 are respectively independently assembled, and independently exhausted. Also, the cleaning unit 2-4 includes a power supply unit (omitted in the figure) that supplies power to the substrate processing apparatus, and a controller 2-5 that controls a substrate processing operation.

The loading/unloading unit 2-2 includes two or more (four, in this embodiment) front loading units 2-20 where a wafer cassette that stocks many wafers (substrates) is mounted. These front loading units 2-20 are arranged adjacently to the housing 2-1, and arrayed along a width direction (a direction vertical to a longitudinal direction) of the substrate processing apparatus. The front loading units 2-20 are configured so as to load an open cassette, an SMIF (Standard Manufacturing Interface) pod or an FOUP (Front Opening Unified Pod).

Also, at the loading/unloading unit 2-2, a traveling mechanism 2-21 is arranged along an array of the front loading units 2-20. On the traveling mechanism 2-21, two transport robots 2-22 movable along an array direction of the wafer cassettes are installed. The transport robots 2-22 are configured so as to access the wafer cassettes loaded on the front loading units 2-20 by moving on the traveling mechanism 2-21. Each transport robot 2-22 takes out a wafer before processing from the wafer cassette, and returns a processed wafer to the wafer cassette.

The polishing unit 2-3 is an area where the wafer is polished (flattened). The polishing unit 2-3 includes a first polishing unit 2-3A, a second polishing unit 2-3B, a third polishing unit 2-3C, and a fourth polishing unit 2-3D. These polishing units 2-3A-2-3D are arrayed along the longitudinal direction of the substrate processing apparatus, as illustrated in FIG. 11.

As illustrated in FIG. 11, the first polishing unit 2-3A includes a polishing table 2-30A to which a polishing pad 2-10 having a polishing surface is attached, a top ring 2-31A for holding the wafer and polishing it while pressurizing it to the polishing pad 2-10 on the polishing table 2-30A, a polishing liquid supply nozzle 2-32A for supplying a polishing liquid or a dressing liquid (for example, pure water) to the polishing pad 2-10, a dresser 2-33A for dressing the polishing surface of the polishing pad 2-10, and an atomizer 2-34A that jets a fluid mixture of the liquid (for example, the pure water) and a gas (for example, a nitrogen gas) or the liquid (for example, the pure water) to the polishing surface in a mist shape.

Similarly, the second polishing unit 2-3B includes a polishing table 2-30B, a top ring 2-31B, a polishing liquid supply nozzle 2-32B, a dresser 2-33B, and an atomizer 2-34B. The third polishing unit 2-3C includes a polishing table 2-30C, a top ring 2-31C, a polishing liquid supply nozzle 2-32C, a dresser 2-33C, and an atomizer 2-34C. The fourth polishing unit 2-3D includes a polishing table 2-30D, a top ring 2-31D, a polishing liquid supply nozzle 2-32D, a dresser 2-33D, and an atomizer 2-34D.

Since the first polishing unit 2-3A, the second polishing unit 2-3B, the third polishing unit 2-3C and the fourth polishing unit 2-3D have the mutually same configuration, only the first polishing unit 2-3A will be described hereinafter.

Figure 12:
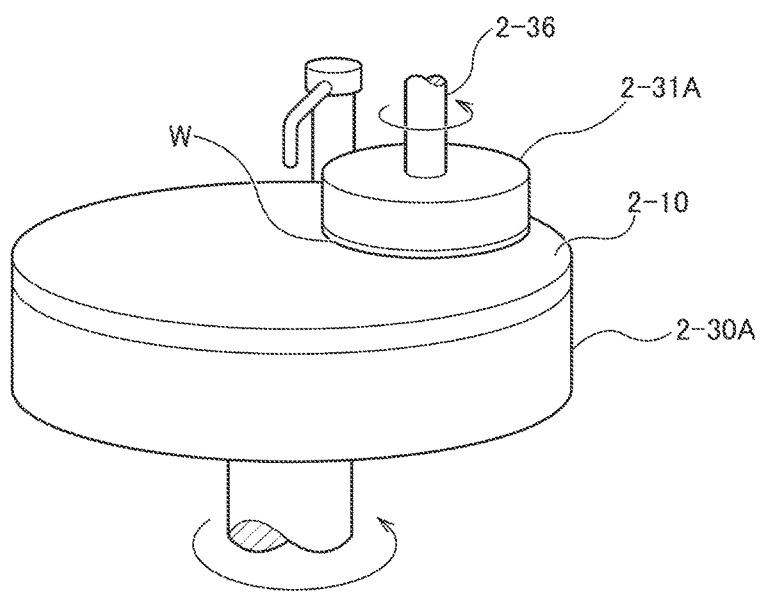
FIG. 12 is a perspective view schematically illustrating the polishing unit.

FIG. 12 is a perspective view schematically illustrating the first polishing unit 2-3A. The top ring 2-31A is supported by a top ring shaft 2-36. To an upper surface of the polishing table 2-30A, the polishing pad 2-10 is stuck. An upper surface of the polishing pad 2-10 forms a polishing surface that polishes a wafer W. Instead of the polishing pad 2-10, fixed abrasive can be also used. The top ring 2-31A and the polishing table 2-30A are configured so as to be rotated around the axial center as illustrated by arrows. The wafer W is held by vacuum suction at a lower surface of the top ring 2-31A. During polishing, the polishing liquid is supplied from the polishing liquid supply nozzle 2-32A to the polishing surface of the polishing pad 2-10, and the wafer W which is a polishing object is pressurized to the polishing surface by the top ring 2-31A and polished.

Next, a transport mechanism for transporting the wafer will be described. As illustrated in FIG. 11, a first linear transporter 2-6 is arranged adjacently to the first polishing unit 2-3A and the second polishing unit 2-3B. The first linear transporter 2-6 is a mechanism that transports the wafer among four transport positions (a first transport position 2-TP1, a second transport position 2-TP2, a third transport position 2-TP3, and a fourth transport position 2-TP4 in order from a loading/unloading unit side) along an array direction of the polishing units 2-3A and 2-3B.

Also, adjacently to the third polishing unit 2-3C and the fourth polishing unit 2-3D, a second linear transporter 2-7 is arranged. The second linear transporter 2-7 is a mechanism that transports the wafer among three transport positions (a fifth transport position 2-TP5, a sixth transport position 2-TP6, and a seventh transport position 2-TP7 in order from the loading/unloading unit side) along an array direction of the polishing units 2-3C and 2-3D.

The wafer is transported to the polishing units 2-3A and 2-3B by the first linear transporter 2-6. The top ring 2-31A of the first polishing unit 2-3A is moved between a polishing position and the second transport position 2-TP2 by a swing operation of a top ring head. Therefore, the wafer is delivered to the top ring 2-31A at the second transport position 2-TP2. Similarly, the top ring 2-31B of the second polishing unit 2-3B is moved between the polishing position and the third transport position 2-TP3, and the wafer is delivered to the top ring 2-31B at the third transport position 2-TP3. The top ring 2-31C of the third polishing unit 2-3C is moved between the polishing position and the sixth transport position 2-TP6, and the wafer is delivered to the top ring 2-31C at the sixth transport position 2-TP6. The top ring 2-31D of the fourth polishing unit 2-3D is moved between the polishing position and the seventh transport position 2-TP7, and the wafer is delivered to the top ring 2-31D at the seventh transport position 2-TP7.

At the first transport position 2-TP1, a lifter 2-11 for receiving the wafer from the transport robot 2-22 is arranged. The wafer is delivered from the transport robot 2-22 to the first linear transporter 2-6 through the lifter 2-11.

Among the first linear transporter 2-6, the second linear transporter 2-7 and the cleaning unit 2-4, a swing transporter 2-12 is arranged. The swing transporter 2-12 has a hand movable between the fourth transport position 2-TP4 and the fifth transport position 2-TP5. The wafer is delivered from the first linear transporter 2-6 to the second linear transporter 2-7 by the swing transporter 2-12. The wafer is transported to the third polishing unit 2-3C and/or the fourth polishing unit 2-3D by the second linear transporter 2-7. Also, the wafer polished in the polishing unit 2-3 is transported to a temporary base 2-180 by the swing transporter 2-12. The wafer mounted on the temporary base 2-180 is transported to the cleaning unit 2-4.

Figure 13A:
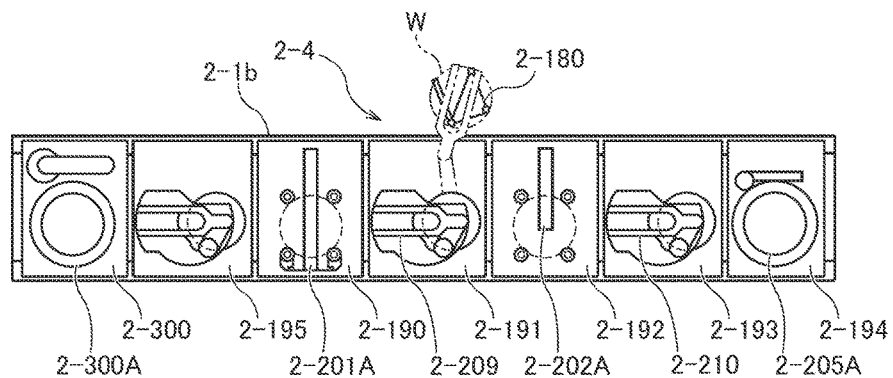
FIG. 13A is a schematic plan view of the cleaning unit.
Figure 13B:
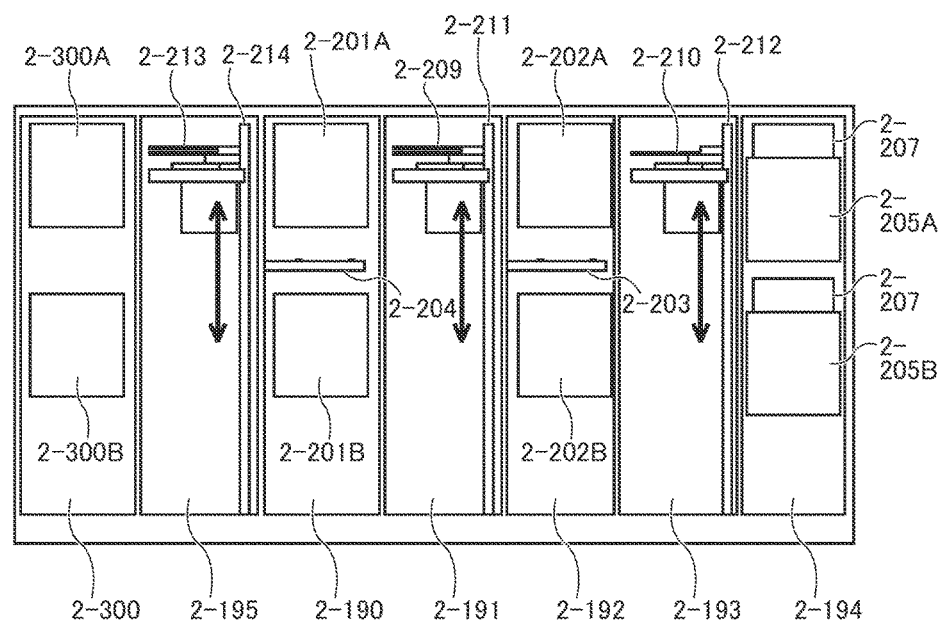
FIG. 13B is a schematic side view of the cleaning unit.

FIG. 13A is a plan view illustrating the cleaning unit 2-4, and FIG. 13B is a side view illustrating the cleaning unit 2-4. As illustrated in FIG. 13A and FIG. 13B, the cleaning unit 2-4 is sectioned into a roll cleaning chamber 2-190, a first transport chamber 2-191, a pen cleaning chamber 2-192, a second transport chamber 2-193, a drying chamber 2-194, a buffing chamber 2-300, and a third transport chamber 2-195.

Inside the roll cleaning chamber 2-190, an upper side roll cleaning module 2-201A and a lower side roll cleaning module 2-201B arrayed along a longitudinal direction are arranged. The upper side roll cleaning module 2-201A is arranged above the lower side roll cleaning module 2-201B. The upper side roll cleaning module 2-201A and the lower side roll cleaning module 2-201B are cleaners that clean the wafer by respectively pressing two rotating roll sponges to front and back surfaces of the wafer while supplying a cleaning liquid to the front and back surfaces of the wafer. Between the upper side roll cleaning module 2-201A and the lower side roll cleaning module 2-201B, a temporary base 2-204 of the wafer is provided.

Inside the pen cleaning chamber 2-192, an upper side pen cleaning module 2-202A and a lower side pen cleaning module 2-202B arrayed along the longitudinal direction are arranged. The upper side pen cleaning module 2-202A is arranged above the lower side pen cleaning module 2-202B. The upper side pen cleaning module 2-202A and the lower side pen cleaning module 2-202B are cleaners that clean the wafer by pressing a rotating pencil sponge to the front surface of the wafer and swinging it in a radial direction of the wafer while supplying the cleaning liquid to the front surface of the wafer. Between the upper side pen cleaning module 2-202A and the lower side pen cleaning module 2-202B, a temporary base 2-203 of the wafer is provided.

Inside the drying chamber 2-194, an upper side drying module 2-205A and a lower side drying module 2-205B arrayed along the longitudinal direction are arranged. The upper side drying module 2-205A and the lower side drying module 2-205B are isolated from each other. At upper parts of the upper side drying module 2-205A and the lower side drying module 2-205B, filter fan units 2-207 and 2-207 that supply clean air into the drying modules 2-205A and 2-205B respectively are provided.

In the first transport chamber 2-191, a vertically movable first transport robot (transport mechanism) 2-209 is arranged. In the second transport chamber 2-193, a vertically movable second transport robot 2-210 is arranged. In the third transport chamber 2-195, a vertically movable third transport robot (transport mechanism) 2-213 is arranged. The first transport robot 2-209, the second transport robot 2-210, and the third transport robot 2-213 are freely movably supported respectively by support shafts 2-211, 2-212 and 2-214 extending in the longitudinal direction. The first transport robot 2-209, the second transport robot 2-210 and the third transport robot 2-213 have a drive mechanism such as a motor inside, and are configured vertically movably along the support shafts 2-211, 2-212 and 2-214. The first transport robot 2-209 has hands in two upper and lower stages. The first transport robot 2-209 is arranged at such a position that the hand on the lower side can access the above-described temporary base 2-180 as illustrated by a dotted line in FIG. 13A.

The first transport robot 2-209 is operated so as to transport the wafer W among the temporary base 2-180, the upper side roll cleaning module 2-201A, the lower side roll cleaning module 2-201B, the temporary base 2-204, the temporary base 2-203, the upper side pen cleaning module 2-202A, and the lower side pen cleaning module 2-202B. The first transport robot 2-209 uses the hand on the lower side when transporting the wafer before cleaning (the wafer to which slurry is stuck), and uses the hand on the upper side when transporting the wafer after cleaning.

The second transport robot 2-210 is operated so as to transport the wafer W among the upper side pen cleaning module 2-202A, the lower side pen cleaning module 2-202B, the temporary base 2-203, the upper side drying module 2-205A, and the lower side drying module 2-205B. The second transport robot 2-210 is provided with only one hand since it transports only the cleaned wafer. The transport robot 2-22 illustrated in FIG. 11 takes out the wafer from the upper side drying module 2-205A or the lower side drying module 2-205B using the hand on the upper side, and returns the wafer to the wafer cassette.

The buffing chamber 2-300 includes an upper side buffing module 2-300A, and a lower side buffing module 2-300B. The third transport robot 2-213 is operated so as to transport the wafer W among the upper side roll cleaning module 2-201A, the lower side roll cleaning module 2-201B, the temporary base 2-204, the upper side buffing module 2-300A, and the lower side buffing module 2-300B.

In the present embodiment, an example that the buffing chamber 2-300, the roll cleaning chamber 2-190, and the pen cleaning chamber 2-192 are arranged in order from a side far from the loading/unloading unit 2-2 inside the cleaning unit 2-4 is illustrated, however, it is not limited thereto. An arranging form of the buffing chamber 2-300, the roll cleaning chamber 2-190, and the pen cleaning chamber 2-192 can be appropriately selected according to quality of the wafer and throughput or the like. Since the upper side buffing module 2-300A and the lower side buffing module 2-300B are of the similar configuration, hereinafter, only the upper side buffing module 2-300A will be described.

Figure 14:
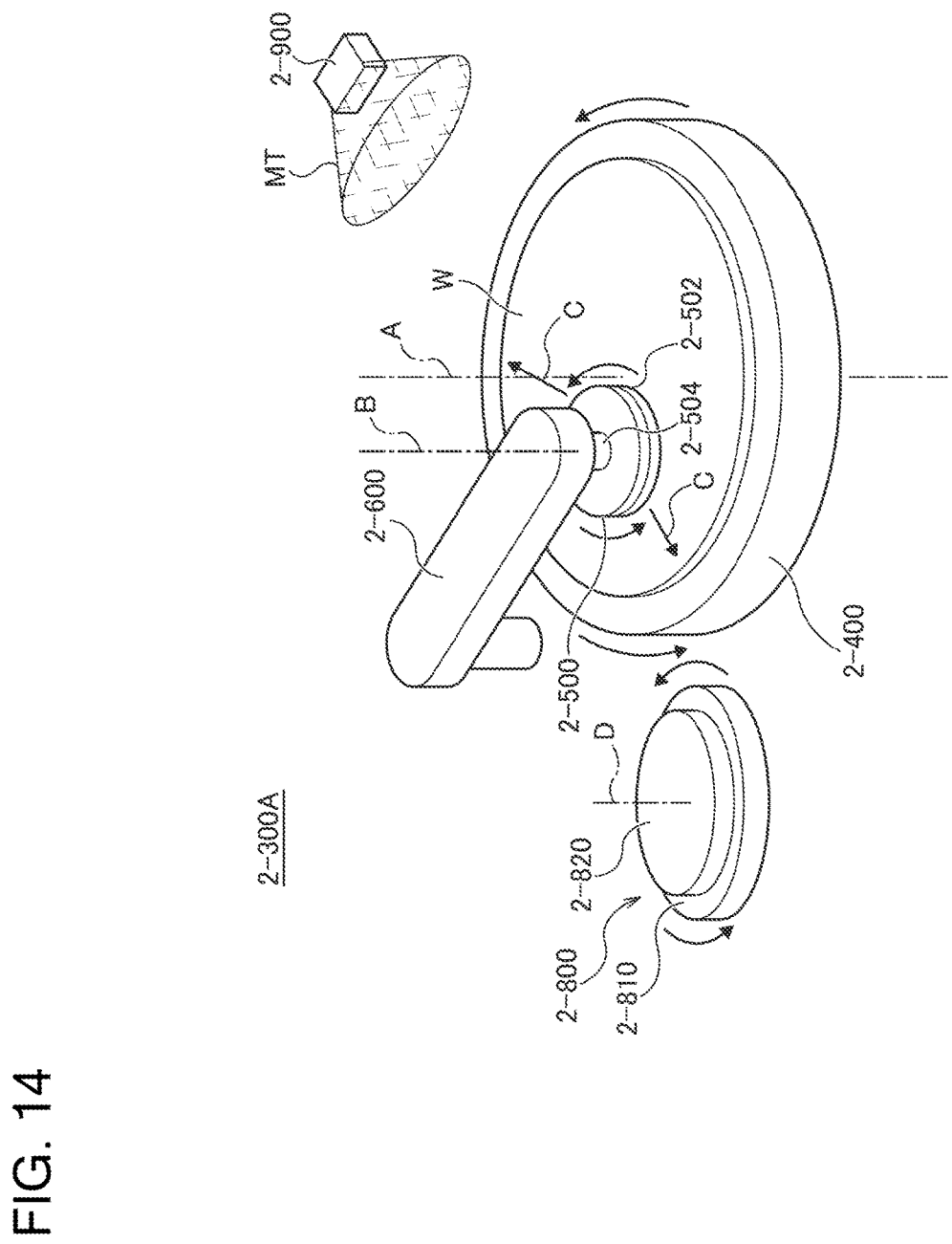
FIG. 14 is a diagram illustrating a schematic configuration of the buffing module.

FIG. 14 is a diagram illustrating a schematic configuration of the upper side buffing module. As illustrated in FIG. 14, the buffing module 2-300A includes a buff table 2-400 for supporting the wafer W as one kind of the substrate, a buff head 2-500 to which a buff pad 2-502 for performing buffing to a processing surface of the wafer W is attached, a buff arm 2-600 for holding the buff head 2-500, and a conditioning unit 2-800 for performing conditioning (setting) of the buff pad 2-502.

The buff table 2-400 has a mechanism that holds the wafer W. The wafer holding mechanism is a vacuum suction system in the present embodiment, however, it can be an arbitrary system. For example, the wafer holding mechanism may be a clamp system of clamping the front surface and back surface of the wafer W at at least one part of a peripheral edge part of the wafer W, or may be a roller chuck system of holding a side face of the wafer W at at least one part of the peripheral edge part of the wafer W. In the present embodiment, the buff table 2-400 holds the wafer W so that a processing surface of the wafer W is turned upwards.

Also, the buff table 2-400 is configured so as to be rotated around a rotary axis A by a drive mechanism not shown in the figure. To the buff arm 2-600, the buff head 2-500 is attached through a rotatably configured shaft 2-504. To a surface facing the wafer W (or, the buff table 2-400) of the buff head 2-500, the buff pad 2-502 for buffing the wafer W is attached. Details of the buff head 2-500 will be described later. The buff arm 2-600 is configured so as to rotate the buff head 2-500 around a rotary axis B. Also, since an area of the buff pad 2-502 is smaller than an area of the wafer W (or, the buff table 2-400), in order to uniformly buff the wafer W, the buff arm 2-600 is configured so as to swing the buff head 2-500 in the radial direction of the wafer W as illustrated by an arrow C. Also, the buff arm 2-600 is configured so as to swing the buff head 2-500 to a position at which the buff pad 2-502 faces the conditioning unit 2-800. The buff head 2-500 is configured movably in a direction of approaching the buff table 2-400 and a direction of separating from the buff table 2-400 (in the present embodiment, vertically) by an actuator (not shown in the figure). Thus, the buff pad 2-502 can be pressurized to the wafer W with a predetermined pressure. The configuration may be achieved by expansion and contraction of the shaft 2-504, or may be achieved by vertical movement of the buff arm 2-600.

The buffing module 2-300A can perform the buffing to the wafer W by supplying the process liquid to the wafer W from a liquid supply system 2-700 to be described later, rotating the buff table 2-400 around the rotary axis A, pressurizing the buff pad 2-502 to the processing surface of the wafer W, and swinging the buff head 2-500 in the direction of the arrow C while rotating it around the rotary axis B. The relative movement of the buff table 2-400 and the buff head 2-500 during the buffing is not limited to the above-described example, and may be achieved by at least one of rotary movement, translational movement, circular arc movement, reciprocating movement, scroll movement, and angle rotary movement (movement of rotating only by a predetermined angle smaller than 360 degrees).

In the present application, the buffing includes at least one of buff polishing and buff cleaning. The buff polishing is processing of polishing and removing the processing surface of the wafer W by relatively moving the wafer W and the buff pad 2-502 while bringing the buff pad 2-502 into contact with the wafer W and interposing the slurry between the wafer W and the buff pad 2-502. In the buff polishing, normally, so-called final polishing is performed after main polishing performed for a purpose of flattening ruggedness on the surface of the wafer or removing an excessive film formed on the surface other than a trench or a via inner part. A removal machining amount of the buff polishing is about several nanometers to more than ten nanometers for example. As the buff pad 2-502, for example, a pad for which foamed polyurethane and nonwoven fabric are laminated (specifically, for example, IC1000®/SUBA® system that can be obtained in a market) or a suede-like porous polyurethane non-fibrous pad (specifically, for example, POLITEX® that can be obtained in a market) or the like can be used. The buff polishing is the processing capable of adding, to the wafer W, physical acting force stronger than physical acting force added to the wafer W by the roll sponge composed of PVA in the roll cleaning chamber 2-190 and physical acting force added to the wafer W by the pen sponge composed of the PVA in the pen cleaning chamber 2-192. By the buff polishing, removal of a surface layer part with damages such as a scratch or a surface layer part to which foreign matters are stuck, additional removal of a part not removed in the main polishing in the polishing unit 2-3, or improvement of morphology such as ruggedness of a minute area or a film thickness distribution after the main polishing can be achieved.

The buff cleaning is final processing of removing foreign matters on the surface of the wafer W and reforming the processing surface by relatively moving the wafer W and the buff pad 2-502 while bringing the buff pad 2-502 into contact with the wafer W and interposing a cleaning process liquid (the chemical, the pure water, or the mixture thereof) between the wafer W and the buff pad 2-502. As the buff pad 2-502, the above-described IC1000®/SUBA® system or POLITEX® or the like is used. The buff cleaning is the processing capable of adding, to the wafer W, the physical acting force stronger than the physical acting force added to the wafer W by the roll sponge composed of the PVA in the roll cleaning chamber 2-190 and the physical acting force added to the wafer W by the pen sponge composed of the PVA in the pen cleaning chamber 2-192. By the buff cleaning, highly adhesive foreign matters that cannot be removed just by bringing a sponge material composed of the PVA into contact can be efficiently cleaned and removed. Also, it is possible to use a PVA sponge as the buff pad for the buff cleaning in the present invention.

The conditioning unit 2-800 is a member for conditioning (dressing) the surface of the buff pad 2-502. In the present embodiment, the conditioning unit 2-800 is arranged outside the buff table 2-400. As an alternative form, the conditioning unit 2-800 may be moved to an upper part of the buff table 2-400 and a lower part of the buff head 2-500, and condition the buff pad 2-502. In this case, it is desirable that conditioning is performed after the processed wafer W is carried away. The conditioning unit 2-800 includes a dress table 2-810, and a dresser 2-820 installed to the dress table 2-810. The dress table 2-810 is configured so as to be rotated around a rotary axis D by a drive mechanism not shown in the figure. The dresser 2-820 is, for example, formed of a diamond dresser, a brush dresser, or the combination thereof.

The buffing module 2-300A turns the buff arm 2-600 until the buff pad 2-502 is at a position facing the dresser 2-820 when conditioning the buff pad 2-502. The buffing module 2-300A conditions the buff pad 2-502 by rotating the dress table 2-810 around the rotary axis D, also rotating the buff head 500, and pressing the buff pad 502 to the dresser 2-820. Such a conditioning operation can be performed while replacing the buffed wafer W with the wafer W to be buffed next, for example.

The buffing module 2-300A has, as illustrated in FIG. 14, a mist supply unit 2-900 that jets mist MT into a section A1 provided with the buffing module 2-300A in the buffing chamber 2-300. The mist MT may be supplied at all times, or may be intermittently supplied. The mist MT is configured so as to wet the respective surfaces of the buff table 2-400, the periphery thereof, the buff head 2-500, the buff arm 2-600, and the conditioning unit 2-800 in order to prevent the process liquid supplied from the liquid supply system 2-700 to be described later onto the wafer W from scattering around and being fixed. Further, it is desirable to provide an exhaust system that exhausts air containing the mist MT inside the module 2-300A before transporting the wafer W, in order to prevent the mist MT from leaking to the outside of the buffing module 2-300A.

The mist supply unit 2-900 can jet the mist MT toward the surface of the wafer W even during the buffing so as to wet even the surface of the wafer W during the buffing. Thus, the process liquid on the wafer W is prevented from being shaken off outwards by the rotation of the buff table 2-400, and the surface of the wafer W is prevented from getting dry.

A supply amount of the mist MT is adjusted such that the process liquid on the wafer W is not excessively thinned to adversely affect the buffing. However, in the case of performing cleaning in order to prevent fixation of the process liquid on a surface of a structure other than the wafer W inside the buffing module 2-300A, a shower of the pure water may be supplied instead of the mist MT.

Figure 15:
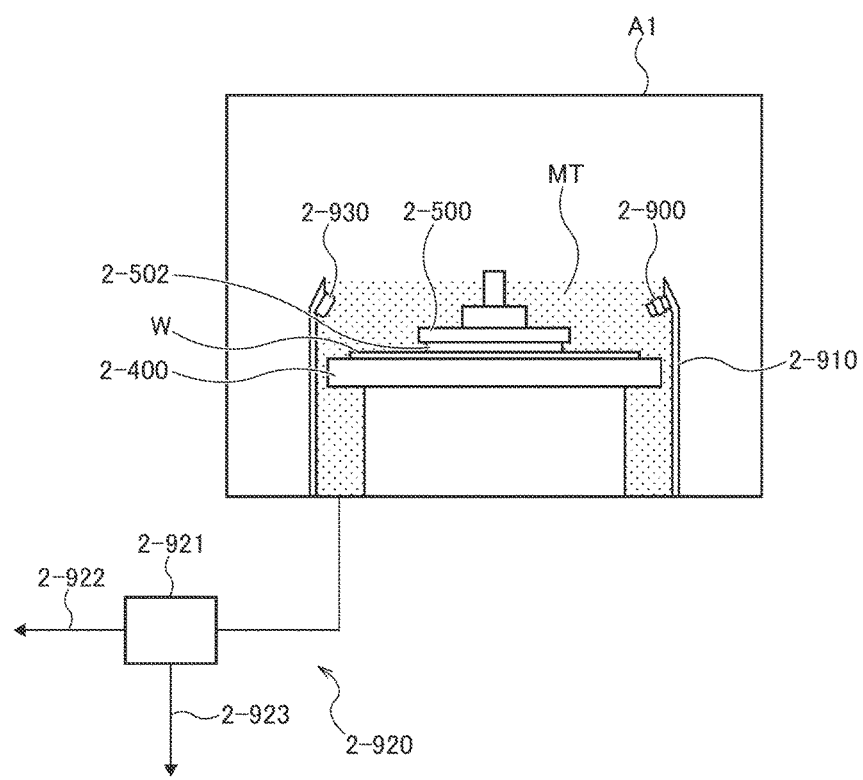
FIG. 15 is a diagram illustrating a schematic configuration of a mist supply unit.

FIG. 15 illustrates a specific example that the mist supply unit 2-900 is provided. The buffing module 2-300A includes a cover 2-910 provided on the outer side of the buff table 2-400 mainly in order to adjust humidity inside the cover 2-910. The mist supply unit 2-900 is provided along an edge of the cover. Further, an exhaust system 2-920 for discharging the air containing the mist MT is provided. The exhaust system 2-920 includes a filter 2-921 that separates moisture and gas, an exhaust line 2-922, and a drain line 2-923. Also, a humidity sensor 2-930 is provided inside the cover 2-910, and thus, a jetting amount and jetting timing of the mist MT are automatically adjusted.

According to the buffing module 2-300A described above, by performing the buffing as post-processing of the wafer W to which chemical mechanical polishing is performed, the final polishing can be performed while suppressing the damages (defects) of the wafer W, or the damages generated by the chemical mechanical polishing can be removed. Or, compared to conventional roll cleaning or pen cleaning, highly adhesive foreign matters or the like can be efficiently cleaned and removed. Hereinafter, the configuration of the buffing module 2-300A in the present embodiment and details of the buffing will be described.

Figure 16A:
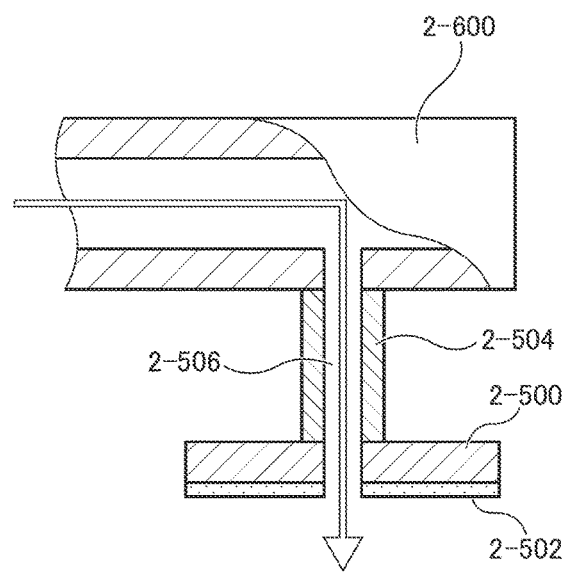
FIG. 16A is a schematic diagram illustrating an internal structure of a buff head.

FIG. 16A is a schematic diagram illustrating an internal structure of the buff head 2-500. In FIG. 16A, the structure of the buff head 2-500, the shaft 2-504, and the buff pad 2-502 is simplified and illustrated. Details thereof will be described later. The buffing module 2-300A has a route that supplies the process liquid for the buffing through the inside of the buff arm 2-600, the shaft 2-504, the buff head 2-500, and the buff pad 2-502. Specifically, as illustrated in FIG. 16A, an internal supply line 2-506 is formed inside the buff arm 2-600, the buff head 2-500, and the buff pad 2-502. The internal supply line 2-506 is opened toward an upper surface of the buff table 2-400 (the processing surface of the wafer W). By the configuration, during the buffing, the process liquid is supplied from the center of the buff pad 2-502 through the internal supply line 2-506, and can be uniformly spread between the buff pad 2-502 and the wafer W by centrifugal force by the rotation of the buff head 2-500 and a supply pressure of the process liquid.

In the case of supplying the process liquid from the nozzle provided outside the buff head 2-500 to the wafer W, there is a risk that the process liquid is not sufficiently spread to the center of the buff pad 2-502 when the buff table 2-400 is rotated at a high speed. This is due to increase of the centrifugal force by the high-speed rotation. Also, in the case of performing the buffing to the wafer W with a relatively large diameter (for example, buffing chamber 300 mm), the diameter of the buff head 500 also becomes relatively large (for example, 100 mm) in order to efficiently perform the buffing. Therefore, when the process liquid is supplied outside the buff pad 2-502, there is a risk that the process liquid is not sufficiently spread to the center of the buff pad 2-502. When these events occur, a buffing rate (a polishing rate or a cleaning rate) declines. However, by the configuration of supplying the process liquid from the internal supply line 2-506 in the present embodiment, since the process liquid is uniformly spread between the buff pad 2-502 and the wafer W as described above, decline of the buffing rate due to insufficiency of the process liquid can be suppressed. Also, the damages of the wafer W by the insufficiency of the process liquid can be suppressed.

Figure 16B:
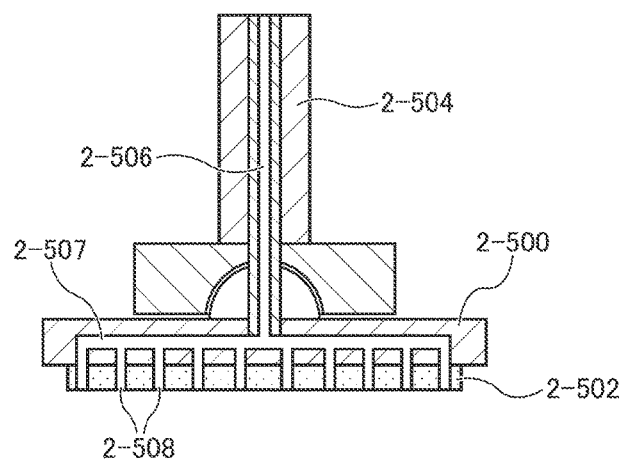
FIG. 16B is a schematic diagram illustrating an alternative example of the internal structure of the buff head.

FIG. 16B is a schematic diagram illustrating an alternative example of the internal structure of the buff head 2-500. In this example, as illustrated in the figure, the internal supply line 2-506 is branched from a water pool jacket structure 2-507 formed inside the buff head 2-500 toward a plurality of openings 2-508 dispersedly arranged on the processing surface of the buff pad 2-502. By the configuration as well, the process liquid supplied from the internal supply line 2-506 is uniformly spread between the buff pad 2-502 and the wafer W. In the illustrated example, the plurality of openings 2-508 are dispersed in the radial direction and arranged. However, the plurality of openings 2-508 may have an arbitrary dispersion form. For example, the plurality of openings 2-508 may be dispersedly arranged in the circumferential direction near the center of the buff pad 2-502. By the configuration, the process liquid can be spread over the entire processing surface of the buff pad 2-502, utilizing the centrifugal force.

From the internal supply line 2-506, one or more process liquids can be supplied. For example, the process liquids can be the slurry, the chemical, the pure water, or the like.

Figure 17:
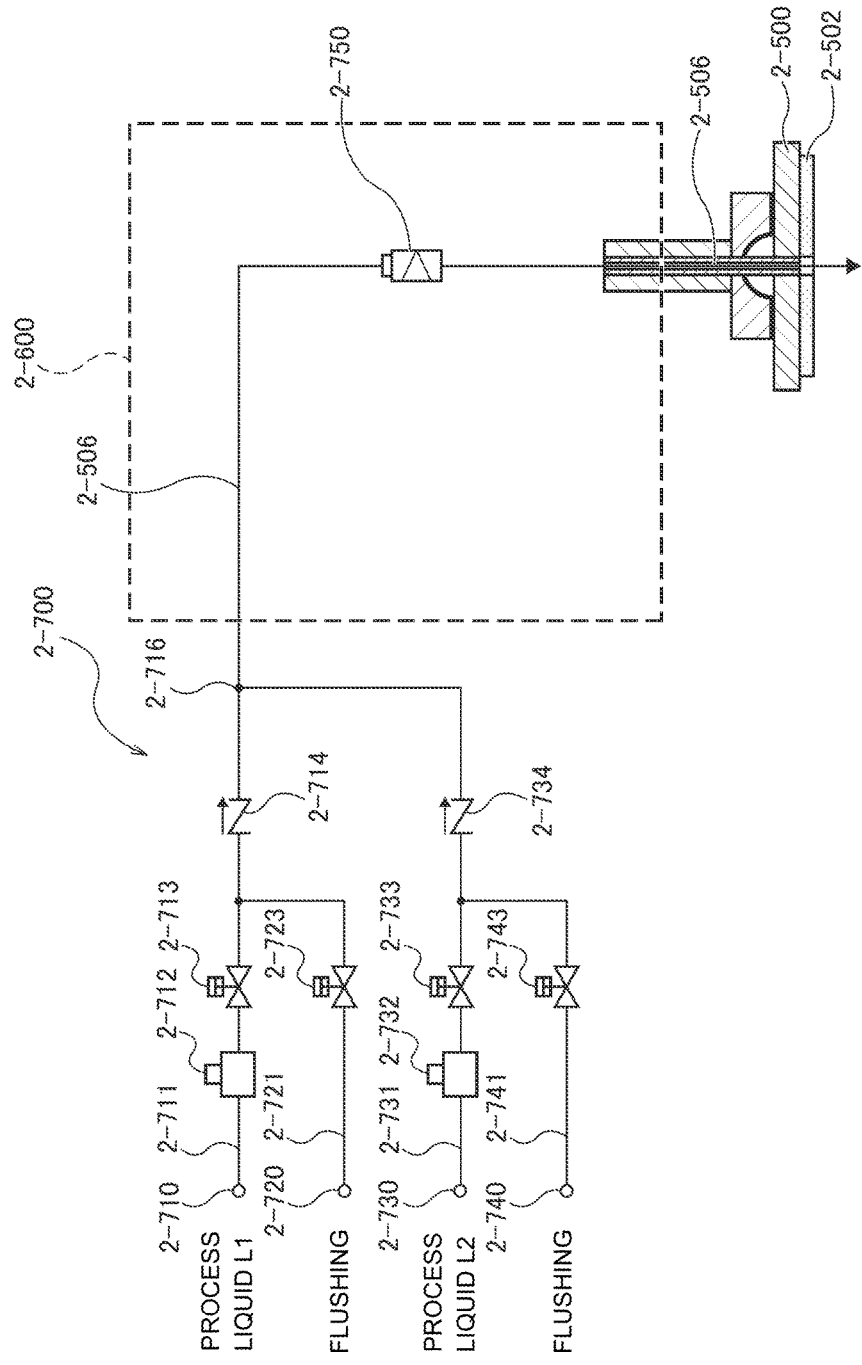
FIG. 17 is a schematic diagram illustrating one example of a liquid supply system.

FIG. 17 illustrates one example of the liquid supply system 2-700. In this example, as illustrated in the figure, the liquid supply system 2-700 includes process liquid supply sources 2-710 and 2-730, and cleaning liquid supply sources 2-720 and 2-740. The process liquid supply sources 2-710 and 2-730 are the supply sources of the process liquids of mutually different kinds, and for example, the process liquid supply source 2-710 is a slurry supply source, and the process liquid supply source 2-730 is a chemical supply source. The process liquid supply source 2-710 is connected to process liquid piping 2-711. The process liquid piping 2-711 is provided with a flow rate controller 2-712, an on-off valve 2-713, and a check valve 2-714 in the order in the view from the process liquid supply source 2-710. To the cleaning liquid supply source 2-720, cleaning liquid piping 2-721 is connected. The cleaning liquid piping 2-721 is provided with an on-off valve 2-723, and a downstream side of the on-off valve 2-723 (a side opposite to the cleaning liquid supply source 2-720) is connected to the process liquid piping 2-711 between the on-off valve 2-713 and the check valve 2-714. Similarly, the process liquid supply source 2-730 is connected to process liquid piping 2-731. The process liquid piping 2-731 is provided with a flow rate controller 2-732, an on-off valve 2-733, and a check valve 2-734 in the order in the view from the process liquid supply source 2-730. To the cleaning liquid supply source 2-740, cleaning liquid piping 2-741 is connected. The cleaning liquid piping 2-741 is provided with an on-off valve 2-743, and a downstream side of the on-off valve 2-743 is connected to the process liquid piping 2-731 between the on-off valve 2-733 and the check valve 2-734.

The process liquid piping 2-711 and the process liquid piping 2-731 are integrated into one line at a spot 2-716 more on the downstream side than the check valves 2-714 and 2-734, and then connected to the internal supply line 2-506 formed inside the buff arm 2-600. Inside the buff arm 2-600, a rotary joint 2-750 is provided in the middle of the internal supply line 2-506. By the rotary joint 2-750, a movable part (rotary part) and a stationary part are connected. As in the present embodiment, since the process liquid piping 2-711 and the cleaning liquid piping 2-741 are integrated more on an upstream side than the rotary joint 2-750, the rotary joint 2-750 can be miniaturized. Also, since the process liquid piping 2-711 and the cleaning liquid piping 2-741 are integrated outside the buff arm 2-600, the buff arm 2-600 can be miniaturized.

For process liquids 2-L1 and 2-L2, since a highly viscous liquid such as the slurry is used, in order to prevent the liquid from getting fixed to each piping and the rotary joint 2-750, the cleaning liquid (for example, the pure water or the chemical) is distributed to these from the cleaning liquid supply sources 2-720 and 2-740. The cleaning operation is automatically executed at predetermined timing according to an operating situation of the buffing module 2-300A. The predetermined timing can be, for example, during idling or at every predetermined time interval, or the like. The supplied cleaning liquid is discharged through the buff head 2-500.

In the liquid supply system 2-700, by selectively opening and closing the on-off valves 2-713, 2-723, 2-733, and 2-743, one of the process liquids 2-L1 and 2-L2 and the cleaning liquid is supplied to the internal supply line 2-506. In one using form, simultaneous opening of two or more of the on-off valves 2-713, 2-723, 2-733, and 2-743 is inhibited. By such control, and by providing the check valves 2-714 and 2-734, cross contamination among the piping 2-711, 2-721, 2-731 and 2-741, that is, mixing into one piping of the liquid handled in the other piping, can be prevented. The operation may be subjected to interlock control by the controller 5 using software. In other using form, simultaneous opening two or more of the piping 2-711, 2-721, 2-731 and 2-741 is allowed. By such control, a liquid mixture can be supplied. By controlling the flow rate controllers 2-712 and 2-732, a mixing ratio of the liquid mixture can be adjusted.

Figure 18:
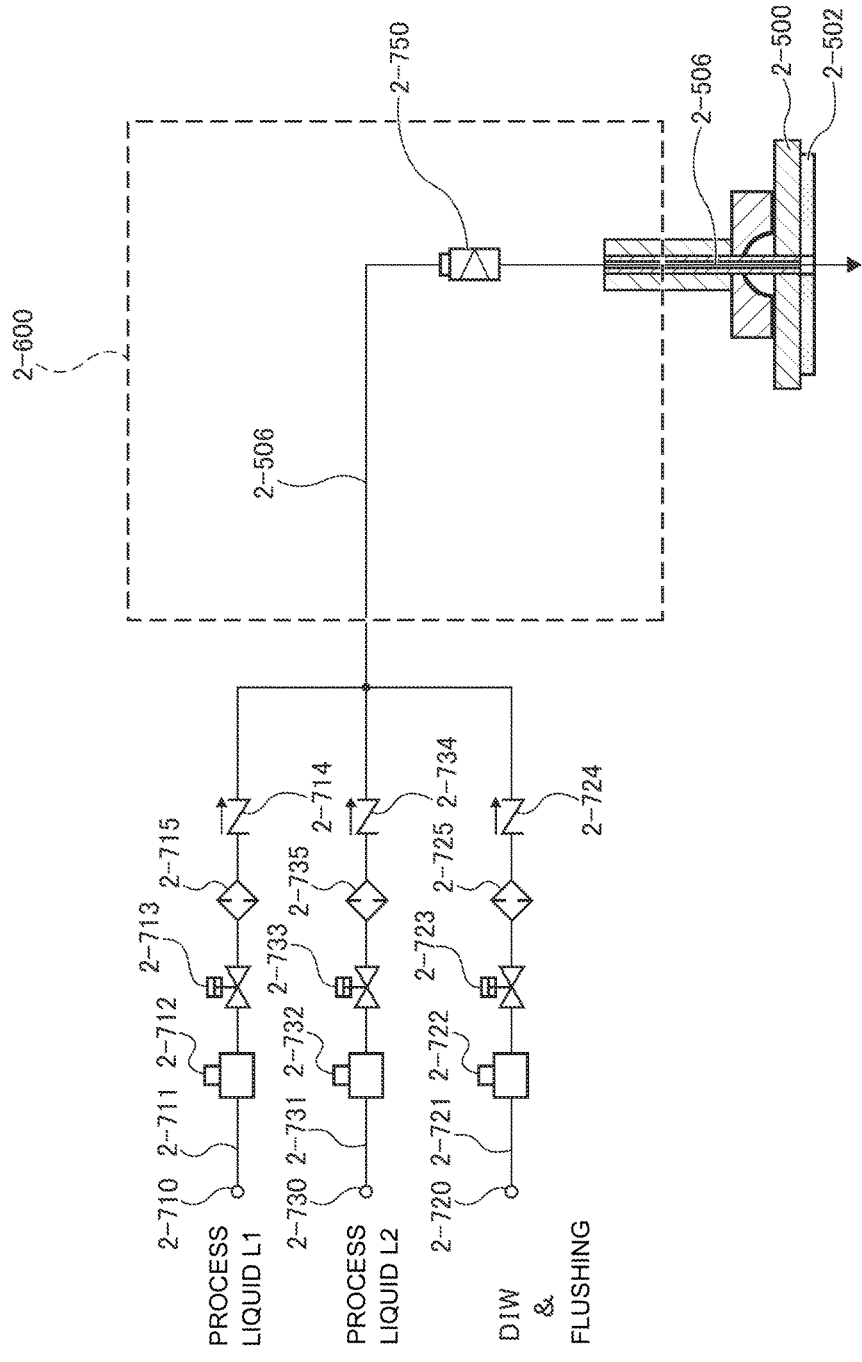
FIG. 18 is a schematic diagram illustrating another example of the liquid supply system.

FIG. 18 illustrates another example of the liquid supply system 2-700. In this example, the pure water is used as one of the process liquids. Since the pure water can be used as the cleaning liquid, a pure water line is also used as a cleaning liquid line. Specifically, to the process liquid supply source 2-710, the process liquid piping 2-711 is connected. The process liquid piping 2-711 is provided with the flow rate controller 2-712, the on-off valve 2-713, a filter 2-715, and the check valve 2-714 in the view from the process liquid supply source 2-710. Similarly, to the process liquid supply source 2-730, the process liquid piping 2-731 is connected. The process liquid piping 2-731 is provided with the flow rate controller 2-732, the on-off valve 2-733, a filter 2-735, and the check valve 2-734 in the view from the process liquid supply source 2-730. Also, to the cleaning liquid supply source (pure water supply source) 2-720, the cleaning liquid piping 2-721 is connected. The cleaning liquid piping 2-721 is provided with a flow rate controller 2-722, the on-off valve 2-723, a filter 2-725, and a check valve 2-724 in the view from the cleaning liquid supply source 2-720. The process liquid piping 2-711 and 2-731 and the cleaning liquid piping 2-721 are integrated into one line more on the downstream side of the check valves 2-714, 2-734 and 2-724 and on the outside of the buff arm 2-600, and then connected to the internal supply line 2-506 formed inside the buff arm 2-600.

The liquid supply system 2-700 may be provided with a pressure or flow rate detection sensor. On the basis of a result of the sensor, a controller 2-5 can monitor abnormality of each line and perform reporting by an alarm and interlock.

Figure 19:
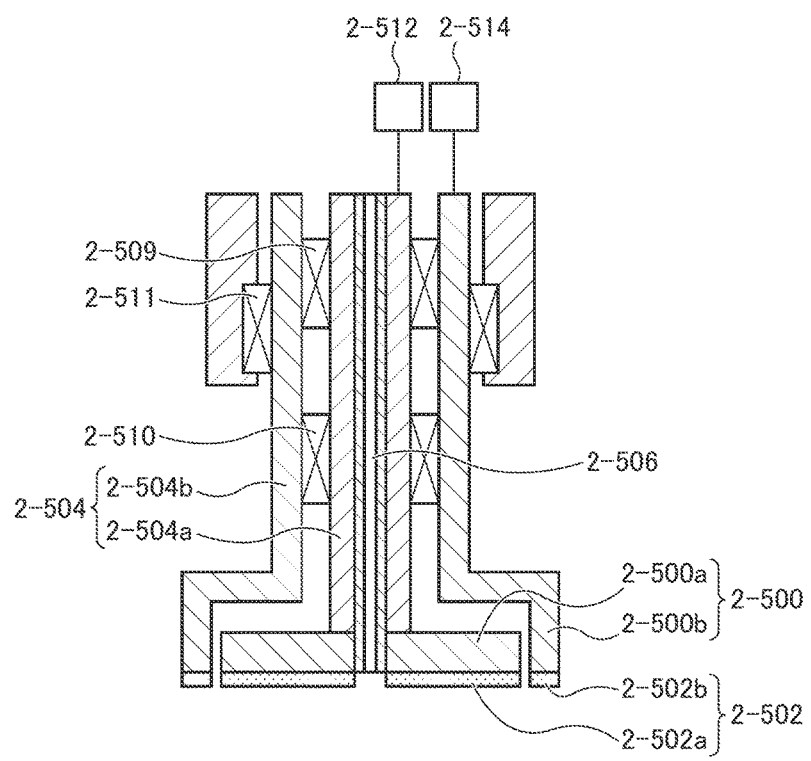
FIG. 19 is a sectional view illustrating details of the buff head and the buff pad.

FIG. 19 illustrates the details of the buff head 2-500 and the buff arm 2-600 simply displayed in FIG. 16A. As illustrated in the figure, the buff head 2-500 includes a first buff head 2-500a and a second buff head 2-500b. The first buff head 2-500a has a disk shape for which an opening of the internal supply line 2-506 is formed at the center. The second buff head 2-500b has an annular shape, and is arranged so as to surround the first buff head 2-500a on the radial direction outer side of the first buff head 2-500a. Therefore, the first buff head 2-500a is also called an inner head 2-500a, and the second buff head 2-500b is also called an outer head 2-500b. The inner head 2-500a and the outer head 2-500b are arranged at spaced-apart.

The inner head 2-500a is connected to a shaft 2-504a extending at the upper part. Similarly, the outer head 2-500b is connected to a shaft 2-504b extending at the upper part. The shaft 2-504b has a hollow columnar shape, and surrounds the periphery of the shaft 2-504a through bearings 2-509 and 2-510. The shaft 2-504b is attached to a stationary part of the buff arm 2-600 through a bearing 2-511.

Figure 20:
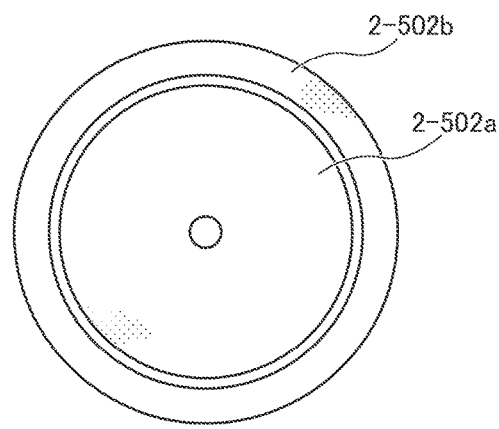
FIG. 20 is a diagram viewing the buff pad from below.

To a lower surface (a surface opposite to the shaft 2-504a) of the first buff head 2-500a, a first buff pad 2-502a (also called an inner pad 2-502a) is attached. To a lower surface of the second buff head 2-500b, a second buff pad 2-502b (also called an outer pad 2-502b) is attached. FIG. 20 is a diagram viewing the inner pad 2-502a and the outer pad 2-502b from below. As illustrated in the figure, the inner pad 2-502a and the outer pad 2-502b have a shape following the lower surfaces of the inner head 2-500a and the outer head 2-500b respectively. In the present embodiment, the inner pad 2-502a and the outer pad 2-502b have the same characteristics. That is, the inner pad 2-502a and the outer pad 2-502b are different only in shapes.

The shaft 2-504a is connected to an actuator 2-512. By the actuator 2-512, the shaft 2-504a and the inner head 2-500a are configured rotatably and movably in the direction of approaching the buff table 2-400 and the direction of separating from the buff table 2-400 (in the present embodiment, a vertical direction). The shaft 2-504b is connected to an actuator 2-514. By the actuator 2-514, the shaft 2-504b and the outer head 2-500b are configured rotatably and movably in the direction of approaching the buff table 2-400 and the direction of separating from the buff table 2-400 (in the present embodiment, the vertical direction). In the present embodiment, the inner head 2-500a and the outer head 2-500b are configured movably in the vertical direction independent of each other. Further, in the present embodiment, the inner head 2-500a and the outer head 2-500b are configured rotatably independent of each other. That is, the inner head 2-500a and the outer head 2-500b can perform the operations different from each other.

Figure 22A:
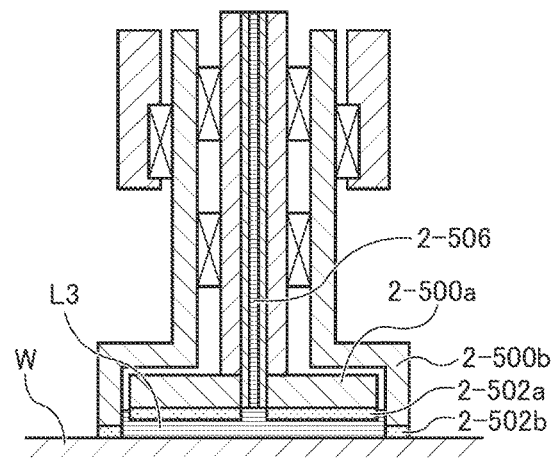
FIG. 22A is an illustration diagram illustrating a state of the buff head in each step illustrated in FIG. 21.
Figure 22B:
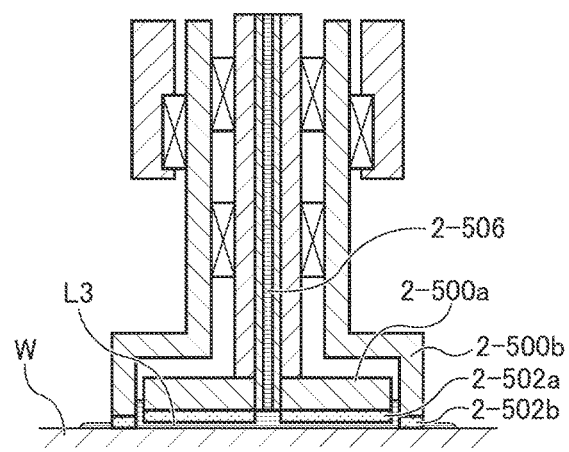
FIG. 22B is an illustration diagram illustrating a state of the buff head in each step illustrated in FIG. 21.
Figure 22C:
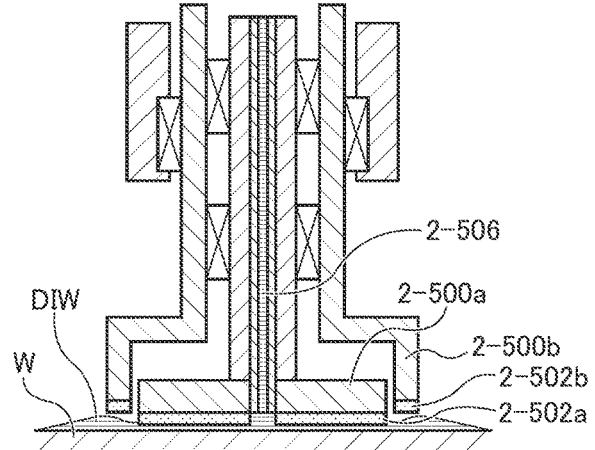
FIG. 22C is an illustration diagram illustrating a state of the buff head in each step illustrated in FIG. 21.

FIG. 21 illustrates a control example of the buff head 2-500 in each step of the buffing by the buffing module 2-300A described above. FIGS. 22A-22C illustrate a state of the buff head 2-500 in each step illustrated in FIG. 21. As illustrated in FIG. 21, in this example, when the buffing is started, preloading is performed first (step S2-10). The preloading is the processing of supplying the process liquid onto the wafer W beforehand. In the preloading, as illustrated in FIG. 21 and FIG. 22A, the inner head 2-500a is positioned at a position (also called an elevated position, hereinafter) elevated upwards so that the inner pad 2-502a is not brought into contact with the wafer W. That is, the inner head 2-500a and the inner pad 2-502a are in the state of being withdrawn upwards. On the other hand, the outer head 2-500b is positioned at a position (also called a contact position, hereinafter) for bringing the outer pad 2-502b into contact with the wafer W. That is, the outer head 2-500b and the outer pad 2-502b are at a lowered position. In the state, a process liquid 2-L3 (one of the process liquids 2-L1 and 2-L2 illustrated in FIG. 17, here, the slurry) is supplied from the internal supply line 2-506. Since the outer pad 2-502b is in contact with the wafer W, outflow of the process liquid 2-L3 to the outside of the second buff pad 2-502b is suppressed. That is, the large portion of the process liquid 2-L3 is held on the inner side of the second buff pad 2-502b. By the configuration, when starting the buffing, the sufficient amount of the process liquid 2-L3 is uniformly spread between the inner pad 2-502a and the wafer W already. As a result, the damages exerted to the wafer W by scratches generated on the wafer W can be suppressed.

In the present embodiment, in step S2-10, the rotation of the inner head 2-500a and the outer head 2-500b is stopped. Further, the rotation of the buff table 2-400, that is, the wafer W, is also stopped. After the sufficient amount of the process liquid 2-L3 is stored on the inner side of the outer pad 2-502b, the buff table 2-400 is rotated. The rotation of the inner head 2-500a is also started simultaneously with the rotation of the buff table 2-400, and the inner head 2-500a starts to lower further, shifting to the next step. In this way, by performing the preloading in the state that the rotation of the buff table 2-400 is stopped, the supplied process liquid 2-L3 is not scattered by the centrifugal force, and the sufficient amount of the process liquid 2-L3 can be uniformly spread between the inner pad 2-502a and the wafer W. Also, the preloading may be performed in the state of rotating the buff table 2-400. In this case, it is desirable to start supply of the process liquid 2-L3 from the internal supply line 2-506 before the outer pad 2-502b is brought into contact with the wafer W. Thus, the damages of the wafer W by the insufficiency of the process liquid when the outer pad 2-502b and the wafer W are brought into contact can be prevented. In the preloading in step S2-10, the outer head 2-500b may be rotated or may not be rotated. By rotating the outer head 2-500b and bringing it into contact with the wafer W with a pressure lower than that during the main polishing (step S2-20 below), frictions of the outer pad 2-502b and the wafer W can be reduced.

When the preloading is completed, next, light polishing, that is, the buff polishing, is executed (step S2-20). Instead of the buff polishing, the buff cleaning may be performed. In step S2-20, as illustrated in FIG. 21 and FIG. 22B, the inner head 2-500a and the outer head 2-500b are both positioned at the contact position. That is, the buffing is executed while suppressing the outflow of the process liquid 2-L3 to the outside of the outer pad 2-502b. By the configuration, the sufficient amount of the process liquid 2-L3 is uniformly spread between the inner pad 2-502a and the wafer W during the buffing. Therefore, generation of scratches can be suppressed. Also, even in the case that the buff table 2-400 is rotated at a relatively high speed, since the sufficient amount of the process liquid 2-L3 can be held between the inner pad 2-502a and the wafer W, the buffing rate can be improved.

In step S2-20, the buffing is achieved by the inner pad 2-502a, and the outer pad 2-502b does not greatly contribute to the buffing performance. That is, the outer pad 2-502b is mainly used to hold the process liquid 2-L3 in the inner side area. Therefore, the controller 2-5 optimizes the pressure to be made to act on the wafer W by the inner head 2-500a through the inner pad 2-502a according to the demanded buffing performance. On the other hand, the controller 2-5 controls the pressure to be made to act on the wafer W by the outer head 2-500b through the outer pad 2-502b to the absolute minimum pressure for holding the process liquid 2-L3. For example, the pressure by the outer head 2-500b is controlled to be smaller than the pressure by the inner head 2-500a. Similarly, the controller 2-5 optimizes a rotation number of the inner head 2-500a according to the demanded buffing performance. On the other hand, the controller 2-5 optimizes the rotation number of the outer head 2-500*b* for preventing scattering of the process liquid 2-L3. For example, the outer head 2-500*b* is controlled to be a stop state, or the rotation number smaller than that of the inner head 2-500*a*. The outer head 2-500*b* may not be rotated.

In step S2-20, the process liquid 2-L3 may be supplied from the internal supply line 2-506 continuously or intermittently. A supply amount and supply timing of the process liquid 2-L3 may be set such that the sufficient amount of the process liquid 2-L3 is held in the inner side area of the outer pad 2-502*b*, in consideration of an outflow amount of the process liquid 2-L3 from the outer pad 2-502*b*.

As the alternative form, the outer head 2-500*b* may be moved to the elevated position in a latter period of the buffing. By such a configuration, outflow of products generated by the buffing to the outside can be accelerated. As a result, the damages of the wafer W by the products can be suppressed. In this case, a larger amount of the process liquid 2-L3 than in the first period of the buffing may be supplied.

When the buffing is completed, next, the cleaning liquid (here, the pure water) is supplied from the internal supply line 2-506, and liquid replacement is performed (step S2-30). By the liquid replacement, mixing of the slurry used in the buff polishing and the chemical used in chemical cleaning (step S2-40), generation of reaction products and adverse effects on cleaning by the reaction products (for example, damaging the substrate) can be suppressed. In step S2-30, as illustrated in FIG. 21 and FIG. 22C, the inner head 2-500*a* is positioned at the contact position, and the outer head 2-500*b* is elevated and positioned at an elevated position. By the configuration, discharge to the outside of the slurry used in the buff polishing and the cleaning liquid used in the liquid replacement is accelerated. Therefore, the discharge of the products generated by the buffing from the top of the wafer W can be accelerated.

When the liquid replacement is completed, next, the chemical is supplied from the internal supply line 2-506, and the chemical cleaning is performed (step S2-40). The positions of the inner head 2-500*a* and the outer head 2-500*b* are the same as in step S2-30, as illustrated in FIG. 21. However, depending on the demanded processing performance, the outer head 2-500*b* may be at the contact position. Then, when the chemical cleaning is completed, the pure water is supplied from the internal supply line 2-506, and pure water cleaning (water polishing) is performed (step S2-50). The positions of the inner head 2-500*a* and the outer head 2-500*b* are the same as in step S2-30, as illustrated in FIG. 21. Instead of or after the water polishing in step S2-50, by elevating the inner head 2-500*a*, lowering the outer head 2-500*b*, and rotating the buff table 2-400 further, the wafer W may be cleaned while accumulating the pure water inside the outer pad 2-502*b*.

As described above, according to the buffing module 2-300A, holding or discharge of various kinds of liquids are suitably controlled in each processing step, and flexible processing can be performed.

In step S2-30 (liquid replacing step) described above, the liquid replacement is executed under the situation that the buff pad 2-502 is present on the wafer W. However, as an alternative form, the buff arm 2-600 may be turned and the buff head 2-500 may be arranged at the conditioning unit 2-800. In this case, the buff head 2-500 is cleaned at the conditioning unit 2-800. During the time, onto the wafer W, the cleaning liquid (the pure water, representatively) may be supplied for the liquid replacement or drying prevention. Also, it is desirable to clean the buff pad by supplying the cleaning liquid toward the buff pad 2-502 in the conditioning unit 2-800. By supplying the cleaning liquid from the internal supply line 2-506 in the state of positioning the buff head 2-500 at the conditioning unit 2-800, the inside of the piping of the internal supply line 2-506 can be promptly liquid-replaced. Also, in the case of using the slurry as the process liquid 2-L3, when the liquid replacing step is carried out in the state that the buff pad 2-502 is in contact with the wafer W, there is a possibility that the slurry is flocculated by rapid change in pH and the substrate is damaged, however, in this alternative form, the possibility can be eliminated.

In each step of the buffing described above, various liquids are discharged. Discharge liquids include, for example, an acidic liquid and an alkaline liquid. For example, in step S2-20 described above, the slurry is supplied as the supply liquid, and the acidic liquid is discharged. In step S2-30, the pure water is supplied, and the acidic liquid (a mixture of the acidic liquid left in step S2-20 and the pure water) is discharged. In step S2-40 described above, the chemical is supplied, and the alkaline liquid is discharged. In step S2-50 described above, the pure water is supplied, the alkaline liquid (a mixture of the alkaline liquid left in step S2-40 and the pure water) is discharged in an initial stage, and a general liquid (a neutral liquid) is discharged in a stage that the left alkaline liquid is all made to flow. It is desirable to separately collect such various kinds of discharge liquids.

Figure 23:
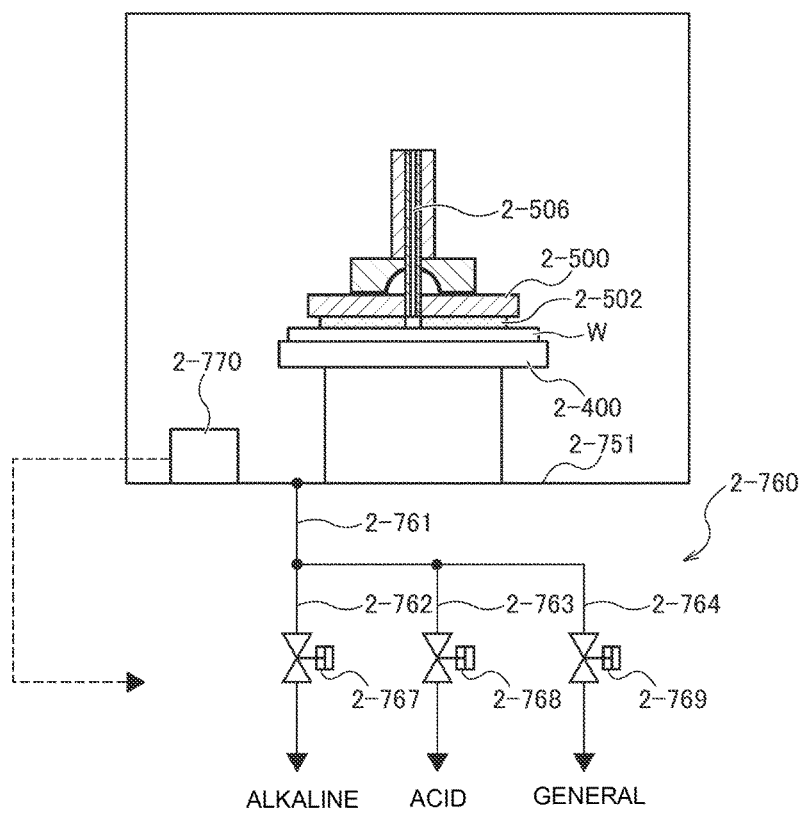
FIG. 23 is a schematic diagram illustrating one example of a liquid discharge system.

FIG. 23 is a schematic diagram illustrating one example of a liquid discharge system for separately collecting such discharge liquids. As illustrated in the figure, a liquid discharge system 2-760 includes piping 2-761, branch piping 2-762, 2-763 and 2-764 branched from the piping 2-761, on-off valves 2-767, 2-768 and 2-769 provided respectively in the branch piping 2-762, 2-763 and 2-764, and a pH sensor 2-770. Each of the branch piping 2-762, 2-763 and 2-764 is a line that collects an alkaline discharge liquid, an acidic discharge liquid, and a general discharge liquid. The discharge liquid discharged to a floor surface 2-751 flows into the piping 2-761, and is selectively collected through one of the branch piping 2-762, 2-763 and 2-764 according to an opening/closing state of the on-off valves 2-767, 2-768 and 2-769.

The opening/closing state of the on-off valves 2-767, 2-768 and 2-769 is controlled by the controller 2-5. The controller 2-5 may control the on-off valves 2-767, 2-768 and 2-769, that is, a collecting destination, on the basis of an operation instruction inputted from a user. Or, the controller 2-5 may automatically control the on-off valves 2-767, 2-768 and 2-769 according to each step of the buffing, that is, according to the kind and the supply timing of the liquid supplied from the internal supply line 2-506. Or, the controller 2-5 may control the on-off valves 2-767, 2-768 and 2-769 according to a detection result by the pH sensor 2-770. Further, the controller 2-5 may determine consistency of the kind of the discharge liquid assumed according to each step of the buffing, that is, from the kind and the supply timing of the liquid supplied from the internal supply line 2-506, and the detection result by the pH sensor 2-770. In the case of determining that they are inconsistent, the controller 2-5 may perform reporting by an alarm or the interlock. For separate collection of the discharge liquid from the buffing module 2-300A, instead of the above-described separation, the slurry, the chemical and the general liquid (mostly the pure water) may be separately collected.

B. Modification:

B-1. Modification 1:

The buffing module 2-300A may have an external nozzle provided outside the buff head 2-500 in addition to the internal supply line 2-506, as the process liquid supply means. In this case, the external nozzle may be complementarily used or may be used instead of the internal supply line 2-506, according to situations.

B-2. Modification 2:

The inner pad 2-502a and the outer pad 2-502b may have the different characteristics. For example, the inner pad 2-502a and the outer pad 2-502b may be selected such that easiness of distribution of the supply liquid between the outer pad 2-502b and the wafer W becomes less than the easiness of the distribution of the supply liquid between the inner pad 2-502a and the wafer W. The difference between them is, for example, provided by differences of various physical characteristics. Such physical characteristics include, for example, a material, hardness (Shore hardness D for example), a density, a single layer/stacked layers (a combination of a lower layer/an upper layer), a thickness, a groove shape, compressibility, a pore density (the number of pores), a pore size, a foam structure (an open cell or a closed cell), water repellency, hydrophilicity or the like. Or, the inner pad 2-502a and the outer pad 2-502b may be selected so that the buffing performance (polishing or cleaning ability, efficiency) is different. By the configuration, the buffing can be performed in a more flexible form. For example, the inner pad 2-502a may be determined on the basis of the demanded buffing performance, and as the outer pad 2-502b, a highly adhesive, that is, flexible, buff pad may be used in order to increase the performance of holding the process liquid. Or, a pad having the characteristic suitable for one of the buff polishing and the buff cleaning may be adopted as the inner pad 2-502a, and a pad having the characteristic suitable for the other may be adopted as the outer pad 2-502b. By the configuration, by selectively using one of the inner pad 2-502a and the outer pad 2-502b, the buffing according to the demanded quality can be performed without changing the buff pad. Or, different processing can be performed in each area of the wafer W and highly accurate buffing can be achieved. For example, a pad for which hard foamed polyurethane is arranged in a surface layer can be used as the inner pad 2-502a, and a suede-like porous polyurethane non-fibrous pad can be used as the outer pad 2-502b. Or, the same suede-like pads with different pore sizes or pore densities may be used respectively for the inner pad 2-502a and the outer pad 2-502b.

B-3. Modification 3:

The inner pad 2-502a and the outer pad 2-502b may not be always configured to be controlled independent of each other. That is, the inner pad 2-502a and the outer pad 2-502b may not be configured so as to be independently controlled to be elevated and lowered, and may not be configured so as to be independently controlled to be rotated. For example, even in the case that the inner pad 2-502a and the outer pad 2-502b are not configured so as to be independently controlled to be elevated and lowered, the effect of holding the process liquid in the inner side area of the outer pad 2-502b is obtained. In this case, when it is desired to accelerate the discharge of the process liquid, the inner pad 2-502a and the outer pad 2-502b may be temporarily elevated.

B-4. Modification 4:

In the above-described embodiment, the configuration of holding the processing surface of the wafer W upwards and performing the buffing is illustrated, however, the wafer W may be held in an arbitrary direction. For example, the wafer W may be held so that the processing surface is turned downward. In this case, the buff table 2-400 is executed as described above. Or, the wafer W may be held so that the processing surface is turned to a horizontal direction. In this case, the buff table 2-400 is arranged so that a holding surface of the wafer W is turned to the horizontal direction, and the buff head 2-500 is configured movably in the horizontal direction. Even in these configurations, by bringing the outer pad 2-502b into contact with the wafer W, the process liquid can be held in the inner side area of the outer pad 2-502b.

B-5. Modification 5:

The buffing modules 2-300A and 2-300B may be included in the polishing unit 2-3, without being limited to the configuration of being included in the cleaning unit 2-4.

Above, together with FIG. 11-FIG. 23, the embodiment of the present invention is described on the basis of some embodiments, however, the embodiments of the invention described above are intended to facilitate understanding of the present invention, and do not limit the present invention. It is apparent that the present invention may be modified or improved without departing from the scope thereof, and the present invention includes equivalents thereof. Also, in the scope that at least part of the above-described problems can be solved or the scope that at least part of the effects is presented, various components described in the scope of claims and specifications can be arbitrarily combined, or omitted.

Hereinafter, a processing apparatus and a processing method relating to one embodiment of the claimed invention will be described on the basis of FIG. 24-FIG. 30.

<Processing Apparatus>

Figure 24:
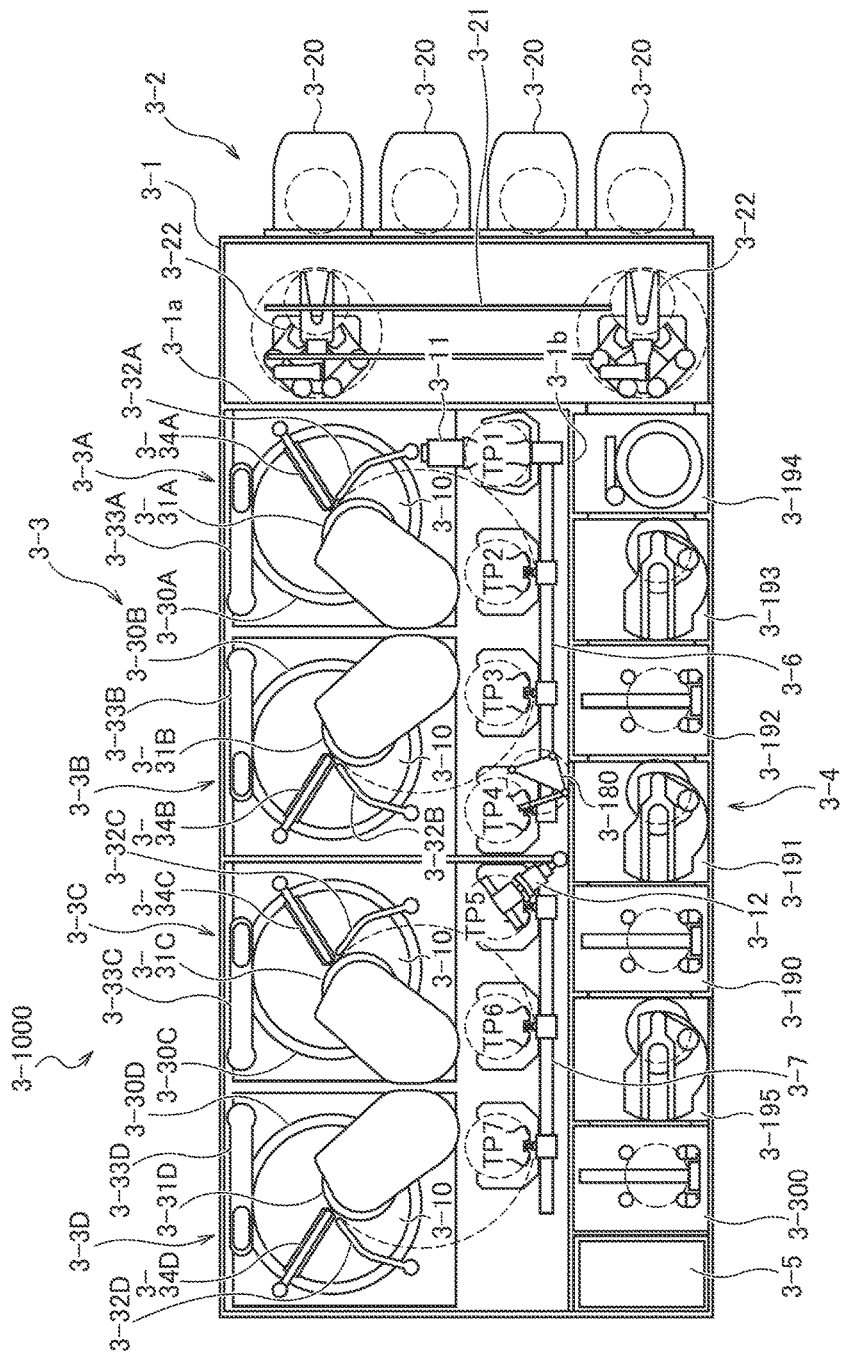
FIG. 24 is a plan view illustrating the entire configuration of a processing apparatus in the present embodiment.

FIG. 24 is a plan view illustrating the entire configuration of the processing apparatus relating to one embodiment of the present invention. As illustrated in FIG. 24, a processing apparatus (CMP apparatus) 3-1000 that performs various kinds of processing to a processing object includes a roughly rectangular housing 3-1. The inside of the housing 3-1 is sectioned into a loading/unloading unit 3-2, a polishing unit 3-3, and a cleaning unit 3-4 by partitions 3-1a and 3-1b. The loading/unloading unit 3-2, the polishing unit 3-3 and the cleaning unit 3-4 are respectively independently assembled, and independently exhausted. Also, the cleaning unit 3-4 includes a power supply unit that supplies power to the processing apparatus, and a controller 3-5 that controls a processing operation.

<Loading/Unloading Unit>

The loading/unloading unit 3-2 includes two or more (four, in this embodiment) front loading units 3-20 where a wafer cassette that stocks many processing objects (for example, wafers (substrates)) is mounted. These front loading units 3-20 are arranged adjacently to the housing 3-1, and arrayed along a width direction (a direction vertical to a longitudinal direction) of the processing apparatus. The front loading units 3-20 can be loaded with an open cassette, an SMIF (Standard Manufacturing Interface) pod or an FOUP (Front Opening Unified Pod). Here, the SMIF and the FOUP are sealed containers capable of keeping an environment independent of an external space by housing the wafer cassette in the inside and covering it with a partition.

Also, at the loading/unloading unit 3-2, a traveling mechanism 3-21 is arranged along an array of the front loading units 3-20. On the traveling mechanism 3-21, two transport robots (loaders, transport mechanisms) 3-22 movable along an array direction of the wafer cassettes are installed. The transport robots 3-22 can access the wafer cassettes loaded on the front loading units 3-20 by moving on the traveling mechanism 3-21. Each transport robot 3-22 has two upper and lower hands. The hand on an upper side is used when returning a processed wafer to the wafer cassette. The hand on a lower side is used when taking out a wafer before processing from the wafer cassette. In this way, the upper and lower hands can be used properly. Further, the hand on the lower side of the transport robot 3-22 is configured so as to invert the wafer.

Since the loading/unloading unit 3-2 is an area where it is needed to keep a clean state the most, the inside of the loading/unloading unit 3-2 is maintained at all times at a pressure higher than any of a processing apparatus outside, the polishing unit 3-3 and the cleaning unit 3-4. The polishing unit 3-3 is the dirtiest area since slurry is used as a polishing liquid. Therefore, a negative pressure is formed inside the polishing unit 3-3, and the pressure is maintained lower than an internal pressure of the cleaning unit 3-4. The loading/unloading unit 3-2 is provided with a filter fan unit (not shown in the figure) including a clean air filter such as a HEPA filter, a ULPA filter or a chemical filter. From the filter fan unit, clean air from which particles, toxic vapor or toxic gas is removed is blown off at all times.

<Polishing Unit>

The polishing unit 3-3 is an area where the wafer is polished (flattened). The polishing unit 3-3 includes a first polishing unit 3-3A, a second polishing unit 3-3B, a third polishing unit 3-3C, and a fourth polishing unit 3-3D. The first polishing unit 3-3A, the second polishing unit 3-3B, the third polishing unit 3-3C, and the fourth polishing unit 3-3D are arrayed along the longitudinal direction of the processing apparatus, as illustrated in FIG. 24.

As illustrated in FIG. 24, the first polishing unit 3-3A includes a polishing table 3-30A to which a polishing pad (polisher) 3-10 having a polishing surface is attached, a top ring 3-31A for holding the wafer and polishing it while pressurizing it to the polishing pad 3-10 on the polishing table 3-30A, a polishing liquid supply nozzle 3-32A for supplying a polishing liquid or a dressing liquid (for example, pure water) to the polishing pad 3-10, a dresser 3-33A for dressing the polishing surface of the polishing pad 3-10, and an atomizer 3-34A that jets a fluid mixture of the liquid (for example, the pure water) and a gas (for example, a nitrogen gas) or the liquid (for example, the pure water) and removing the slurry, polishing products and polishing pad residual by dressing on the polishing surface.

Similarly, the second polishing unit 3-3B includes a polishing table 3-30B, a top ring 3-31B, a polishing liquid supply nozzle 3-32B, a dresser 3-33B, and an atomizer 3-34B. The third polishing unit 3-3C includes a polishing table 3-30C, a top ring 3-31C, a polishing liquid supply nozzle 3-32C, a dresser 3-33C, and an atomizer 3-34C. The fourth polishing unit 3-3D includes a polishing table 3-30D, a top ring 3-31D, a polishing liquid supply nozzle 3-32D, a dresser 3-33D, and an atomizer 3-34D.

Since the first polishing unit 3-3A, the second polishing unit 3-3B, the third polishing unit 3-3C and the fourth polishing unit 3-3D have the mutually same configuration, only the first polishing unit 3-3A will be described hereinafter.

Figure 25:
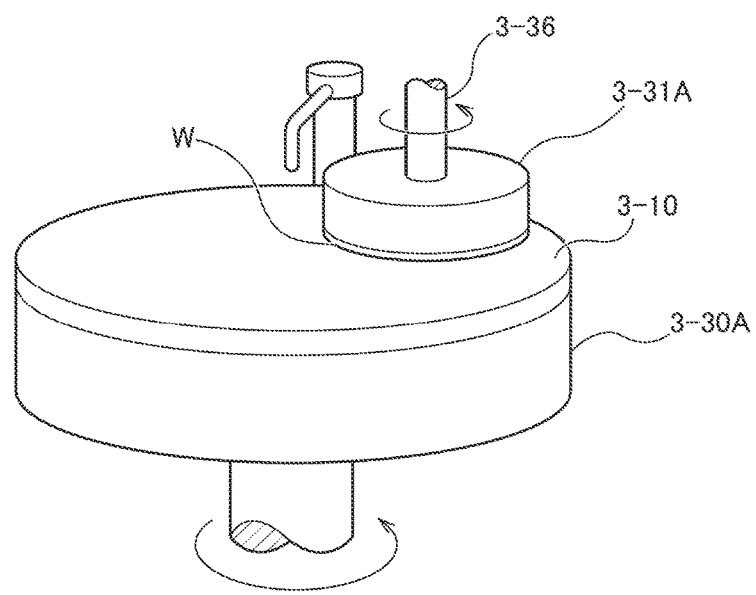
FIG. 25 is a perspective view schematically illustrating the polishing unit.

FIG. 25 is a perspective view schematically illustrating the first polishing unit 3-3A. The top ring 3-31A is supported by a top ring shaft 3-36. To an upper surface of the polishing table 3-30A, the polishing pad 3-10 is stuck. An upper surface of the polishing pad 3-10 forms a polishing surface that polishes a wafer W. Instead of the polishing pad 3-10, fixed abrasive can be also used. The top ring 3-31A and the polishing table 3-30A are configured so as to be rotated around the axial center as illustrated by arrows. The wafer W is held by vacuum suction at a lower surface of the top ring 3-31A. During polishing, in a state that the polishing liquid is supplied from the polishing liquid supply nozzle 3-32A to the polishing surface of the polishing pad 3-10, the wafer W which is a polishing object is pressurized to the polishing surface of the polishing pad 3-10 by the top ring 3-31A and polished.

<Transport Mechanism>

Next, a transport mechanism for transporting the wafer will be described. As illustrated in FIG. 24, a first linear transporter 3-6 is arranged adjacently to the first polishing unit 3-3A and the second polishing unit 3-3B. The first linear transporter 3-6 is a mechanism that transports the wafer among four transport positions (a first transport position 3-TP1, a second transport position 3-TP2, a third transport position 3-TP3, and a fourth transport position 3-TP4 in order from a loading/unloading unit side) along an array direction of the polishing units 3-3A and 3-3B.

Also, adjacently to the third polishing unit 3-3C and the fourth polishing unit 3-3D, a second linear transporter 3-7 is arranged. The second linear transporter 3-7 is a mechanism that transports the wafer among three transport positions (a fifth transport position 3-TP5, a sixth transport position 3-TP6, and a seventh transport position 3-TP7 in order from the loading/unloading unit side) along an array direction of the polishing units 3-3C and 3-3D.

The wafer is transported to the polishing units 3-3A and 3-3B by the first linear transporter 3-6. The top ring 3-31A of the first polishing unit 3-3A is moved between a polishing position and the second transport position 3-TP2 by a swing operation of a top ring head. Therefore, the wafer is delivered to the top ring 3-31A at the second transport position 3-TP2. Similarly, the top ring 3-31B of the second polishing unit 3-3B is moved between the polishing position and the third transport position 3-TP3, and the wafer is delivered to the top ring 3-31B at the third transport position 3-TP3. The top ring 3-31C of the third polishing unit 3-3C is moved between the polishing position and the sixth transport position 3-TP6, and the wafer is delivered to the top ring 3-31C at the sixth transport position 3-TP6. The top ring 3-31D of the fourth polishing unit 3-3D is moved between the polishing position and the seventh transport position 3-TP7, and the wafer is delivered to the top ring 3-31D at the seventh transport position 3-TP7.

At the first transport position 3-TP1, a lifter 3-11 for receiving the wafer from the transport robot 3-22 is arranged. The wafer is delivered from the transport robot 3-22 to the first linear transporter 3-6 through the lifter 3-11. Being positioned between the lifter 3-11 and transport robot 3-22, a shutter (not shown in the figure) is provided on the partition 3-1*a*, and when transporting the wafer, the shutter is opened and the wafer is delivered from the transport robot 3-22 to the lifter 3-11. Also, among the first linear transporter 3-6, the second linear transporter 3-7 and the cleaning unit 3-4, a swing transporter 3-12 is arranged. The swing transporter 3-12 has a hand movable between the fourth transport position 3-TP4 and the fifth transport position 3-TP5. The wafer is delivered from the first linear transporter 3-6 to the second linear transporter 3-7 by the swing transporter 3-12. The wafer is transported to the third polishing unit 3-3C and/or the fourth polishing unit 3-3D by the second linear transporter 3-7. Also, the wafer polished in the polishing unit 3-3 is transported to the cleaning unit 3-4 through the swing transporter 3-12.

<Cleaning Unit>

Figure 26A:
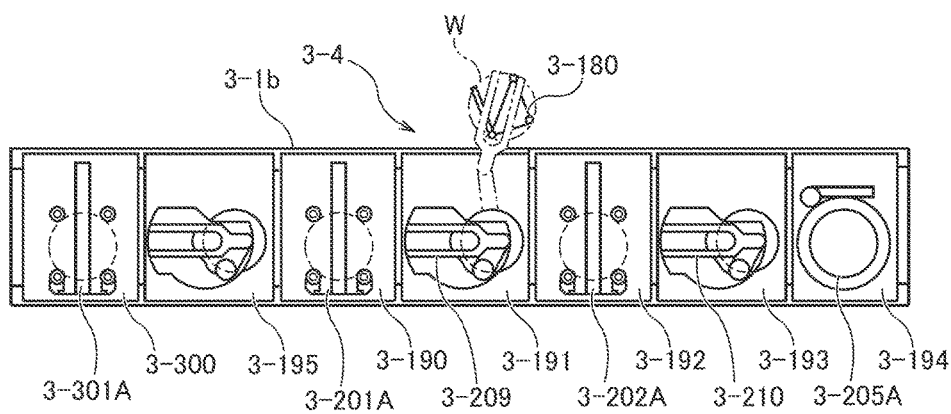
FIG. 26A is a plan view of the cleaning unit.
Figure 26B:
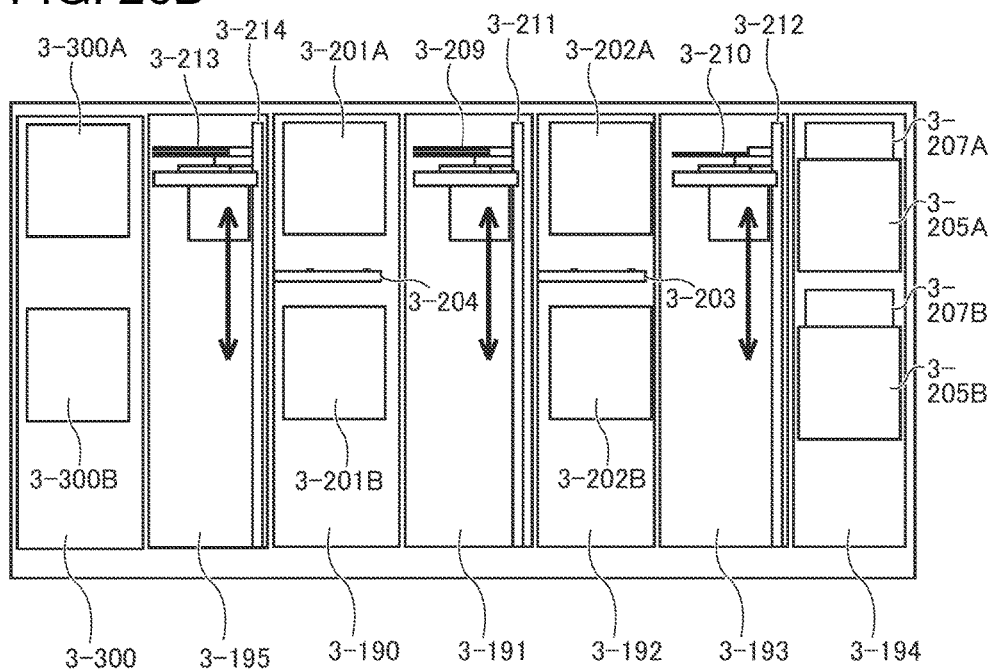
FIG. 26B is a side view of the cleaning unit.

FIG. 26(a) is a plan view illustrating the cleaning unit 3-4, and FIG. 26(b) is a side view illustrating the cleaning unit 3-4. As illustrated in FIG. 26(a) and FIG. 26(b), the cleaning unit 3-4 is sectioned here into a roll cleaning chamber 3-190, a first transport chamber 3-191, a pen cleaning chamber 3-192, a second transport chamber 3-193, a drying chamber 3-194, a buffing chamber 300, and a third transport chamber 3-195. Pressure balance among the respective chambers of the polishing unit 3-3, the roll cleaning chamber 3-190, the pen cleaning chamber 3-192, the drying chamber 3-194, and the buffing chamber 3-300 can be the drying chamber 3-194>the roll cleaning chamber 3-190 and the pen cleaning chamber 3-192>the buffing chamber 3-300 the polishing unit 3-3. The polishing liquid is used in the polishing unit, and also in the buffing chamber, the polishing liquid is sometimes used as a buffing liquid. Therefore, by attaining the pressure balance described above, inflow of particle components such as abrasive in the polishing liquid in particular into the cleaning and drying chambers can be prevented, and thus cleanness of the cleaning and drying chambers can be maintained.

Inside the roll cleaning chamber 3-190, an upper side roll cleaning module 3-201A and a lower side roll cleaning module 3-201B arrayed along a longitudinal direction are arranged. The upper side roll cleaning module 3-201A is arranged above the lower side roll cleaning module 3-201B. The upper side roll cleaning module 3-201A and the lower side roll cleaning module 3-201B are cleaners that clean the wafer by respectively pressing two rotating roll sponges to front and back surfaces of the wafer while supplying a cleaning liquid to the front and back surfaces of the wafer. Between the upper side roll cleaning module 3-201A and the lower side roll cleaning module 3-201B, a temporary base 3-204 of the wafer is provided.

Inside the pen cleaning chamber 3-192, an upper side pen cleaning module 3-202A and a lower side pen cleaning module 3-202B arrayed along the longitudinal direction are arranged. The upper side pen cleaning module 3-202A is arranged above the lower side pen cleaning module 3-202B. The upper side pen cleaning module 3-202A and the lower side pen cleaning module 3-202B are cleaners that clean the wafer by pressing a rotating pencil sponge to the front surface of the wafer and swinging it in a radial direction of the wafer while supplying the cleaning liquid to the front surface of the wafer. Between the upper side pen cleaning module 3-202A and the lower side pen cleaning module 3-202B, a temporary base 3-203 of the wafer is provided.

Inside the drying chamber 3-194, an upper side drying module 3-205A and a lower side drying module 3-205B arrayed along the longitudinal direction are arranged. The upper side drying module 3-205A and the lower side drying module 3-205B are isolated from each other. At upper parts of the upper side drying module 3-205A and the lower side drying module 3-205B, filter fan units 3-207A and 3-207B that supply clean air into the drying modules 3-205A and 3-205B respectively are provided.

The upper side roll cleaning module 3-201A, the lower side roll cleaning module 3-201B, the upper side pen cleaning module 3-202A, the lower side pen cleaning module 3-202B, the temporary base 3-203, the upper side drying module 3-205A, and the lower side drying module 3-205B are fixed to a frame not show in the figure through bolts or the like.

In the first transport chamber 3-191, a vertically movable first transport robot (transport mechanism) 3-209 is arranged. In the second transport chamber 3-193, a vertically movable second transport robot 3-210 is arranged. In the third transport chamber 3-195, a vertically movable third transport robot (transport mechanism) 3-213 is arranged. The first transport robot 3-209, the second transport robot 3-210, and the third transport robot 3-213 are freely movably supported respectively by support shafts 3-211, 3-212 and 3-214 extending in the longitudinal direction. The first transport robot 3-209, the second transport robot 3-210 and the third transport robot 3-213 have a drive mechanism such as a motor inside, and are freely vertically movable along the support shafts 3-211, 3-212 and 3-214. The first transport robot 3-209 has hands in two upper and lower stages similarly to the transport robot 3-22. The first transport robot 3-209 is arranged at such a position that the hand on the lower side can access the above-described temporary base 3-180 as illustrated by a dotted line in FIG. 26(a). When the hand on the lower side of the first transport robot 3-209 accesses the temporary base 3-180, the shutter (not shown in the figure) provided on the partition 3-1b is opened.

The first transport robot 3-209 is operated so as to transport the wafer W among the temporary base 3-180, the upper side roll cleaning module 3-201A, the lower side roll cleaning module 3-201B, the temporary base 3-204, the temporary base 3-203, the upper side pen cleaning module 3-202A, and the lower side pen cleaning module 3-202B. The first transport robot 3-209 uses the hand on the lower side when transporting the wafer before cleaning (the wafer to which slurry is stuck), and uses the hand on the upper side when transporting the wafer after cleaning.

The second transport robot 3-210 is operated so as to transport the wafer W among the upper side pen cleaning module 3-202A, the lower side pen cleaning module 3-202B, the temporary base 3-203, the upper side drying module 3-205A, and the lower side drying module 3-205B. The second transport robot 3-210 is provided with only one hand since it transports only the cleaned wafer. The transport robot 3-22 illustrated in FIG. 24 takes out the wafer from the upper side drying module 3-205A or the lower side drying module 3-205B using the hand on the upper side, and returns the wafer to the wafer cassette. When the upper side hand of the transport robot 3-22 accesses the drying modules 3-205A and 3-205B, the shutter (not shown in the figure) provided on the partition 3-1a is opened.

The buffing chamber 3-300 includes an upper side buffing module 3-300A, and a lower side buffing module 3-300B. The third transport robot 3-213 is operated so as to transport the wafer W among the upper side roll cleaning module 3-201A, the lower side roll cleaning module 3-201B, the temporary base 3-204, the upper side buffing module 3-300A, and the lower side buffing module 3-300B.

In the present embodiment, an example that the buffing chamber 3-300, the roll cleaning chamber 3-190, and the pen cleaning chamber 3-192 are arranged in order from a side far from the loading/unloading unit 3-2 inside the cleaning unit 3-4 is illustrated, however, it is not limited thereto. An arranging form of the buffing chamber 3-300, the roll cleaning chamber 3-190, and the pen cleaning chamber 3-192 can be appropriately selected according to quality of the wafer and throughput or the like. Also, in the present embodiment, an example of including the upper side buffing module 300A and the lower side buffing module 300B is illustrated, however, without being limited thereto, only one of the buffing modules may be provided. Also, in the present embodiment, other than the buffing chamber 300, the roll cleaning module and the pen cleaning module are described as examples of a module that cleans the wafer W, however, without being limited thereto, 2-fluid jet cleaning (2FJ cleaning) or megasonic cleaning can be also performed. The 2-fluid jet cleaning is jetting fine droplets (mist) put on high-speed gas from a 2-fluid nozzle toward the wafer W, making them collide, and removing (cleaning) particles or the like on the surface of the wafer W utilizing a shock wave generated by collisions of the fine droplets with the surface of the wafer W. The megasonic cleaning is adding ultrasonic waves to the cleaning liquid, making acting force by vibrational acceleration of cleaning liquid molecules act on adhesive particles such as particles, and removing them. Hereinafter, the upper side buffing module 3-300A and the lower side buffing module 3-300B will be described. Since the upper side buffing module 3-300A and the lower side buffing module 3-300B are of the similar configuration, hereinafter, only the upper side buffing module 3-300A will be described.

<Buffing Module>

Figure 27:
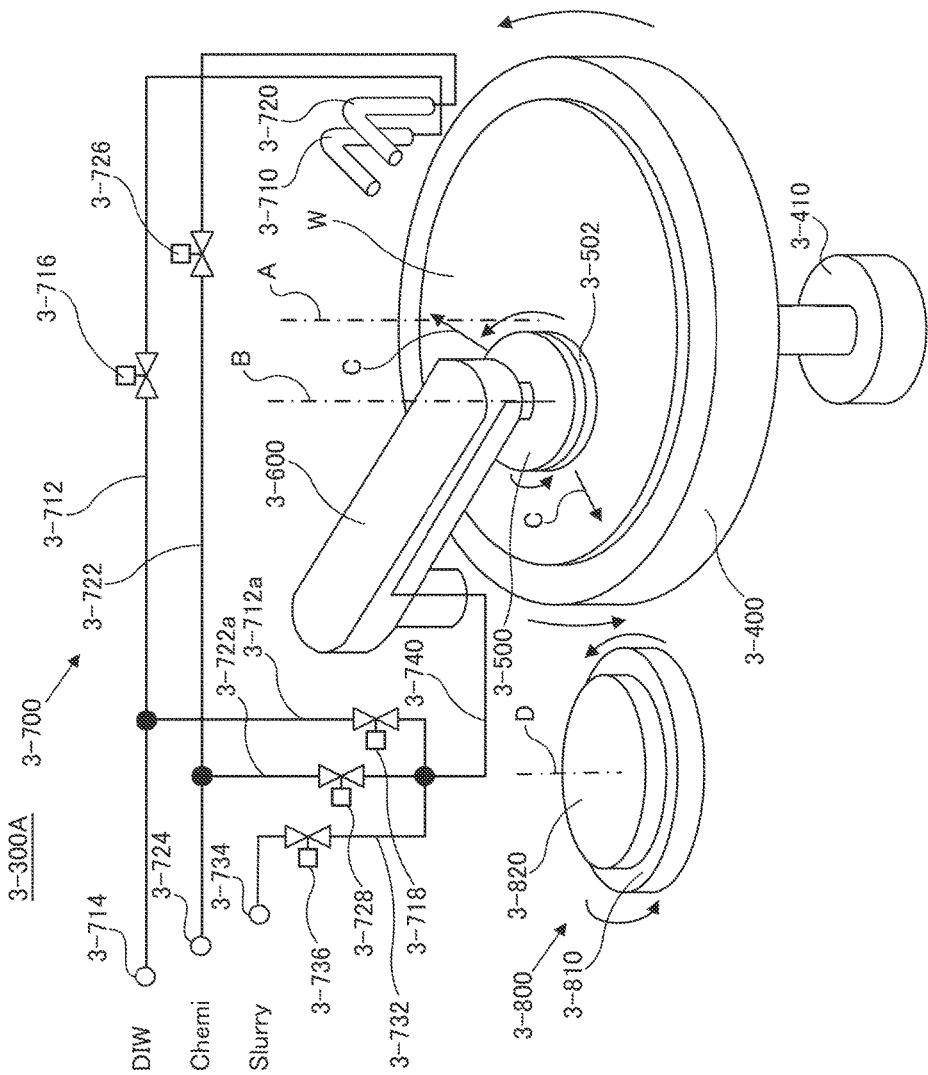
FIG. 27 is a diagram illustrating a schematic configuration of an upper side buffing module.

FIG. 27 is a diagram illustrating a schematic configuration of the upper side buffing module. As illustrated in FIG. 27, the upper side buffing module 3-300A includes a buff table 3-400 where the wafer W is installed, a buff head 3-500 to which a buff pad 3-502 for performing buffing to the wafer W by being in contact with the wafer W and relatively moving is attached, a buff arm 3-600 that holds the buff head 3-500, a liquid supply system 3-700 for supplying a buffing liquid, and a conditioning unit 3-800 for performing conditioning (setting) of the buff pad 3-502. As illustrated in FIG. 27, the buff pad 502 is smaller in diameter than the wafer W. For example, in the case that the wafer W is Φ 300 mm, it is desirable that the buff pad 3-502 is preferably Φ 100 mm or smaller, and more preferably Φ 60 to 100 mm. As for this, since an area ratio with the wafer becomes smaller as the diameter of the buff pad is larger, the buffing speed of the wafer increases. On the other hand, for in-plane uniformity of a wafer processing speed, the in-plane uniformity improves as the diameter of the buff pad becomes smaller on the contrary. This is because that unit processing area becomes small, and it is advantageous in a system of processing the entire surface of the wafer by making the buff pad 3-502 perform relative movement like swinging within the surface of the wafer W by the buff arm 3-600 as illustrated in FIG. 27. The buffing liquid includes at least one of DIW (pure water), a cleaning chemical, and the polishing liquid such as the slurry. There are mainly two kinds of the buffing system, one is a system of removing contaminants such as the slurry and the residual of the polishing products left on the wafer which is the processing object when being in contact with the buff pad, and the other one is a system of removing a fixed amount of the processing object to which the contaminants are stuck by polishing or the like. It is preferable that the buffing liquid is the cleaning chemical or the DIW in the former, and is the polishing liquid in the latter. However, in the latter, it is desirable that the a removal amount in the processing is less than 10 nm for example, and preferably 5 nm or less for maintaining the state (flatness and a residual film amount) of a processed surface after CMP. In this case, a removal speed as high as that for normal CMP is sometimes not needed. In such a case, the processing speed may be adjusted by appropriately performing processing of dilution or the like to the polishing liquid. Also, the buff pad 3-502 is formed by, for example, a foamed polyurethane based hard pad, a suede-based soft pad, or a sponge or the like. The kind of the buff pad may be appropriately selected for the material of the processing object and the state of the contaminants to be removed. For example, in the case that the contaminant is buried in the processing object surface, a hard pad that makes physical force act on the contaminant more easily, that is the pad with high hardness and rigidity, may be used as the buff pad. On the other hand, in the case that the processing object is a material with low mechanical strength such as a Low-k film for example, a soft pad may be used in order to reduce damages of the processed surface. Also, in the case that the buffing liquid is the polishing liquid like the slurry, since the removing speed of the processing object, removal efficiency of the contaminant, and presence/absence of damage generation are not determined just by the hardness or rigidity of the buff pad, a selection may be appropriately made. Also, on the surface of these buff pads, a groove shape such as concentric circular grooves, XY grooves, spiral grooves or radial grooves for example may be executed. Further, at least one hole passing through the buff pad may be provided inside the buff pad to supply the buffing liquid through the hole. Also, for the buff pad, a sponge-like material that the buffing liquid can permeate, like a PVA sponge for example, may be used. By these, a flow distribution of the buffing liquid inside the buff pad surface is uniformized, and the contaminants removed by the buffing are promptly discharged.

The buff table 3-400 has a mechanism of sucking the wafer W, and holds the wafer W. Also, the buff table 3-400 can be rotated around a rotary axis A by a drive mechanism 3-410. Also, the buff table 3-400 may make the wafer W perform angle rotary movement or scroll movement by the drive mechanism 3-410. The buff pad 3-502 is attached to the surface facing the wafer W of the buff head 3-500. The buff head 3-500 can be rotated around a rotary axis B by a drive mechanism not shown in the figure. Also, the buff head 3-500 can pressurize the buff pad 3-502 to the processing surface of the wafer W by the drive mechanism not shown in the figure. The buff arm 3-600 can move the buff head 3-500 within a range of a radius or a diameter of the wafer W as illustrated by an arrow C. Also, the buff arm 3-600 can swing the buff head 3-500 to a position at which the buff pad 3-502 faces the conditioning unit 3-800.

The conditioning unit 3-800 is a member for conditioning the surface of the buff pad 3-502. The conditioning unit 3-800 includes a dress table 3-810, and a dresser 3-820 installed to the dress table 3-810. The dress table 3-810 can be rotated around a rotary axis D by a drive mechanism not shown in the figure. Also, the dress table 3-810 may make the dresser 3-820 perform the scroll movement by the drive mechanism not shown in the figure. The dresser 3-820 is formed of a diamond dresser for which particles of diamond are electrodeposited and fixed to the surface or diamond abrasive is arranged on the entire surface or part of a contact surface with the buff pad, a brush dresser for which brush bristles made of a resin are arranged on the entire surface or part of the contact surface with the buff pad, or the combination thereof.

The upper side buffing module 3-300A turns the buff arm 3-600 until the buff pad 3-502 is at a position facing the dresser 3-820 when conditioning the buff pad 3-502. The upper side buffing module 3-300A conditions the buff pad 3-502 by rotating the dress table 3-810 around the rotary axis D, also rotating the buff head 3-500, and pressing the buff pad 3-502 to the dresser 3-820. For a conditioning condition, it is preferable to turn conditioning loads to 80 N or less. Also, it is more preferable that the conditioning loads are 40 N or less in consideration of a viewpoint of a service life of the buff pad 3-502. Also, for a rotation number of the buff pad 3-502 and the dresser 3-820, use at or under 500 rpm is desirable.

The present embodiment illustrates an example that the processing surface of the wafer W and a dressing surface of the dresser 3-820 are installed along the horizontal direction, however, it is not limited thereto. For example, for the upper side buffing module 3-300A, the buff table 3-400 and the dress table 3-810 can be arranged so that the processing surface of the wafer W and the dressing surface of the dresser 3-820 are installed along the vertical direction. In this case, the buff arm 3-600 and the buff head 3-500 are arranged so as to perform the buffing by bringing the buff pad 3-502 into contact with the processing surface of the wafer W arranged in the vertical direction and to perform conditioning by bringing the buff pad 3-502 into contact with the dressing surface of the dresser 3-820 arranged in the vertical direction. Also, either one of the buff table 3-400 and the dress table 3-810 may be arranged in the vertical direction, and all or part of the buff arm 3-600 may be rotated so that the buff pad 3-502 arranged at the buff arm 3-600 becomes vertical to each table surface.

The liquid supply system 3-700 includes a pure water nozzle 3-710 for supplying pure water (DIW) to the processing surface of the wafer W. The pure water nozzle 3-710 is connected through pure water piping 3-712 to a pure water supply source 3-714. The pure water piping 3-712 is provided with an on-off valve 3-716 capable of opening and closing the pure water piping 3-712. The controller 3-5 can supply the pure water to the processing surface of the wafer W at arbitrary timing by controlling opening and closing of the on-off valve 3-716.

Also, the liquid supply system 3-700 includes a chemical nozzle 3-720 for supplying chemical (Chemi) to the processing surface of the wafer W. The chemical nozzle 3-720 is connected through chemical piping 3-722 to a chemical supply source 3-724. The chemical piping 3-722 is provided with an on-off valve 3-726 capable of opening and closing the chemical piping 3-722. The controller 3-5 can supply the chemical to the processing surface of the wafer W at arbitrary timing by controlling opening and closing of the on-off valve 3-726.

The upper side buffing module 3-300A can selectively supply the pure water, the chemical or the polishing liquid such as the slurry to the processing surface of the wafer W through the buff arm 3-600, the buff head 3-500, and the buff pad 3-502.

That is, branch pure water piping 3-712a is branched from between the pure water supply source 3-714 and the on-off valve 3-716 in the pure water piping 3-712. Also, branch chemical piping 3-722a is branched from between the chemical supply source 3-724 and the on-off valve 3-726 in the chemical piping 3-722. The branch pure water piping 3-712a, the branch chemical piping 3-722a and polishing liquid piping 3-732 connected to a polishing liquid supply source 3-734 are merged to liquid supply piping 3-740. The branch pure water piping 3-712a is provided with an on-off valve 3-718 capable of opening and closing the branch pure water piping 3-712a. The branch chemical piping 3-722a is provided with an on-off valve 3-728 capable of opening and closing the branch chemical piping 3-722a. The polishing liquid piping 3-732 is provided with an on-off valve 3-736 capable of opening and closing the polishing liquid piping 3-732.

A first end of the liquid supply piping 3-740 is connected to three systems of the piping which are the branch pure water piping 3-712a, the branch chemical piping 3-722a and the polishing liquid piping 3-732. The liquid supply piping 3-740 stretches through the inside of the buff arm 3-600, the center of the buff head 3-500, and the center of the buff pad 3-502. A second end of the liquid supply piping 3-740 is opened toward the processing surface of the wafer W. The controller 3-5 can supply one of the pure water, the chemical and the polishing liquid such as the slurry or a liquid mixture of an arbitrary combination thereof to the processing surface of the wafer W at arbitrary timing by controlling opening/closing of the on-off valve 3-718, the on-off valve 3-728, and the on-off valve 3-736.

The upper side buffing module 3-300A can perform the buffing to the wafer W by supplying the process liquid to the wafer W through the liquid supply piping 3-740, rotating the buff table 3-400 around the rotary axis A, pressurizing the buff pad 3-502 to the processing surface of the wafer W, and swinging the buff head 3-500 in a direction of the arrow C while rotating it around the rotary axis B. For a condition in the buffing, even though the processing is basically defect removal by a mechanical action, reduction of damages to the wafer W is taken into consideration on the other hand, and it is desirable that a pressure is 3 psi or lower, preferably 2 psi or lower. Also, it is desirable that the rotation number of the wafer W and the head 3-500 is 1000 rpm or lower in consideration of an in-plane distribution of the buffing liquid. Also, a moving speed of the buff head 3-500 is 300 mm/sec or lower. However, since the distribution of the optimum moving speed is different depending on the rotation number of the wafer W and the head 3-500 and a moving distance of the buff head 3-500, it is desirable that the moving speed of the buff head 3-500 is variable within the surface of the wafer W. As a system of changing the moving speed in this case, for example, a system capable of dividing the moving distance within the surface of the wafer W into a plurality of sections and setting the moving speed for each section is desirable. Also, as a buffing liquid flow rate, a large flow rate is desirable in order to keep the sufficient intra-wafer-surface distribution of the process liquid even when the wafer W and the head 3-500 are rotated at a high speed. However, on the other hand, since process liquid flow rate increase invites increase of a process cost, it is desirable that the flow rate is 1000 ml/min or lower, preferably 500 ml/min or lower.

Here, the buffing includes at least one of buff polishing and buff cleaning.

The buff polishing is processing of polishing and removing the processing surface of the wafer W by relatively moving the wafer W and the buff pad 3-502 while bringing the buff pad 3-502 into contact with the wafer W and interposing the polishing liquid such as the slurry between the wafer W and the buff pad 3-502. The buff polishing is the processing capable of adding, to the wafer W, physical acting force stronger than physical acting force added to the wafer W by the roll sponge in the roll cleaning chamber 3-190 and physical acting force added to the wafer W by the pen sponge in the pen cleaning chamber 3-192. By the buff polishing, removal of a surface layer part where contaminants are stuck, additional removal of a part not removed in the main polishing in the polishing unit 3-3, or improvement of morphology after the main polishing can be achieved.

The buff cleaning is processing of removing contaminants on the surface of the wafer W and reforming the processing surface by relatively moving the wafer W and the buff pad 3-502 while bringing the buff pad 3-502 into contact with the wafer W and interposing a cleaning process liquid (the chemical, or, the chemical and the pure water) between the wafer W and the buff pad 3-502. The buff cleaning is the processing capable of adding, to the wafer W, the physical acting force stronger than the physical acting force added to the wafer W by the roll sponge in the roll cleaning chamber 3-190 and the physical acting force added to the wafer W by the pen sponge in the pen cleaning chamber 3-192.

<First Embodiment of Buff Head>

Figure 28:
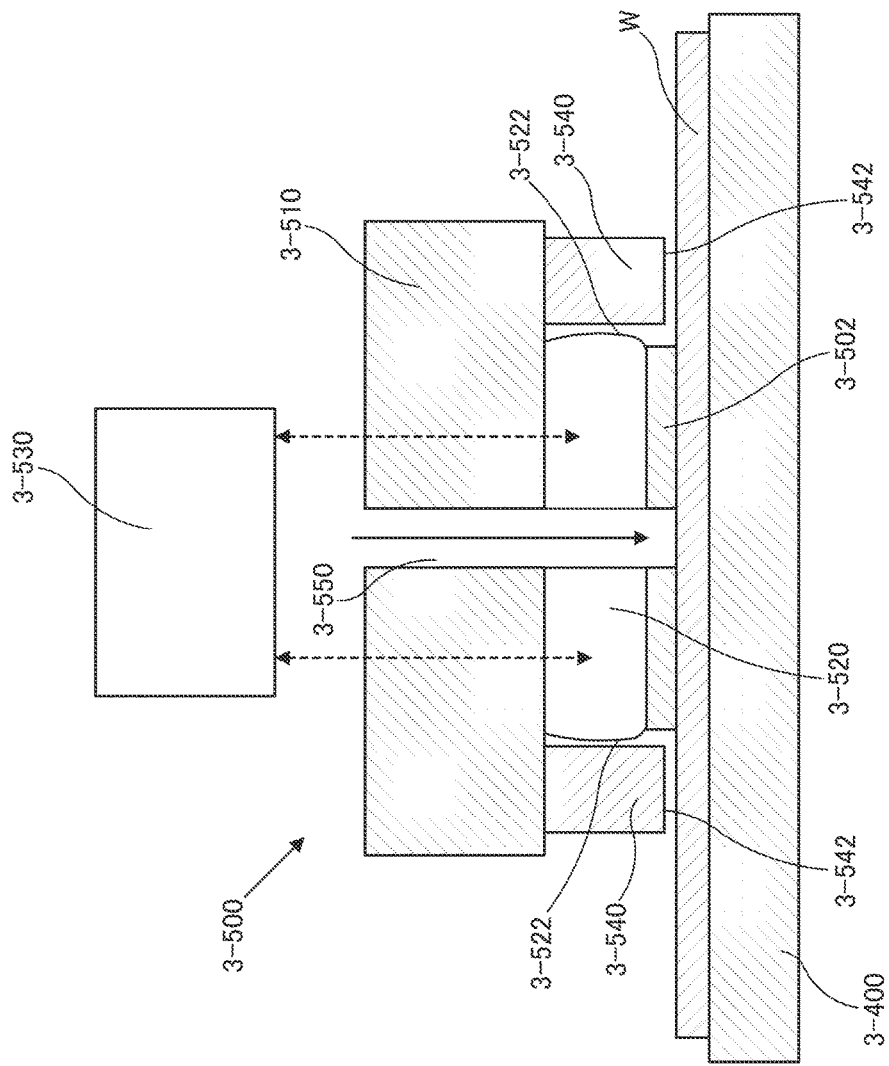
FIG. 28 is a diagram illustrating a configuration of the buff head in a first embodiment.

Next, details of the buff head 3-500 will be described. FIG. 28 is a diagram illustrating a configuration of the buff head 3-500 in the first embodiment. FIG. 28 schematically illustrates a vertical cross section of the buff head 3-500. As illustrated in FIG. 28, the buff head 3-500 includes a base member 3-510, an elastic member 3-520, a pressurizing mechanism 3-530, and a guide member 3-540.

The elastic member 3-520 is attached to a surface on the side of the wafer W of the base member 3-510. Also, to the surface on the side of the wafer W of the elastic member 3-520, the buff pad 3-502 is attached. The pressurizing mechanism 3-530 is a member that is communicated with the elastic member 3-520, and is capable of adjusting contact force of the buff pad 3-502 with the wafer W by supplying the fluid (for example, air, $N_2$ or the like) to the elastic member 3-520. The elastic member 3-520 includes, for example, a bag body whose volume is changed according to a supply amount of the fluid by the pressurizing mechanism 3-530 like an airbag.

The guide member 3-540 is a ring-like member that surrounds the entire side face 3-522 of the elastic member 3-520. Specifically, the guide member 3-540 is the ring-like member that surrounds the entire side face 3-522 of the elastic member 3-520 in the state of supplying the fluid to the elastic member 3-520. Further specifically, the guide member 3-540 is the ring-like member that surrounds the entire side face 3-522 of the elastic member 3-520 in the state of supplying the fluid to the elastic member 3-520 and pressurizing the buff pad 3-502 to the wafer W. The guide member 3-540 is not limited to a ring-like shape. The guide member 3-540 can be formed of a plurality of members that surround the entire side face 3-522 of the elastic member 3-520 at appropriate intervals in the state of supplying the fluid to the elastic member 3-520, for example.

In the present embodiment, as illustrated in FIG. 28, at the buff head 3-500, a buffing liquid passage 3-550 that passes through the center of the base member 3-510, the elastic member 3-520, and the buff pad 3-502 is formed. The buffing liquid passage 3-550 is communicated with the liquid supply piping 3-740. By providing the buffing liquid passage 3-550, various kinds of the process liquids to be used in the buffing can be supplied to the processing surface of the wafer W through the buff head 3-500. However, the process liquid can be supplied not only from the inside of the buff head 3-500 but also from the outside of the buff head 3-500. In this case, the buffing liquid passage 3-550 may not be formed at the base member 3-510, the elastic member 3-520 and the buff pad 3-502. The side face 3-522 of the elastic member 3-520 is the surface excluding the surface attached to the base member 3-510, the surface facing the buffing liquid passage 3-550, and the surface to which the buff pad 3-502 is attached, of the surface of the elastic member 3-520.

As in the present embodiment, by providing the guide member 3-540, accuracy of the processing performed by bringing the pad into contact with the processing object can be improved. That is, when the fluid is injected to the elastic member 3-520 and the buff pad 3-502 is rotated or swung while pressurizing the buff pad 3-502 to the wafer W, there is a risk that the position of the buff pad 3-502 is shifted along a surface direction of the wafer W. In this case, the buff pad 3-502 is damaged and a contact state of the buff pad 3-502 and the wafer W becomes non-uniform by the twist and distortion of the buff pad 3-502, leading to the non-uniformity of the buffing state within a buff pad surface and also within the surface of the wafer W in the buffing (for example, the non-uniformity of a defect removing performance in the buff cleaning, and the non-uniformity of the in-plane distribution of a removal amount of the processing object in the buff polishing) as a result.

On the contrary, in the present embodiment, the guide member 3-540 is provided, and since the guide member 3-540 supports the entire side face 3-522 of the elastic member 3-520, lateral shift of the buff pad 3-502 when pressurizing the elastic member 3-520 and performing the buffing can be prevented. Since the lateral shift of the buff pad 3-502 can be prevented, the buff head 3-500 can bring the buff pad 3-502 and the wafer W into contact at a desired position, and the damages due to the twists and distortion of the buff pad and the non-uniformity of the contact state can be avoided. As a result, the uniformity of the buffing state within the surface of the wafer W is improved.

As a mechanism of the buff head that holds the buff pad 3-502 as in the present embodiment, it can be considered to provide a gimbal mechanism so that the buff pad 3-502 follows the processing surface of the wafer W, or the dressing surface of the dresser 3-820. However, in the present embodiment, since a structure of pressurizing the buff pad 3-502 to the wafer W by pressurizing the elastic member 3-520 is adopted, it is not needed to provide a gimbal function, and a structure of the buff head 3-500 can be simplified.

As one example, an inner diameter of the guide member 3-540 can be within +3 mm to an outer diameter of the elastic member 3-520. Thus, friction to the guide member 3-540 due to lateral direction expansion when the elastic member 3-520 is pressurized, and vertical movement obstruction of the elastic member 3-520 due to the friction can be prevented. Also, a surface 3-542 facing the wafer W of the guide member 3-540 can be in non-contact with the processing surface of the wafer W. For example, the guide member 3-540 is attached to the base member 3-510 so that a distance between the facing surface 3-542 of the guide member 3-540 and the wafer W becomes 1 to 3 mm (the thickness of the buff pad 502 or shorter) while performing the buffing. Also, the guide member 3-540 can be formed of a resin material (PPS, PEEK, a fluorine-based resin, or the like) for example, in order to suppress corrosion due to buff chemical processing using the chemical, and to make it hard to damage the wafer W even in the case of being in contact with the wafer W.

<Second Embodiment of Buff Head>

Figure 29:
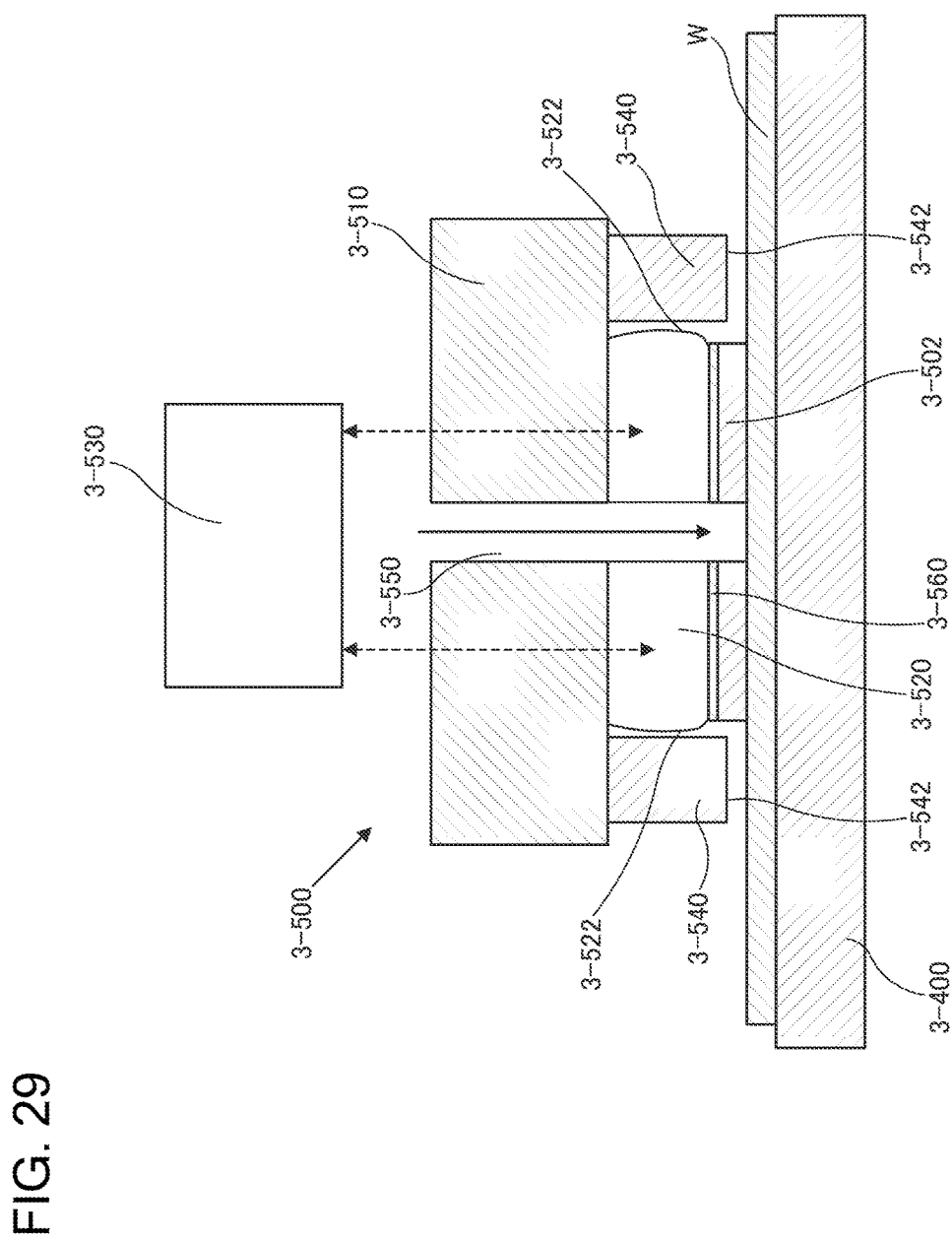
FIG. 29 is a diagram illustrating a configuration in another embodiment of the buff head in a second embodiment.

Next, another embodiment of the buff head 3-500 will be described. FIG. 29 is a diagram illustrating a configuration of another embodiment of the buff head 3-500 in the second embodiment. FIG. 29 schematically illustrates a vertical cross section of the buff head 3-500. The buff head 3-500 in FIG. 29 is different, compared to the buff head 3-500 illustrated in FIG. 28, in a point that a support member (for example, a support plate 3-560) is added. Since the other configuration is similar to the buff head 3-500 illustrated in FIG. 28, description will be omitted.

As illustrated in FIG. 29, the support plate 3-560 is attached to the surface on a side of the wafer W of the elastic member 3-520, and the buff pad 3-502 is attached to the surface on the side of the wafer W of the support plate 3-560. In other words, the buff pad 3-502 is attached to the surface on the side of the wafer W of the elastic member 3-520 through the support plate 3-560. For fixation of the elastic member 3-520 and the support plate 3-560, and fixation of the support plate 3-560 and the buff pad 3-502 in this case, other than the fixation with an adhesive agent, a method of forming a ring-like fixing part for example at an outer peripheral part of the elastic member 3-520 and the buff pad 3-502 beforehand and fixing the part is also an example. In this method, by sliding the part to a housing part provided on the side of a ring-like pressing plate or the support plate 3-560, the fixation becomes possible.

In the embodiment, at the center of the support plate 3-560, a hole for forming the buffing liquid passage 3-550 is formed. Also, in this embodiment as well, the guide member 3-540 is the ring-like member that surrounds the entire side face 3-522 of the elastic member 3-520 in the state of supplying the fluid to the elastic member 3-520. Specifically, the guide member 3-540 is the ring-like member that surrounds the entire side face 3-522 of the elastic member 3-520 in the state of supplying the fluid to the elastic member 3-520 and pressurizing the buff pad 3-502 to the wafer W.

According to the present embodiment, effects similar to that of the buff head 3-500 in FIG. 28 are presented, and by providing the support plate 3-560, adhesion of the elastic member 3-520 and the buff pad 3-502 can be improved. Thus, generation of peeling between the buff pad 3-502 and the elastic member 3-520 due to the twists when the buff pad 3-502 is rotated or swung can be suppressed. A thickness of the support plate 3-560 can be about 1 mm for example, in order to prevent obstruction of membrane expansion when the elastic member 3-520 is pressurized. Also, the support plate 3-560 may be formed of a metal such as SUS, or may be formed of a resin material (PPS, PEEK, fluorine-based resin, or the like) in the case that there is a possibility that the corrosion occurs due to the buff chemical processing using the chemical. Also, it is preferable that the support plate 3-560 is adhesive with the elastic member 3-520 and the buff pad 3-502 in the case of fixing it to these members with an adhesive agent. In the present embodiment, the support plate 3-560 is illustrated as one example of a support member, however, a shape of the support member is not limited to a planar shape.

<Third Embodiment of Buff Head>

Figure 30A:
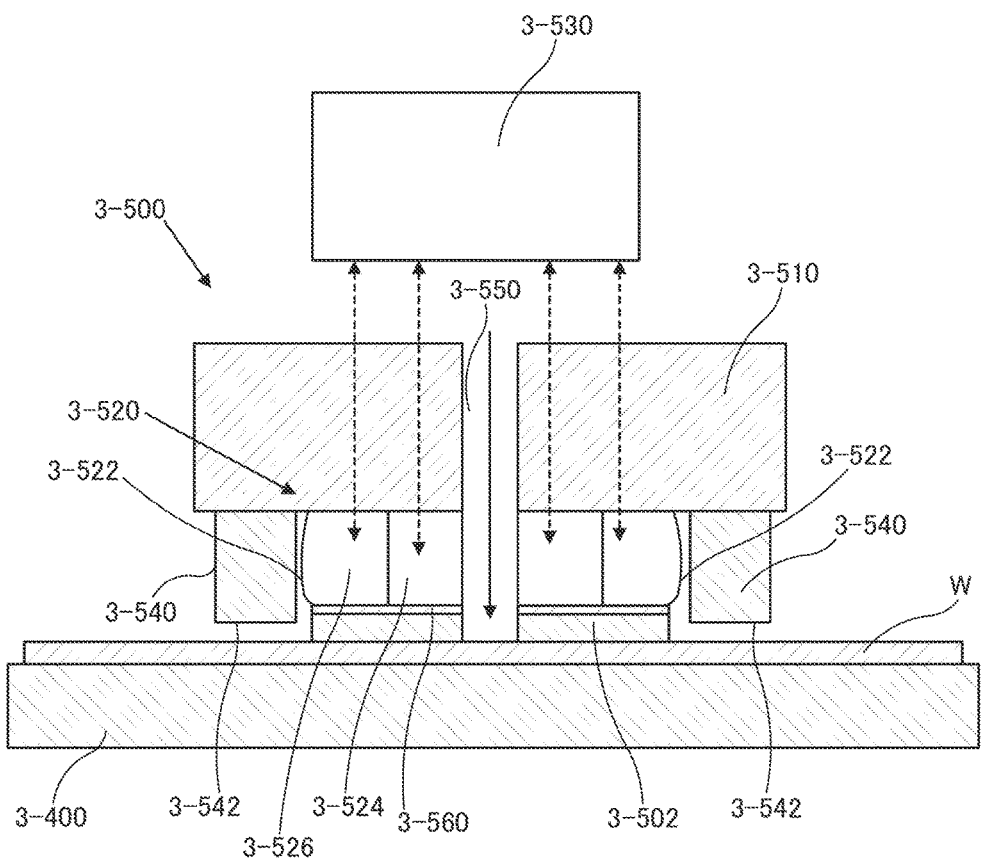
FIGS. 30A and 30B are diagrams illustrating a configuration in another embodiment of the buff head in a third embodiment.
Figure 30B:
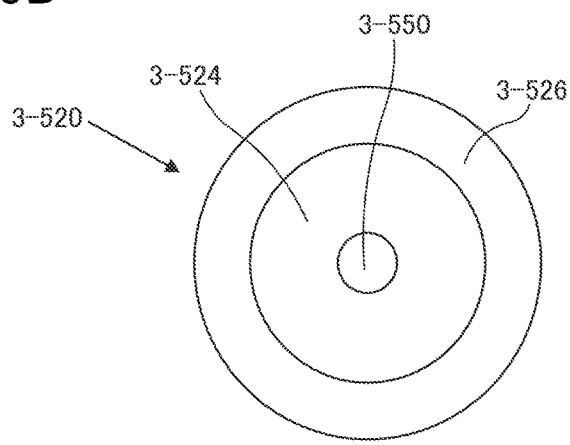

Next, another embodiment of the buff head 3-500 will be described. FIG. 30 is a diagram illustrating a configuration of another embodiment of the buff head 3-500 in the third embodiment. FIG. 30A schematically illustrates a vertical cross section of the buff head 3-500, and FIG. 30B is a plan view schematically illustrating the elastic member 3-520. The present embodiment is different, compared to the buff head 3-500 in FIG. 29, in a point that the inside of a bag body of the elastic member 3-520 is divided into a plurality of spaces. Since the other configuration is similar to the buff head 3-500 illustrated in FIG. 29, description will be omitted.

As illustrated in FIG. 30, the bag body of the elastic member 3-520 includes a plurality of spaces 3-524 and 3-526 where the fluid is not mutually communicated. Specifically, the bag body of the elastic member 3-520 includes an inner peripheral space 3-524 on a side near the buffing liquid passage 3-550 and an outer peripheral space 3-526 positioned on the outer side of the inner peripheral space 3-524, which are arranged in a concentric circular shape for example. In this case, the pressurizing mechanism 3-530 can supply the fluid independently to the plurality of spaces 3-524 and 3-526. By independently controlling the supply amounts of the fluid to the inner peripheral space 3-524 and the outer peripheral space 3-526, for example, the pressurizing mechanism 3-530 can individually control pressurizing force on the outer peripheral side and the pressurizing force on the inner peripheral side of the buff pad 3-502. As a result, according to the buff head 3-500 in the present embodiment, since the distribution of pressurization to the wafer W within the surface of the buff pad 3-502 can be controlled, the buffing can be uniformized on the processing surface of the wafer W.

In an example in FIG. 30, the example that the bag body of the elastic member 3-520 is partitioned into the two spaces 3-524 and 3-526 is illustrated, however, the number of the spaces is not limited thereto. For example, the bag body of the elastic member 3-520 may be partitioned into three or more spaces which are arranged in the concentric circular shape. Also, in the example in FIG. 30, the example that the bag body of the elastic member 3-520 is partitioned into the inner peripheral space 3-524 and the outer peripheral space 3-526 in the concentric circular shape is illustrated, however, a method of partitioning the space is not limited thereto.

Above, together with FIG. 24-FIG. 30, the embodiment of the present invention is described on the basis of some embodiments, however, the embodiments of the invention described above are intended to facilitate understanding of the present invention, and do not limit the present invention. It is apparent that the present invention may be modified or improved without departing from the scope thereof, and the present invention includes equivalents thereof. Also, in the scope that at least part of the above-described problems can be solved or the scope that at least part of the effects is presented, various components described in the scope of claims and specifications can be arbitrarily combined, or omitted.

Hereinafter, a processing module relating to one embodiment of the claimed invention will be described on the basis of FIG. 31-FIG. 39. The following embodiment will be described with a buffing module as an example of the processing module. However, the claimed invention is not limited thereto, and is applicable to the processing module that performs predetermined processing to a processing object by bringing the processing object and a pad into contact and relatively moving them.

<Processing Apparatus>

Figure 31:
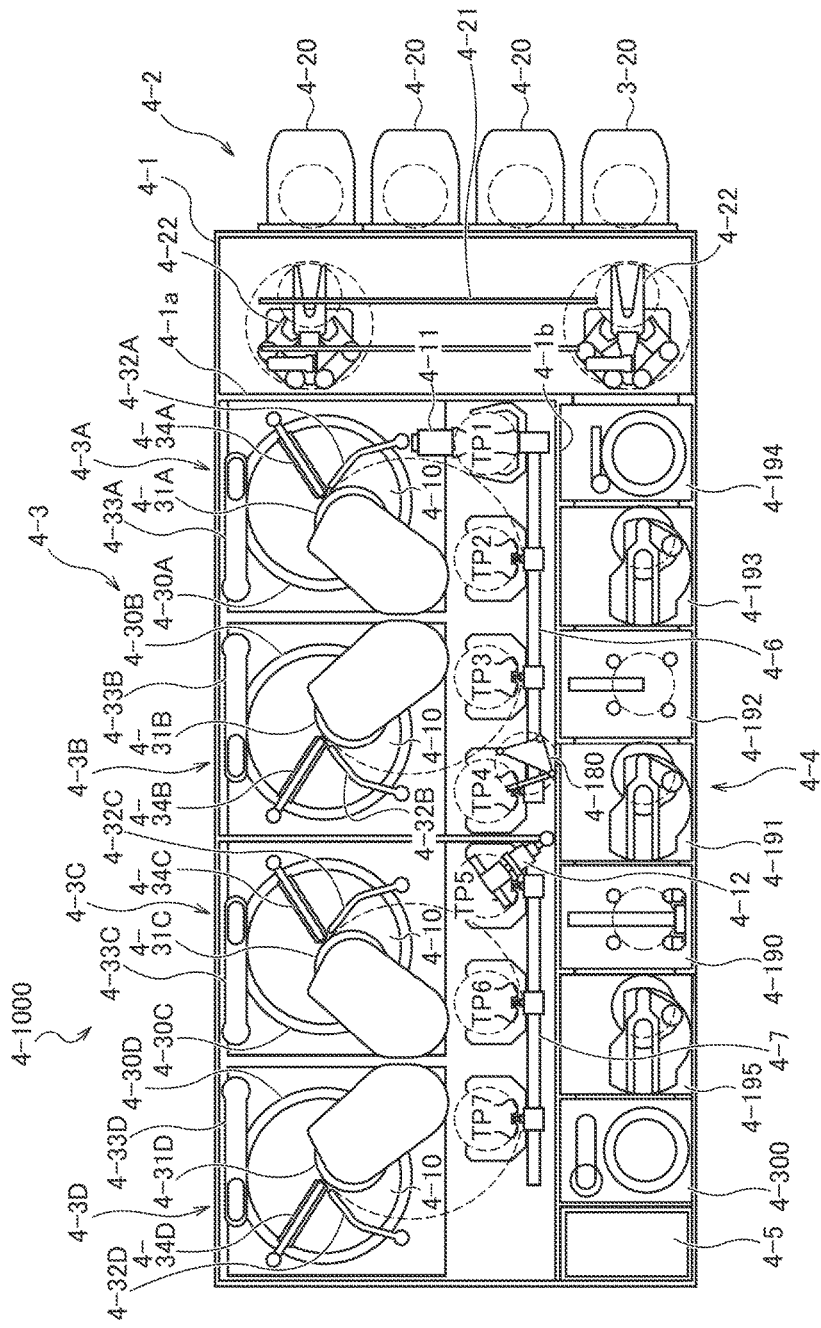
FIG. 31 is a plan view illustrating the entire configuration of a processing apparatus in the present embodiment.

FIG. 31 is a plan view illustrating the entire configuration of the processing apparatus relating to one embodiment of the present invention. As illustrated in FIG. 31, a processing apparatus (CMP apparatus) 4-1000 that performs processing to the processing object includes a roughly rectangular housing 4-1. The inside of the housing 4-1 is sectioned into a loading/unloading unit 4-2, a polishing unit 4-3, and a cleaning unit 4-4 by partitions 4-1*a* and 4-1*b*. The loading/unloading unit 4-2, the polishing unit 4-3 and the cleaning unit 4-4 are respectively independently assembled, and independently exhausted. Also, the cleaning unit 4-4 includes a power supply unit that supplies power to the processing apparatus, and a controller 4-5 that controls a processing operation.

<Loading/Unloading Unit>

The loading/unloading unit 2 includes two or more (four, in this embodiment) front loading units 4-20 where a wafer cassette that stocks many processing objects (for example, wafers (substrates)) is mounted. These front loading units 4-20 are arranged adjacently to the housing 4-1, and arrayed along a width direction (a direction vertical to a longitudinal direction) of the processing apparatus. The front loading units 4-20 can be loaded with an open cassette, an SMIF (Standard Manufacturing Interface) pod or an FOUP (Front Opening Unified Pod). Here, the SMIF and the FOUP are sealed containers capable of keeping an environment independent of an external space by housing the wafer cassette in the inside and covering it with a partition.

Also, at the loading/unloading unit 4-2, a traveling mechanism 4-21 is arranged along an array of the front loading units 4-20. On the traveling mechanism 4-21, two transport robots (loaders, transport mechanisms) 22 movable along an array direction of the wafer cassettes are installed. The transport robots 4-22 can access the wafer cassettes loaded on the front loading units 4-20 by moving on the traveling mechanism 4-21. Each transport robot 4-22 has two upper and lower hands. The hand on an upper side is used when returning a processed wafer to the wafer cassette. The hand on a lower side is used when taking out a wafer before processing from the wafer cassette. In this way, the upper and lower hands can be used properly. Further, the hand on the lower side of the transport robot 4-22 is configured so as to invert the wafer.

Since the loading/unloading unit 4-2 is an area where it is needed to keep a clean state the most, the inside of the loading/unloading unit 4-2 is maintained at all times at a pressure higher than any of a processing apparatus outside, the polishing unit 4-3 and the cleaning unit 4-4. The polishing unit 4-3 is the dirtiest area since slurry is used as a polishing liquid. Therefore, a negative pressure is formed inside the polishing unit 4-3, and the pressure is maintained lower than an internal pressure of the cleaning unit 4-4. The loading/unloading unit 4-2 is provided with a filter fan unit (not shown in the figure) including a clean air filter such as a HEPA filter, a ULPA filter or a chemical filter. From the filter fan unit, clean air from which particles, toxic vapor or toxic gas is removed is blown off at all times.

<Polishing Unit>

The polishing unit 4-3 is an area where the wafer is polished (flattened). The polishing unit 4-3 includes a first polishing module 4-3A, a second polishing module 4-3B, a third polishing module 4-3C, and a fourth polishing module 4-3D. The first polishing module 4-3A, the second polishing module 4-3B, the third polishing module 4-3C, and the fourth polishing module 4-3D are arrayed along the longitudinal direction of the processing apparatus, as illustrated in FIG. 31.

As illustrated in FIG. 31, the first polishing module 4-3A includes a polishing table 4-30A to which a polishing pad (polisher) 4-10 having a polishing surface is attached, a top ring 4-31A for holding the wafer and polishing it while pressurizing it to the polishing pad 4-10 on the polishing table 4-30A, a polishing liquid supply nozzle 4-32A for supplying a polishing liquid or a dressing liquid (for example, pure water) to the polishing pad 4-10, a dresser 4-33A for dressing the polishing surface of the polishing pad 4-10, and an atomizer 4-34A that jets a fluid mixture of the liquid (for example, the pure water) and a gas (for example, a nitrogen gas) or the liquid (for example, the pure water) and removing the slurry, polishing products and buff pad residual by dressing on the polishing surface.

Similarly, the second polishing module 4-3B includes a polishing table 4-30B, a top ring 4-31B, a polishing liquid supply nozzle 4-32B, a dresser 4-33B, and an atomizer 4-34B. The third polishing module 4-3C includes a polishing table 4-30C, a top ring 4-31C, a polishing liquid supply nozzle 4-32C, a dresser 4-33C, and an atomizer 4-34C. The fourth polishing module 4-3D includes a polishing table 4-30D, a top ring 4-31D, a polishing liquid supply nozzle 4-32D, a dresser 4-33D, and an atomizer 4-34D.

Since the first polishing module 4-3A, the second polishing module 4-3B, the third polishing module 4-3C and the fourth polishing module 4-3D have the mutually same configuration, only the first polishing module 4-3A will be described hereinafter.

Figure 32:
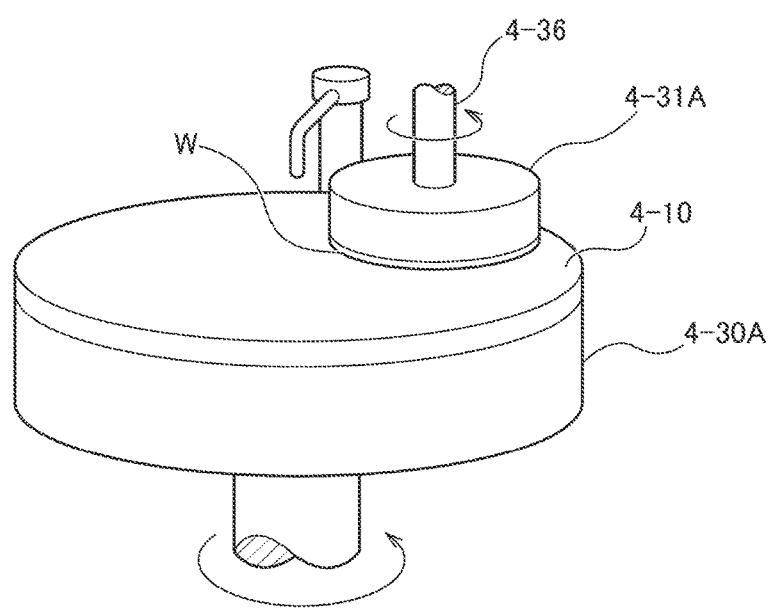
FIG. 32 is a perspective view schematically illustrating a polishing module.

FIG. 32 is a perspective view schematically illustrating the first polishing module 4-3A. The top ring 4-31A is supported by a top ring shaft 4-36. To an upper surface of the polishing table 4-30A, the polishing pad 4-10 is stuck. An upper surface of the polishing pad 4-10 forms a polishing surface that polishes a wafer W. Instead of the polishing pad 4-10, fixed abrasive can be also used. The top ring 4-31A and the polishing table 4-30A are configured so as to be rotated around the axial center as illustrated by arrows. The wafer W is held by vacuum suction at a lower surface of the top ring 4-31A. During polishing, in a state that the polishing liquid is supplied from the polishing liquid supply nozzle 4-32A to the polishing surface of the polishing pad 4-10, the wafer W which is a polishing object is pressurized to the polishing surface of the polishing pad 4-10 by the top ring 4-31A and polished.

<Transport Mechanism>

Next, a transport mechanism for transporting the wafer will be described. As illustrated in FIG. 31, a first linear transporter 4-6 is arranged adjacently to the first polishing module 4-3A and the second polishing module 4-3B. The first linear transporter 4-6 is a mechanism that transports the wafer among four transport positions (a first transport position 4-TP1, a second transport position 4-TP2, a third transport position 4-TP3, and a fourth transport position 4-TP4 in order from a loading/unloading unit side) along an array direction of the polishing modules 4-3A and 4-3B.

Also, adjacently to the third polishing module 4-3C and the fourth polishing module 4-3D, a second linear transporter 4-7 is arranged. The second linear transporter 4-7 is a mechanism that transports the wafer among three transport positions (a fifth transport position 4-TP5, a sixth transport position 4-TP6, and a seventh transport position 4-TP7 in order from the loading/unloading unit side) along an array direction of the polishing modules 4-3C and 4-3D.

The wafer is transported to the polishing modules 4-3A and 4-3B by the first linear transporter 4-6. The top ring 4-31A of the first polishing module 4-3A is moved between a polishing position and the second transport position 4-TP2 by a swing operation of a top ring head. Therefore, the wafer is delivered to the top ring 4-31A at the second transport position 4-TP2. Similarly, the top ring 4-31B of the second polishing module 4-3B is moved between the polishing position and the third transport position 4-TP3, and the wafer is delivered to the top ring 4-31B at the third transport position 4-TP3. The top ring 4-31C of the third polishing module 4-3C is moved between the polishing position and the sixth transport position 4-TP6, and the wafer is delivered to the top ring 4-31C at the sixth transport position 4-TP6. The top ring 4-31D of the fourth polishing module 4-3D is moved between the polishing position and the seventh transport position 4-TP7, and the wafer is delivered to the top ring 4-31D at the seventh transport position 4-TP7.

At the first transport position 4-TP1, a lifter 4-11 for receiving the wafer from the transport robot 4-22 is arranged. The wafer is delivered from the transport robot 4-22 to the first linear transporter 4-6 through the lifter 4-11. Being positioned between the lifter 4-11 and transport robot 4-22, a shutter (not shown in the figure) is provided on the partition 4-1a, and when transporting the wafer, the shutter is opened and the wafer is delivered from the transport robot 4-22 to the lifter 4-11. Also, among the first linear transporter 4-6, the second linear transporter 4-7 and the cleaning unit 4-4, a swing transporter 4-12 is arranged. The swing transporter 4-12 has a hand movable between the fourth transport position 4-TP4 and the fifth transport position 4-TP5. The wafer is delivered from the first linear transporter 4-6 to the second linear transporter 4-7 by the swing transporter 4-12. The wafer is transported to the third polishing module 4-3C and/or the fourth polishing module 4-3D by the second linear transporter 4-7. Also, the wafer polished in the polishing unit 4-3 is transported to the cleaning unit 4-4 through the swing transporter 4-12. At the side part of the swing transporter 4-12, a temporary base 4-180 of the wafer W installed to a frame not shown in the figure is arranged. The temporary base 4-180 is arranged adjacently to the first linear transporter 4-6, and is positioned between the first linear transporter 4-6 and the cleaning unit 4-4.

The first linear transporter 4-6 and the second linear transporter 4-7 have a plurality of transport stages (not shown in the figure) respectively, as described in Japanese Patent Laid-Open No. 2010-50436. Thus, for example, a transport stage of transporting unpolished wafers to individual transport positions and a transport stage of transporting polished wafers from the individual transport positions can be used properly. Thus, the wafer can be promptly transported to the transport position to start polishing, and the polished wafer can be promptly sent to the cleaning unit.

<Cleaning Unit>

Figure 33A:
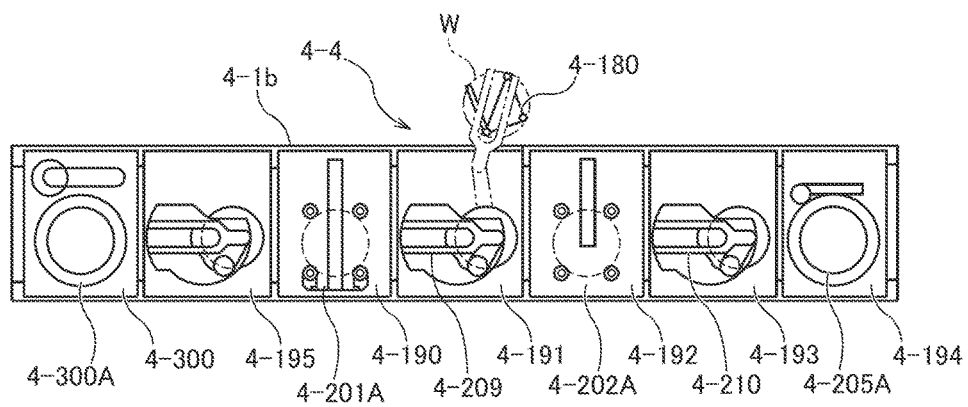
FIG. 33A is a plan view of the cleaning unit.
Figure 33B:
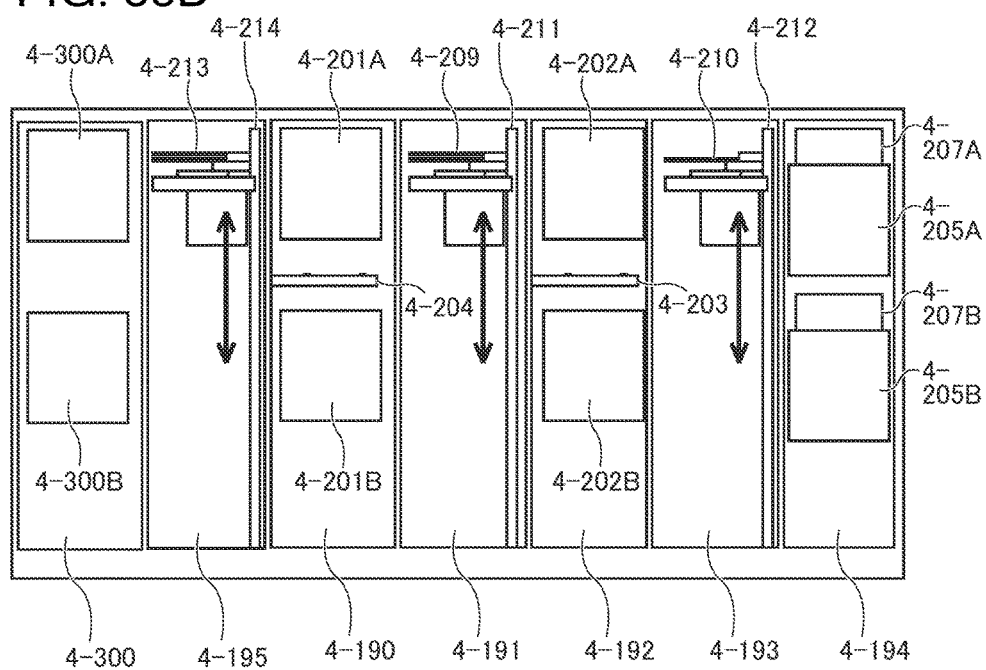
FIG. 33B is a side view of the cleaning unit.

FIG. 33(a) is a plan view illustrating the cleaning unit 4-4, and FIG. 33(b) is a side view illustrating the cleaning unit 4-4. As illustrated in FIG. 33(a) and FIG. 33(b), the cleaning unit 4-4 is sectioned here into a roll cleaning chamber 4-190, a first transport chamber 4-191, a pen cleaning chamber 4-192, a second transport chamber 4-193, a drying chamber 4-194, a buffing chamber 4-300, and a third transport chamber 4-195. Pressure balance among the respective chambers of the polishing unit 4-3, the roll cleaning chamber 4-190, the pen cleaning chamber 4-192, the drying chamber 4-194, and the buffing chamber 4-300 can be the drying chamber 4-194>the roll cleaning chamber 4-190 and the pen cleaning chamber 4-192>the buffing chamber 4-300 the polishing unit 4-3. The polishing liquid is used in the polishing unit, and also in the buffing chamber, the polishing liquid is sometimes used as a buffing liquid. Therefore, by attaining the pressure balance described above, inflow of particle components such as abrasive in the polishing liquid in particular into the cleaning and drying chambers can be prevented, and thus cleanness of the cleaning and drying chambers can be maintained.

Inside the roll cleaning chamber 4-190, an upper side roll cleaning module 4-201A and a lower side roll cleaning module 4-201B arrayed along a longitudinal direction are arranged. The upper side roll cleaning module 4-201A is arranged above the lower side roll cleaning module 4-201B. The upper side roll cleaning module 4-201A and the lower side roll cleaning module 4-201B are cleaners that clean the wafer by respectively pressing two rotating roll sponges (first cleaner) to front and back surfaces of the wafer while supplying a cleaning liquid to the front and back surfaces of the wafer. Between the upper side roll cleaning module 4-201A and the lower side roll cleaning module 4-201B, a temporary base 4-204 of the wafer is provided.

Inside the pen cleaning chamber 4-192, an upper side pen cleaning module 4-202A and a lower side pen cleaning module 4-202B arrayed along the longitudinal direction are arranged. The upper side pen cleaning module 4-202A is arranged above the lower side pen cleaning module 4-202B. The upper side pen cleaning module 4-202A and the lower side pen cleaning module 4-202B are cleaners that clean the wafer by pressing a rotating pencil sponge (second cleaner) to the front surface of the wafer and swinging it in a radial direction of the wafer while supplying the cleaning liquid to the front surface of the wafer. Between the upper side pen cleaning module 4-202A and the lower side pen cleaning module 4-202B, a temporary base 4-203 of the wafer is provided.

Inside the drying chamber 4-194, an upper side drying module 4-205A and a lower side drying module 4-205B arrayed along the longitudinal direction are arranged. The upper side drying module 4-205A and the lower side drying module 4-205B are isolated from each other. At upper parts of the upper side drying module 4-205A and the lower side drying module 4-205B, filter fan units 4-207A and 4-207B that supply clean air into the drying modules 4-205A and 4-205B respectively are provided.

The upper side roll cleaning module 4-201A, the lower side roll cleaning module 4-201B, the upper side pen cleaning module 4-202A, the lower side pen cleaning module 4-202B, the temporary base 4-203, the upper side drying module 4-205A, and the lower side drying module 4-205B are fixed to a frame not show in the figure through bolts or the like.

In the first transport chamber 4-191, a vertically movable first transport robot (transport mechanism) 4-209 is arranged. In the second transport chamber 4-193, a vertically movable second transport robot 4-210 is arranged. In the third transport chamber 4-195, a vertically movable third transport robot (transport mechanism) 4-213 is arranged. The first transport robot 4-209, the second transport robot 4-210, and the third transport robot 4-213 are freely movably supported respectively by support shafts 4-211, 4-212 and 4-214 extending in the longitudinal direction. The first transport robot 4-209, the second transport robot 4-210 and the third transport robot 4-213 have a drive mechanism such as a motor inside, and are freely vertically movable along the support shafts 4-211, 4-212 and 4-214. The first transport robot 4-209 has hands in two upper and lower stages similarly to the transport robot 4-22. The first transport robot 4-209 is arranged at such a position that the hand on the lower side can access the above-described temporary base 4-180 as illustrated by a dotted line in FIG. 33(a). When the hand on the lower side of the first transport robot 4-209 accesses the temporary base 4-180, the shutter (not shown in the figure) provided on the partition 4-1b is opened.

The first transport robot 4-209 is operated so as to transport the wafer W among the temporary base 4-180, the upper side roll cleaning module 4-201A, the lower side roll cleaning module 4-201B, the temporary base 4-204, the temporary base 4-203, the upper side pen cleaning module 4-202A, and the lower side pen cleaning module 4-202B. The first transport robot 4-209 uses the hand on the lower side when transporting the wafer before cleaning (the wafer to which slurry is stuck), and uses the hand on the upper side when transporting the wafer after cleaning.

The second transport robot 4-210 is operated so as to transport the wafer W among the upper side pen cleaning module 4-202A, the lower side pen cleaning module 4-202B, the temporary base 4-203, the upper side drying module 4-205A, and the lower side drying module 4-205B. The second transport robot 4-210 is provided with only one hand since it transports only the cleaned wafer. The transport robot 4-22 illustrated in FIG. 31 takes out the wafer from the upper side drying module 4-205A or the lower side drying module 4-205B using the hand on the upper side, and returns the wafer to the wafer cassette. When the upper side hand of the transport robot 4-22 accesses the drying modules 4-205A and 4-205B, the shutter (not shown in the figure) provided on the partition 4-1a is opened.

The buffing chamber 4-300 includes an upper side buffing module 4-300A, and a lower side buffing module 4-300B.

The third transport robot 4-213 is operated so as to transport the wafer W among the upper side roll cleaning module 4-201A, the lower side roll cleaning module 4-201B, the temporary base 4-204, the upper side buffing module 4-300A, and the lower side buffing module 4-300B. The third transport robot 4-213 has hands in two upper and lower stages.

In the present embodiment, an example that the buffing chamber 4-300, the roll cleaning chamber 4-190, and the pen cleaning chamber 4-192 are arranged in order from a side far from the loading/unloading unit 4-2 inside the cleaning unit 4-4 is illustrated, however, it is not limited thereto. An arranging form of the buffing chamber 4-300, the roll cleaning chamber 4-190, and the pen cleaning chamber 4-192 can be appropriately selected according to quality of the wafer and throughput or the like. Also, in the present embodiment, an example of including the upper side buffing module 4-300A and the lower side buffing module 4-300B is illustrated, however, without being limited thereto, only one of the buffing modules may be provided. Also, in the present embodiment, other than the buffing chamber 4-300, the roll cleaning module and the pen cleaning module are described as examples of a module that cleans the wafer W, however, without being limited thereto, 2-fluid jet cleaning (2FJ cleaning) or megasonic cleaning can be also performed. The 2-fluid jet cleaning is jetting fine droplets (mist) put on high-speed gas from a 2-fluid nozzle toward the wafer W, making them collide, and removing (cleaning) particles or the like on the surface of the wafer W utilizing a shock wave generated by collisions of the fine droplets with the surface of the wafer W. The megasonic cleaning is adding ultrasonic waves to the cleaning liquid, making acting force by vibrational acceleration of cleaning liquid molecules act on adhesive particles such as particles, and removing them. Hereinafter, the upper side buffing module 4-300A and the lower side buffing module 4-300B will be described. Since the upper side buffing module 4-300A and the lower side buffing module 4-300B are of the similar configuration, hereinafter, only the upper side buffing module 4-300A will be described.

<Buffing Module>

Figure 34:
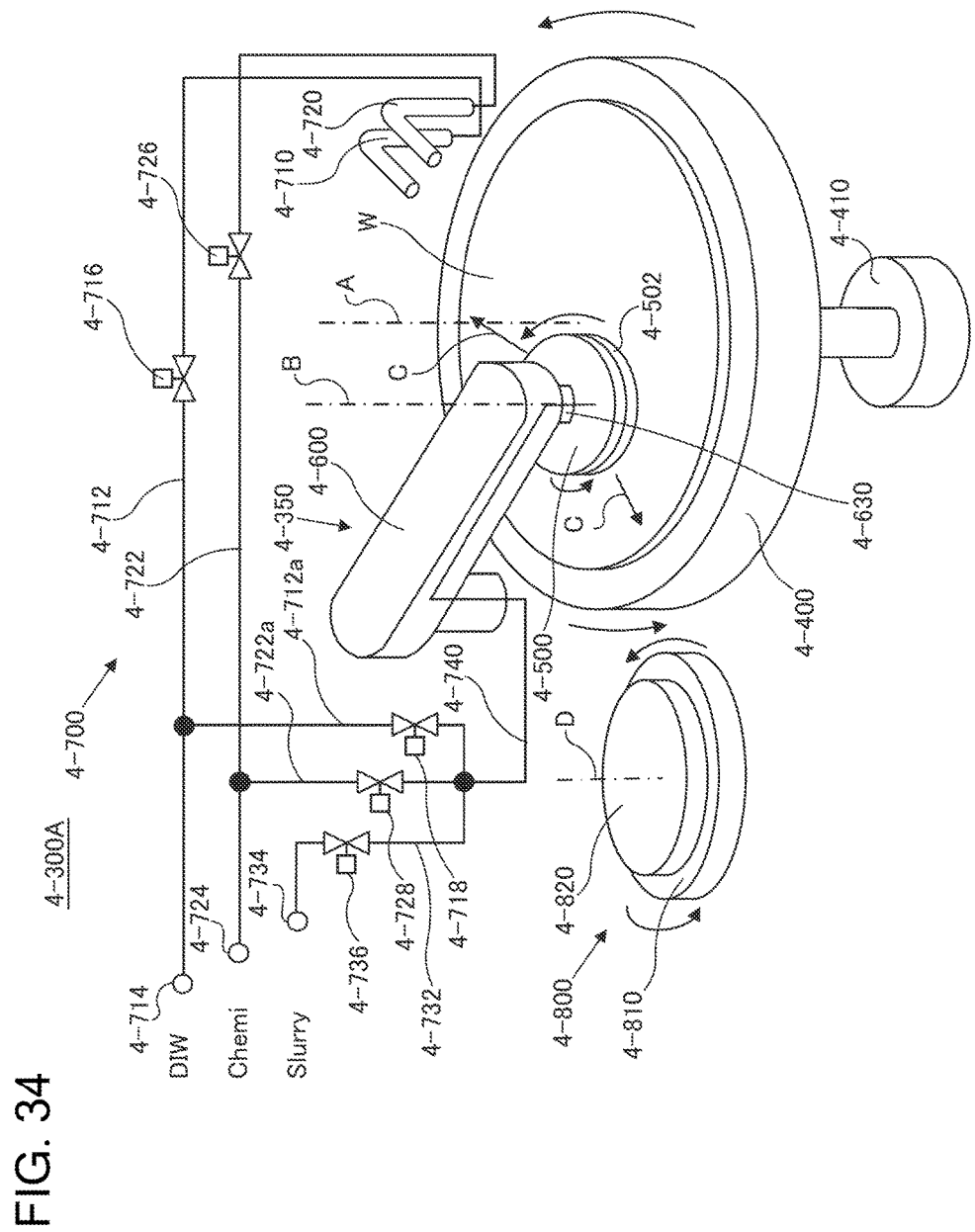
FIG. 34 is a diagram illustrating a schematic configuration of the upper side buffing module.

FIG. 34 is a diagram illustrating a schematic configuration of the upper side buffing module. As illustrated in FIG. 34, the upper side buffing module 4-300A includes a buff table 4-400 where the wafer W is installed, a buff head 4-500 to which a buff pad 4-502 for performing buffing to a processing surface of the wafer W is attached, a buff arm 4-600 that holds the buff head 4-500 through a connection part 4-630 connected to the surface to which the buff pad 4-502 is not attached of the buff head 4-500, a liquid supply system 4-700 for supplying a buffing liquid, and a conditioning unit 4-800 for performing conditioning (setting) of the buff pad 4-502. Also, the buffing module 4-300A comprises a chamfering structure for chamfering the peripheral edge part of the contact surface in contact with the wafer W of the buff pad 4-502 and details of the chamfering structure will be described later. As illustrated in FIG. 34, the buff pad (third cleaner) 4-502 is smaller in diameter than the wafer W. For example, in the case that the wafer W is Φ 300 mm, it is desirable that the buff pad 4-502 is preferably Φ 100 mm or smaller, and more preferably Φ 60 to 100 mm. As for this, since an area ratio with the wafer becomes smaller as the diameter of the buff pad is larger, the buffing speed of the wafer increases. On the other hand, for in-plane uniformity of a wafer processing speed, the in-plane uniformity improves as the diameter of the buff pad becomes smaller on the contrary. This is because that unit processing area becomes small, and it is advantageous in a system of processing the entire surface of the wafer by making the buff pad 4-502 perform relative movement like swinging within the surface of the wafer W by the buff arm 4-600 as illustrated in FIG. 34.

The buffing liquid includes at least one of DIW (pure water), a cleaning chemical, and the polishing liquid such as the slurry. There are mainly two kinds of the buffing system, one is a system of removing contaminants such as the slurry and the residual of the polishing products left on the wafer which is the processing object when being in contact with the buff pad, and the other one is a system of removing a fixed amount of the processing object to which the contaminants are stuck by polishing or the like. It is preferable that the buffing liquid is the cleaning chemical or the DIW in the former, and is the polishing liquid in the latter. However, in the latter, it is desirable that the a removal amount in the processing is less than 10 nm for example, and preferably 5 nm or less for maintaining the state (flatness and a residual film amount) of a processed surface after CMP. In this case, a removal speed as high as that for normal CMP is sometimes not needed. In such a case, the processing speed may be adjusted by appropriately performing processing of dilution or the like to the polishing liquid. Also, the buff pad 4-502 is formed by, for example, a foamed polyurethane based hard pad, a suede-based soft pad, or a sponge or the like.

The kind of the buff pad may be appropriately selected for the material of the processing object and the state of the contaminants to be removed. For example, in the case that the contaminant is buried in the processing object surface, a hard pad that makes physical force act on the contaminant more easily, that is the pad with high hardness and rigidity, may be used as the buff pad. On the other hand, in the case that the processing object is a material with low mechanical strength such as a Low-k film for example, a soft pad may be used in order to reduce damages of the processed surface. Also, in the case that the buffing liquid is the polishing liquid like the slurry, since the removing speed of the processing object, removal efficiency of the contaminant, and presence/absence of damage generation are not determined just by the hardness or rigidity of the buff pad, a selection may be appropriately made. Also, on the surface of these buff pads, a groove shape such as concentric circular grooves, XY grooves, spiral grooves or radial grooves for example may be executed. Further, at least one hole passing through the buff pad may be provided inside the buff pad to supply the buffing liquid through the hole. Also, for the buff pad, a sponge-like material that the buffing liquid can permeate, like a PVA sponge for example, may be used. By these, a flow distribution of the buffing liquid inside the buff pad surface is uniformized, and the contaminants removed by the buffing are promptly discharged.

The buff table 4-400 has a mechanism of sucking the wafer W. Also, the buff table 4-400 can be rotated around a rotary axis A by a drive mechanism not shown in the figure. Also, the buff table 4-400 may make the wafer W perform angle rotary movement (circular arc movement at an angle smaller than 360°) or scroll movement (also called orbital movement or circular trajectory movement) by the drive mechanism not shown in the figure. The buff pad 4-502 is attached to the surface facing the wafer W of the buff head 4-500. The buff head 4-500 can be rotated around a rotary axis B by the drive mechanism not shown in the figure. Also, the buff head 4-500 can pressurize the buff pad 4-502 to the processing surface of the wafer W by the drive mechanism not shown in the figure. The buff arm 4-600 can move the buff head 4-500 within a range of a radius or a diameter of the wafer W as illustrated by an arrow C. Also, the buff arm 4-600 can swing the buff head 4-500 to a position at which the buff pad 4-502 faces the conditioning unit 4-800.

The conditioning unit 4-800 is a member for conditioning the surface of the buff pad 4-502. The conditioning unit 4-800 includes a dress table 4-810, and a dresser 4-820 installed to the dress table 4-810. The dress table 4-810 can be rotated around a rotary axis D by a drive mechanism not shown in the figure. Also, the dress table 4-810 may make the dresser 4-820 perform the scroll movement by the drive mechanism not shown in the figure. The dresser 4-820 is formed of a diamond dresser for which particles of diamond are electrodeposited and fixed to the surface or diamond abrasive is arranged on the entire surface or part of a contact surface with the buff pad, a brush dresser for which brush bristles made of a resin are arranged on the entire surface or part of the contact surface with the buff pad, or the combination thereof.

The upper side buffing module 4-300A turns the buff arm 4-600 until the buff pad 4-502 is at a position facing the dresser 4-820 when conditioning the buff pad 4-502. The upper side buffing module 4-300A conditions the buff pad 4-502 by rotating the dress table 4-810 around the rotary axis D, also rotating the buff head 4-500, and pressing the buff pad 4-502 to the dresser 4-820. For a conditioning condition, it is preferable to turn conditioning loads to 80 N or less, and it is more preferable that they are 40 N or less from a viewpoint of a service life of the buff pad 4-502. Also, for a rotation number of the buff pad 4-502 and the dresser 4-820, use at or under 500 rpm is desirable. Also, during the conditioning, the fluid is supplied between the buff pad 4-502 and the dresser 4-820. Here, examples of the fluid are the DIW or the chemical such as the cleaning liquid used in wafer cleaning. Thus, pad residual generated in the conditioning of the buff pad 4-502 and products stuck to the surface of the buff pad 4-502 in the buffing can be promptly discharged to the outside of the system. Further, by executing rinsing with the DIW or the chemical to the surface of the conditioned buff pad 4-502 further, cleanness of the surface of the buff pad 4-502 is maintained. The present embodiment illustrates an example that the processing surface of the wafer W and a dressing surface of the dresser 4-820 are installed along the horizontal direction, however, it is not limited thereto. For example, for the upper side buffing module 4-300A, the buff table 4-400 and the dress table 4-810 can be arranged so that the processing surface of the wafer W and the dressing surface of the dresser 4-820 are installed along the vertical direction. In this case, the buff arm 4-600 and the buff head 4-500 are arranged so as to perform the buffing by bringing the buff pad 4-502 into contact with the processing surface of the wafer W arranged in the vertical direction and to perform conditioning by bringing the buff pad 4-502 into contact with the dressing surface of the dresser 4-820 arranged in the vertical direction. Also, either one of the buff table 4-400 and the dress table 4-810 may be arranged in the vertical direction, and all or part of the buff arm 4-600 may be rotated so that the buff pad 4-502 arranged at the buff arm 4-600 becomes vertical to each table surface.

The liquid supply system 4-700 includes a pure water nozzle 4-710 for supplying pure water (DIW) to the processing surface of the wafer W. The pure water nozzle 4-710 is connected through pure water piping 4-712 to a pure water supply source 4-714. The pure water piping 4-712 is provided with an on-off valve 4-716 capable of opening and closing the pure water piping 4-712. The controller 4-5 can supply the pure water to the processing surface of the wafer W at arbitrary timing by controlling opening and closing of the on-off valve 4-716.

Also, the liquid supply system 4-700 includes a chemical nozzle 4-720 for supplying chemical (Chemi) to the processing surface of the wafer W. The chemical nozzle 4-720 is connected through chemical piping 4-722 to a chemical supply source 4-724. The chemical piping 4-722 is provided with an on-off valve 4-726 capable of opening and closing the chemical piping 4-722. The controller 4-5 can supply the chemical to the processing surface of the wafer W at arbitrary timing by controlling opening and closing of the on-off valve 4-726.

The upper side buffing module 4-300A can selectively supply the pure water, the chemical or the polishing liquid such as the slurry to the processing surface of the wafer W through the buff arm 4-600, the connection part 4-630, the buff head 4-500, and the buff pad 4-502. The buff pad 4-502 is provided with at least one through-hole, and the buffing liquid can be supplied through this hole.

That is, branch pure water piping 4-712a is branched from between the pure water supply source 4-714 and the on-off valve 4-716 in the pure water piping 4-712. Also, branch chemical piping 4-722a is branched from between the chemical supply source 4-724 and the on-off valve 4-726 in the chemical piping 4-722. The branch pure water piping 4-712a, the branch chemical piping 4-722a and polishing liquid piping 4-732 connected to a polishing liquid supply source 4-734 are merged to liquid supply piping 4-740. The branch pure water piping 4-712a is provided with an on-off valve 4-718 capable of opening and closing the branch pure water piping 4-712a. The branch chemical piping 4-722a is provided with an on-off valve 4-728 capable of opening and closing the branch chemical piping 4-722a. The polishing liquid piping 4-732 is provided with an on-off valve 4-736 capable of opening and closing the polishing liquid piping 4-732.

A first end of the liquid supply piping 4-740 is connected to three systems of the piping which are the branch pure water piping 4-712a, the branch chemical piping 4-722a and the polishing liquid piping 4-732. The liquid supply piping 4-740 stretches through the inside of the buff arm 4-600, the inside of the connection part 4-630, the center of the buff head 4-500, and the center of the buff pad 4-502. A second end of the liquid supply piping 4-740 is opened toward the processing surface of the wafer W. The controller 4-5 can supply one of the pure water, the chemical and the polishing liquid such as the slurry or a liquid mixture of an arbitrary combination thereof to the processing surface of the wafer W at arbitrary timing by controlling opening/closing of the on-off valve 4-718, the on-off valve 4-728, and the on-off valve 4-736.

The upper side buffing module 4-300A can perform the buffing to the wafer W by supplying the process liquid to the wafer W through the liquid supply piping 4-740, rotating the buff table 4-400 around the rotary axis A, pressurizing the buff pad 4-502 to the processing surface of the wafer W, and swinging the buff head 4-500 in a direction of the arrow C while rotating it around the rotary axis B. For a condition in the buffing, even though the processing is basically defect removal by a mechanical action, reduction of damages to the wafer W is taken into consideration on the other hand, and it is desirable that a pressure is 3 psi or lower, preferably 2 psi or lower. Also, it is desirable that the rotation number of the wafer W and the buff head 4-500 is 1000 rpm or lower in consideration of an in-plane distribution of the buffing liquid. Also, a moving speed of the buff head 4-500 is 300 mm/sec or lower. However, since the distribution of the optimum moving speed is different depending on the rotation number of the wafer W and the buff head 4-500 and a moving distance of the buff head 4-500, it is desirable that the moving speed of the buff head 4-500 is variable within the surface of the wafer W. As a system of changing the moving speed in this case, for example, a system capable of dividing the swing distance within the surface of the wafer W into a plurality of sections and setting the moving speed for each section is desirable. Also, as a buffing liquid flow rate, a large flow rate is desirable in order to keep the sufficient intra-wafer-surface distribution of the process liquid even when the wafer W and the buff head 4-500 are rotated at a high speed. However, on the other hand, since process liquid flow rate increase invites increase of a process cost, it is desirable that the flow rate is 1000 ml/min or lower, preferably 500 ml/min or lower.

Here, the buffing includes at least one of buff polishing and buff cleaning.

The buff polishing is processing of polishing and removing the processing surface of the wafer W by relatively moving the wafer W and the buff pad 4-502 while bringing the buff pad 4-502 into contact with the wafer W and interposing the polishing liquid such as the slurry between the wafer W and the buff pad 4-502. The buff polishing is the processing capable of adding, to the wafer W, physical acting force stronger than physical acting force added to the wafer W by the roll sponge in the roll cleaning chamber 4-190 and physical acting force added to the wafer W by the pen sponge in the pen cleaning chamber 4-192. By the buff polishing, removal of a surface layer part where contaminants are stuck, additional removal of a part not removed in the main polishing in the polishing unit 4-3, or improvement of morphology after the main polishing can be achieved.

The buff cleaning is processing of removing contaminants on the surface of the wafer W and reforming the processing surface by relatively moving the wafer W and the buff pad 4-502 while bringing the buff pad 4-502 into contact with the wafer W and interposing a cleaning process liquid (the chemical, or, the chemical and the pure water) between the wafer W and the buff pad 4-502. The buff cleaning is the processing capable of adding, to the wafer W, the physical acting force stronger than the physical acting force added to the wafer W by the roll sponge in the roll cleaning chamber 4-190 and the physical acting force added to the wafer W by the pen sponge in the pen cleaning chamber 4-192. By the buff cleaning, adhesive particles and contaminants buried in the substrate surface which cannot be removed with a soft material such as a PVA sponge can be removed.

Figure 35:
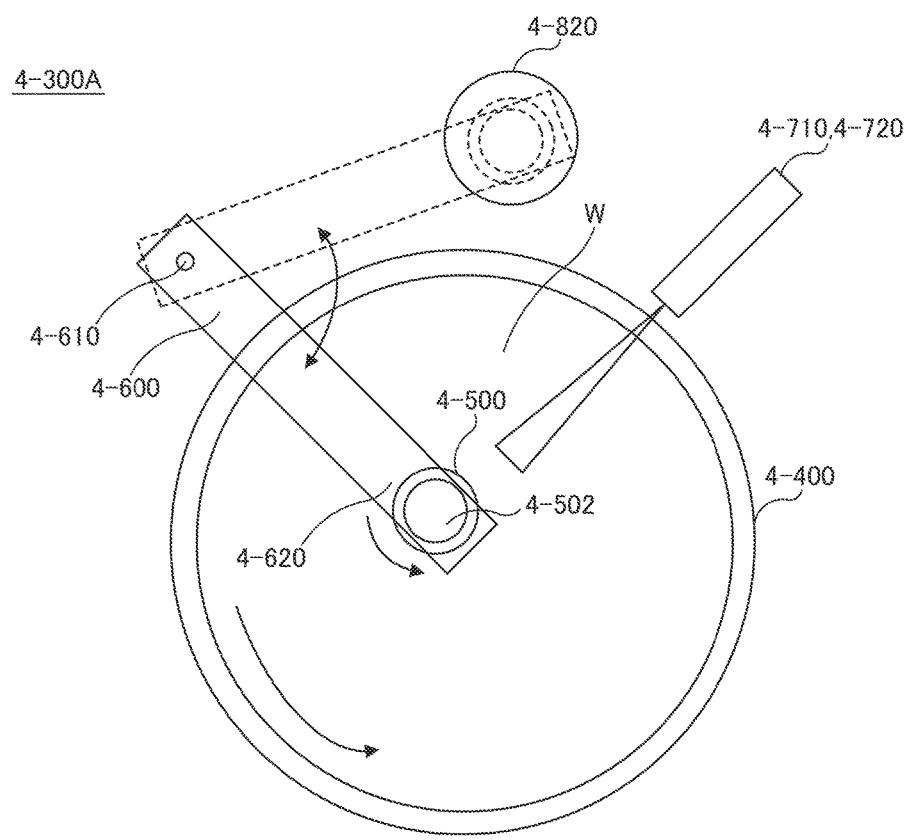
FIG. 35 is a diagram illustrating a schematic configuration of the buffing module in the present embodiment.

FIG. 35 is a diagram illustrating a schematic configuration of the buffing module of the present embodiment. The following description will be given with the buffing module (upper side buffing module) 4-300A as an example, however it is not limited thereto.

As illustrated in FIG. 35, the buffing module 4-300A of the present embodiment includes the buff arm 4-600. The buff arm 4-600 is an arm that extends along an installation surface of the wafer W of the buff table 4-400, and is turnable along the installation surface of the wafer W of the buff table 4-400 with a shaft 4-610 outside the buff table 4-400 as a fulcrum.

The buffing module 4-300A includes the buff head 4-500 to which the buff pad 4-502 smaller in diameter than the wafer W is attached. The buff head 4-500 is held at an end 4-620 on the opposite side of the shaft 4-610, of the buff arm 4-600.

The buff arm 4-600 is capable of horizontal movement along the processing surface of the wafer W. For example, when performing the buffing, the buff arm 4-600 can swing between the center and the peripheral edge part of the wafer W in the state of bringing the buff pad 4-502 into contact with the wafer W.

Also, as illustrated in FIG. 35, the buff arm 4-600 is capable of the horizontal movement between the dresser 4-820 and the wafer W in order to condition the buff pad 4-502.

As kinds of the horizontal movement, there are linear movement and circular arc movement. Also, examples of a movement direction are unidirectional movement from the center side to the peripheral edge part of the wafer W or in the opposite direction thereof, and reciprocating movement within a range of a wafer radius or diameter with the center side or the peripheral edge part of the wafer W as a starting point. Also, during the horizontal movement, the movement speed of each buff arm may be changeable within a movement range. This is because that the distribution of staying time of the buff pad affects the distribution of the processing speed of the wafer W. As a system of changing the moving speed in this case, a system capable of dividing a swing distance within the surface of the wafer W into a plurality of sections and setting the movement speed according for each section is desirable.

<Buff Pad of the Present Embodiment>

Figure 36:
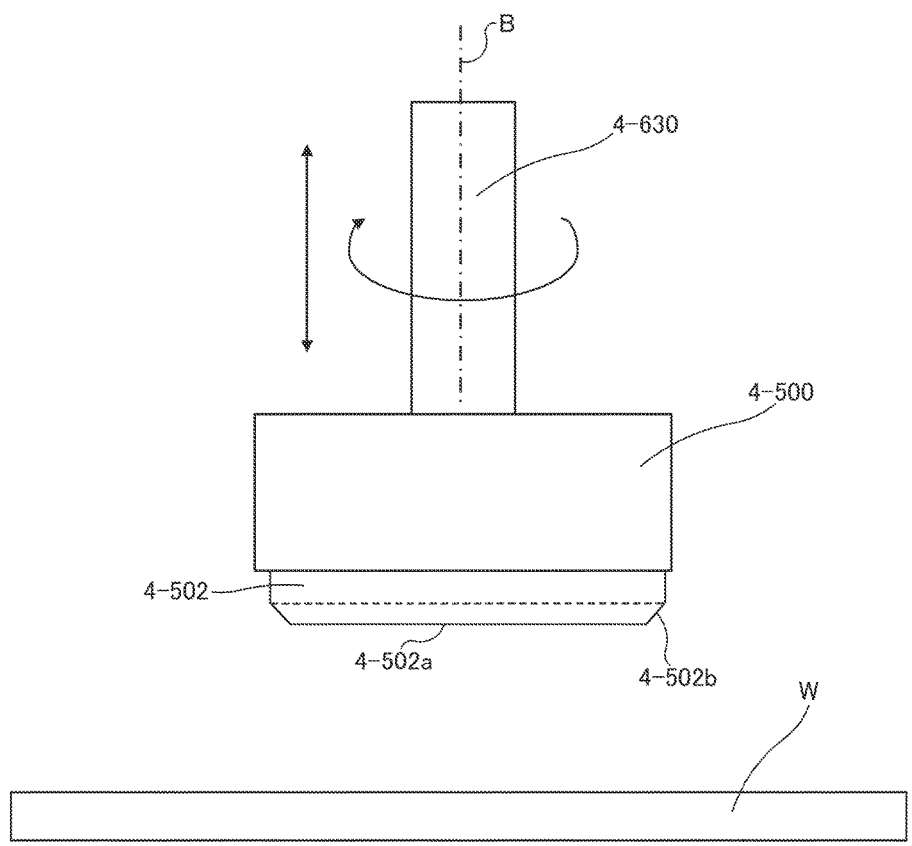
FIG. 36 is a diagram schematically illustrating the buff pad in the present embodiment.

Next, the buff pad 4-502 of the present embodiment will be described in detail. FIG. 36 is a diagram schematically illustrating the buff pad of the present embodiment.

As illustrated in FIG. 36, to the buff head 4-500, the buff pad 4-502 which is smaller in diameter than the wafer W, and for which a peripheral edge part 4-502*b* (corner part) of a contact surface 4-502*a* in contact with the wafer W is chamfered is attached. In other words, the buff pad 4-502 of the present embodiment is smaller in diameter than the wafer W, and the peripheral edge part 4-502*b* (corner part) of the contact surface 4-502*a* in contact with the wafer W is chamfered.

Since the peripheral edge part 4-502*b* of the buff pad 4-502 is chamfered as in the present embodiment, pressure concentration at the peripheral edge part is suppressed when the wafer W and the buff pad 4-502 are brought into contact, therefore the pressure distribution inside the buff pad 4-502 is uniformized and thus the uniformity of the buffing speed within the surface of the wafer W is improved. That is, when the buff pad whose peripheral edge part is not chamfered is brought into contact with the wafer W and relatively moved, at the peripheral edge part of the contact surface of the buff pad, a high pressure compared to the other parts is generated. In other words, the pressure concentration is generated at the peripheral edge part of the contact surface of the buff pad. As a result, since the wafer W is buffed (for example, buff polished) excessively at the part in contact with the peripheral edge part of the contact surface of the buff pad compared to the other parts, there is a risk that the uniformity of the buffing is damaged.

On the contrary, according to the present embodiment, since the peripheral edge part 4-502*b* (corner part) of the buff pad 4-502 is chamfered, even when the buff pad is brought into contact with the wafer W and relatively moved, the pressure concentration is not easily generated at the peripheral edge part 4-502*b*. As a result, in contact of the wafer W and the buff pad 4-502, the pressure concentration at the peripheral edge part is suppressed, and deterioration of the uniformity within the surface of the wafer W of the buffing speed due to the pressure concentration can be suppressed.

The peripheral edge part 4-502b is chamfered by machining the peripheral edge part 4-502b into a C surface, an R surface, or a tapered surface, or the like. Hereinafter, a form of chamfering of the peripheral edge part 4-502b will be described.

<First Embodiment>

Figure 37A:
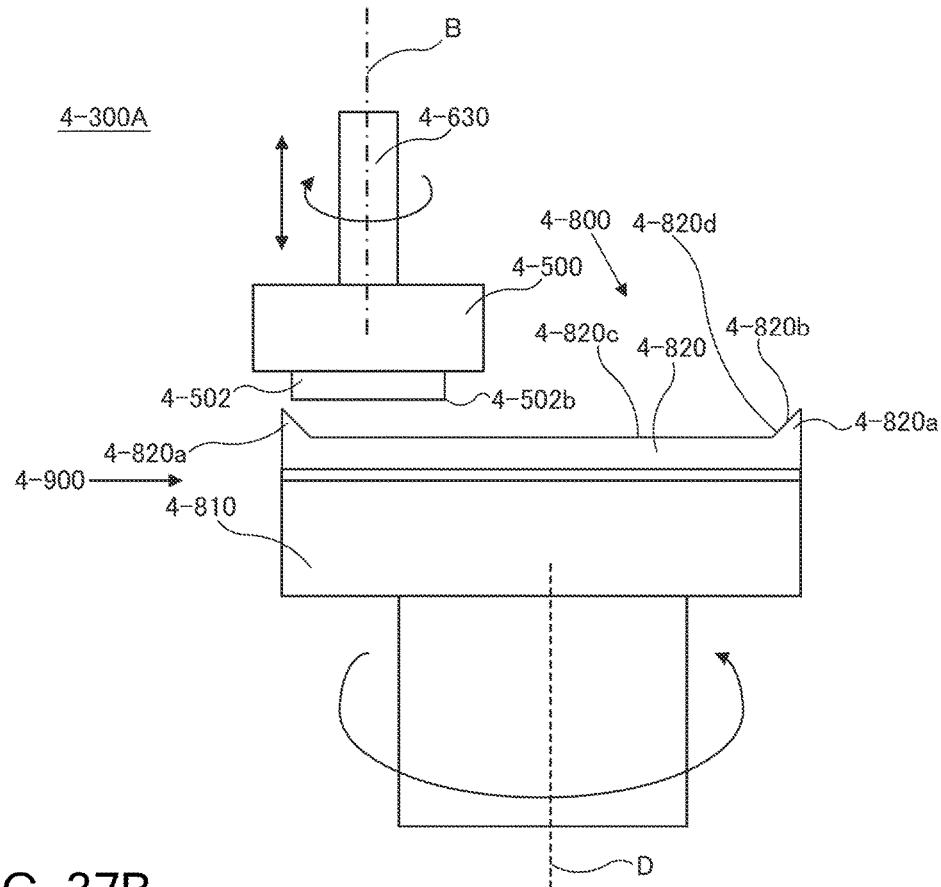
FIGS. 37A and 37B are diagrams schematically illustrating a first embodiment of the buffing module.
Figure 37B:
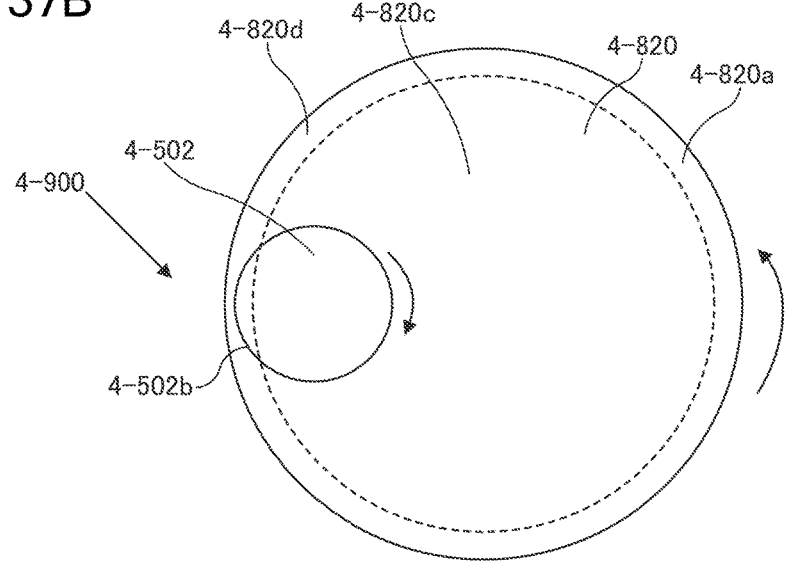

Next, the processing module of the first embodiment will be described. FIG. 37 is a diagram schematically illustrating the first embodiment of the buffing module. FIG. 37A is a diagram schematically illustrating the first embodiment of the buffing module from a side face, and FIG. 37B is a diagram schematically illustrating the first embodiment of the buffing module from an upper surface. The buffing module 4-300A of the first embodiment is the embodiment for which the buffing module 4-300A illustrated in FIG. 34 is provided with a chamfering structure 4-900 for chamfering the peripheral edge part 4-502b of the contact surface 4-502a of the buff pad 4-502.

As illustrated in FIG. 37, the buffing module (upper side buffing module) 4-300A is provided with the chamfering structure 4-900 for chamfering the peripheral edge part 4-502b of the contact surface 4-502a of the buff pad 4-502. The chamfering structure 4-900 includes the conditioning unit 4-800 having the dresser 4-820, and the dress table 4-810 for holding the dresser 4-820. The dresser 4-820 is for conditioning the buff pad 4-502 by being brought into contact with the buff pad 4-502 and relatively moved. The chamfering structure 4-900 chamfers the peripheral edge part 4-502b of the contact surface 4-502a while conditioning the contact surface of the buff pad 4-502 by the conditioning unit 4-800. Also, the chamfering structure 4-900 chamfers the peripheral edge part 4-502b of the contact surface 4-502a by conditioning the peripheral edge part 4-502b of the contact surface 4-502a more strongly than the parts other than the peripheral edge part, while conditioning the contact surface 4-502a of the buff pad 4-502 by the conditioning unit 4-800.

Specifically, the chamfering structure 4-900 has a projection 4-820a formed at a part where the peripheral edge part 4-502b of the buff pad 4-502 is in contact, of a contact surface 4-820c in contact with the buff pad 4-502 of the dresser 4-820. In other words, at the dresser 4-820, the projection 4-820a is formed at the part where the peripheral edge part 4-502b of the buff pad 4-502 is in contact. Specifically, the projection 4-820a is formed in a ring shape at a peripheral edge part 4-820d of the contact surface 4-820c in contact with the buff pad 4-502 of the dresser 4-820. Also, the projection 4-820a has a slope 4-820b obliquely rising from the contact surface 4-820c toward a radial direction outer side. The slope 4-820b is inclined to the rotary axis D of the dress table 4-810.

When conditioning (setting) the buff pad 4-502, the dress table 4-810 is rotated around the rotary axis D. On the other hand, when conditioning (setting) the buff pad 4-502, the buff arm 4-600 moves the buff head 4-500 in a direction of approaching the dresser 4-820 while rotating the buff head 4-500 (the connection part 4-630) around the rotary axis B. Thus, the peripheral edge part 4-502b of the buff pad 4-502 is brought into contact with the projection 4-820a (the slope 4-820b) of the dresser 4-820. Therefore, at the peripheral edge part 4-502b of the buff pad 4-502, a surface in a shape corresponding to the slope 4-820b of the projection 4-820a is formed. As a result, the peripheral edge part 4-502b of the buff pad 4-502 is chamfered as illustrated in FIG. 36.

Therefore, according to the present embodiment, even when the buff pad 4-502 is brought into contact with the wafer W and relatively moved, the pressure concentration at the peripheral edge part 4-502b is suppressed. As a result, in contact of the wafer W and the buff pad 4-502, the pressure concentration at the peripheral edge part is suppressed, and deterioration of the uniformity within the surface of the wafer W of the buffing speed due to the pressure concentration can be suppressed. Also, in the present embodiment, it is the system of performing chamfering by enhancing the conditioning of an edge part in particular while conditioning the entire surface of the buff pad 4-502, and it is the system that the dresser 4-820 itself performs the rotary movement. Thus, since the relative moving speed within the surface of the buff pad 4-502 can be uniformized during the conditioning, the uniformity of the conditioning within the surface of the buff pad 4-502 can be maintained, and the edge part of the buff pad 4-502 can be simultaneously chamfered. Further, in the present embodiment, as described above, since the supply of the DIW and the chemical is executed in the conditioning of the buff pad 4-502 and the rinsing is also performed after the conditioning, the cleanness of the surface of the buff pad 4-502 can be maintained.

In FIG. 37, an example of forming the ring-like projection 4-820a at the peripheral edge part 4-820d of the contact surface 4-820c of the dresser 4-820 is illustrated. However, without being limited thereto, the projection 4-820a may be just formed at a part where the peripheral edge part 4-502b of the buff pad 4-502 is to be in contact when conditioning (setting) the buff pad 4-502.

<Second Embodiment>

Figure 38A:
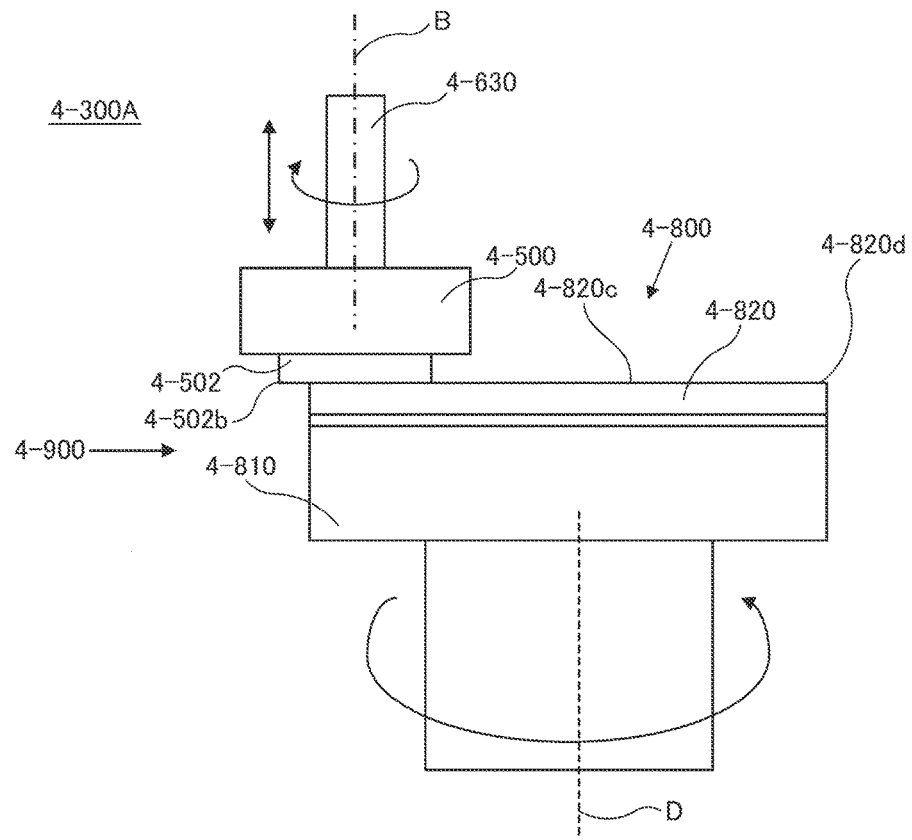
FIGS. 38A and 38B are diagrams schematically illustrating a second embodiment of the buffing module.
Figure 38B:
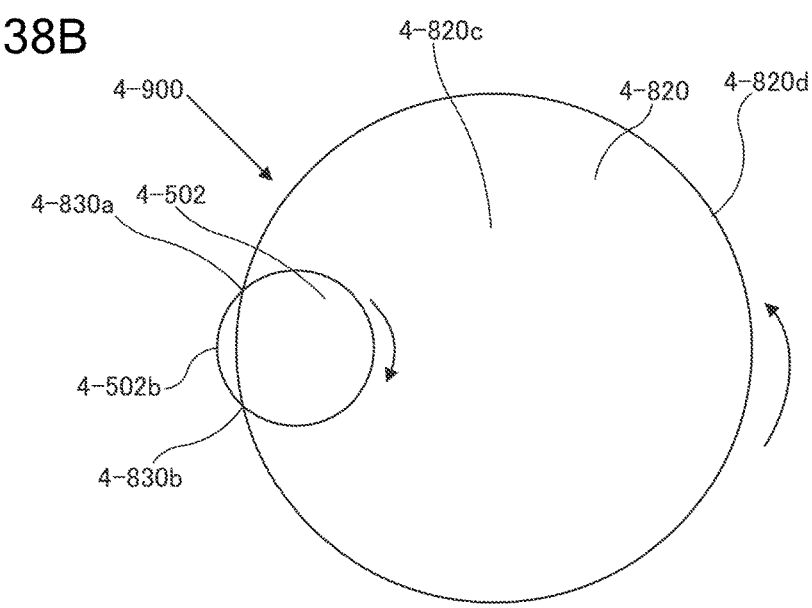

Next, the processing module of the second embodiment will be described. FIG. 38 is a diagram schematically illustrating the second embodiment of the buffing module. FIG. 38A is a diagram schematically illustrating the second embodiment of the buffing module from a side face, and FIG. 38B is a diagram schematically illustrating the second embodiment of the buffing module from an upper surface. The buffing module 4-300A of the second embodiment is the embodiment for which the buffing module 4-300A illustrated in FIG. 34 is provided with a chamfering structure 4-900 for chamfering the peripheral edge part 4-502b of the contact surface 4-502a of the buff pad 4-502.

As illustrated in FIG. 38, the buffing module (upper side buffing module) 4-300A includes the chamfering structure 4-900 for chamfering the peripheral edge part 4-502b of the contact surface 4-502a of the buff pad 4-502. The chamfering structure 4-900 includes, similarly to the first embodiment, the conditioning unit 4-800 having the dresser 4-820, and the dress table 4-810 for holding the dresser 4-820. Also, similarly to the first embodiment, the chamfering structure 4-900 chamfers the peripheral edge part 4-502b of the contact surface 4-502a while conditioning the contact surface of the buff pad 4-502 by the conditioning unit 4-800. Also, the chamfering structure 4-900 chamfers the peripheral edge part 4-502b of the contact surface 4-502a by conditioning the peripheral edge part 4-502b of the contact surface 4-502a more strongly than the parts other than the peripheral edge part, while conditioning the contact surface 4-502a of the buff pad 4-502 by the conditioning unit 4-800.

Here, the dresser 4-820 can be arranged such that, when conditioning the buff pad 4-502, the peripheral edge part 4-502b of the buff pad 4-502 and the peripheral edge part 4-820d of the contact surface 4-820c in contact with the buff pad 4-502 of the dresser 4-820 cross and are brought into contact. In other words, the dresser 4-820 is arranged such that a part of the buff pad 4-502 is projected (overhung) from the dresser 4-820.

According to the present embodiment, the peripheral edge part 4-502*b* of the buff pad 4-502 is chamfered as illustrated in FIG. 36. That is, similarly to that the pressure concentration is generated at the peripheral edge part of the buff pad when the buff pad whose peripheral edge part is not chamfered is brought into contact with the wafer W and relatively moved, also in the case of bringing the buff pad 4-502 and the dresser 4-820 into contact and relatively moving them, the pressure concentration is generated at the peripheral edge part of both. According to the present embodiment, as illustrated in FIG. 38B, the peripheral edge part 4-502*b* of the buff pad 4-502 and the peripheral edge part 4-820*d* of the dresser 4-820 are brought into contact at two contact points 4-830*a* and 4-830*b*. Therefore, for the buff pad 4-502, the pressure concentration is especially great at the two contact points 4-830*a* and 4-830*b*, and a conditioning (setting) amount at the dresser 4-820 increases. As a result, the peripheral edge part 4-502*b* of the buff pad 4-502 is chamfered as illustrated in FIG. 36.

Therefore, according to the present embodiment, even when the buff pad 4-502 is brought into contact with the wafer W and relatively moved, since the peripheral edge part 4-502*b* is chamfered, the pressure concentration is not easily generated. As a result, deterioration of the uniformity within the surface of the wafer W of the buffing speed due to the contact pressure concentration of the wafer W and the buff pad 4-502 can be suppressed. Also, in the present embodiment, it is the system of performing chamfering by enhancing the conditioning of an edge part in particular while conditioning the entire surface of the buff pad 4-502, and it is the system that the dresser 4-820 itself performs the rotary movement. Thus, since the relative moving speed within the surface of the buff pad 4-502 can be uniformized during the conditioning, the uniformity of the conditioning within the surface of the buff pad 4-502 can be maintained, and the edge part of the buff pad 4-502 can be simultaneously chamfered. Further, in the present embodiment, as described above, since the supply of the DIW and the chemical is executed in the conditioning of the buff pad 4-502 and the rinsing is also performed after the conditioning, the cleanness of the surface of the buff pad 4-502 can be maintained.

In FIG. 38, an example that the peripheral edge part 4-502*b* of the buff pad 4-502 and the peripheral edge part 4-820*d* of the dresser 4-820 are brought into contact at two contact points 4-830*a* and 4-830*b* is illustrated. However, without being limited thereto, for example by moving the rotary axis B of the buff head 4-500 in a direction of the rotary axis D of the dress table 4-810, the peripheral edge part 4-502*b* of the buff pad 4-502 and the peripheral edge part 4-820*d* of the dresser 4-820 may be brought into contact at one contact point.

<Third Embodiment>

Figure 39A:
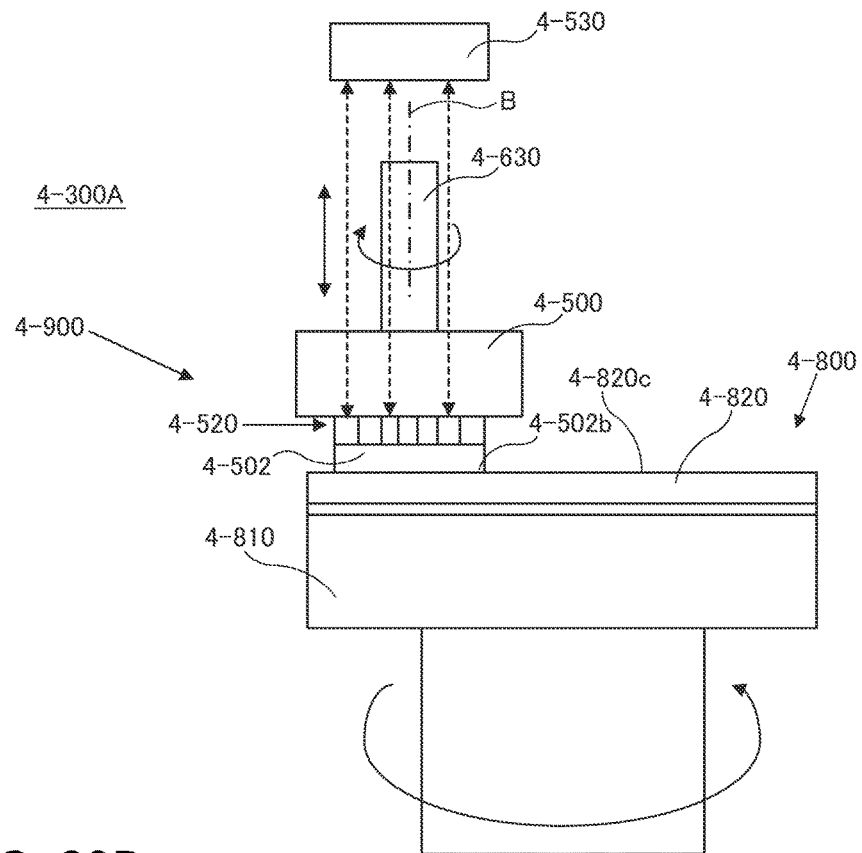
FIGS. 39A and 39B are diagrams schematically illustrating a third embodiment of the buffing module.
Figure 39B:
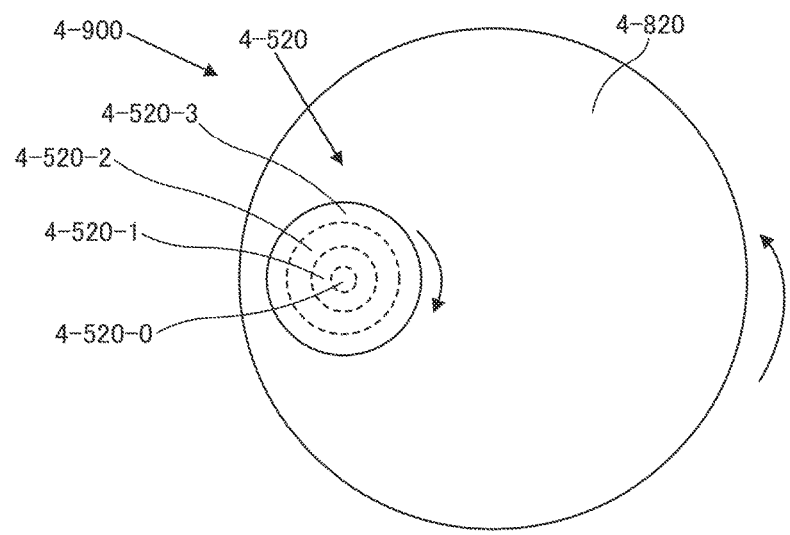

Next, the processing module of the third embodiment will be described. FIG. 39 is a diagram schematically illustrating the third embodiment of the buffing module. FIG. 39A is a diagram schematically illustrating the third embodiment of the buffing module from a side face, and FIG. 39B is a diagram schematically illustrating the third embodiment of the buffing module from an upper surface. The buffing module 4-300A of the third embodiment is the embodiment for which the buffing module 4-300A illustrated in FIG. 34 is provided with a chamfering structure 4-900 for chamfering the peripheral edge part 4-502*b* of the contact surface 4-502*a* of the buff pad 4-502.

As illustrated in FIG. 38, the buffing module (upper side buffing module) 4-300A includes the chamfering structure 4-900 for chamfering the peripheral edge part 4-502*b* of the contact surface 4-502*a* of the buff pad 4-502. The chamfering structure 4-900 includes, similarly to the first embodiment, the conditioning unit 4-800 having the dresser 4-820, and the dress table 4-810 for holding the dresser 4-820. Also, similarly to the first embodiment, the chamfering structure 4-900 chamfers the peripheral edge part 4-502*b* of the contact surface 4-502*a* while conditioning the contact surface of the buff pad 4-502 by the conditioning unit 4-800. Also, the chamfering structure 4-900 chamfers the peripheral edge part 4-502*b* of the contact surface 4-502*a* by conditioning the peripheral edge part 4-502*b* of the contact surface 4-502*a* more strongly than the parts other than the peripheral edge part, while conditioning the contact surface 4-502*a* of the buff pad 4-502 by the conditioning unit 4-800.

Specifically, the chamfering structure 4-900 includes a bag body 4-520 arranged between the buff head 4-500 and the buff pad 4-502, and a pressurizing mechanism 4-530 capable of adjusting the pressure of the bag body 4-520 by supplying the fluid to the bag body 4-520.

For the bag body 4-520, for example, like an airbag, the pressure is changed according to the supply pressure of the fluid by the pressurizing mechanism 4-530. The pressurizing mechanism 4-530 is a member that is communicated with the bag body 4-520 and is capable of adjusting the distribution of contact force to the wafer W of the buff pad 4-502 by supplying the fluid (for example, the air, $N_2$ or the like) to the bag body 4-520.

As illustrated in FIG. 39, the bag body 4-520 includes a plurality of spaces 4-520-1, 4-520-2, and 4-520-3 arranged in a concentric circular shape such that the fluid is not mutually communicated. The space 4-520-0 is communicated with the liquid supply piping 4-740 here and is an opening for supplying one of the pure water, the chemical and the polishing liquid such as the slurry or the liquid mixture of the arbitrary combination thereof to the processing surface of the wafer W, however, in the case of not supplying these liquids from the side of the buff head 4-500, it may be used as the space to adjust the pressure by fluid supply, similarly to the other spaces.

The pressurizing mechanism 4-530 can independently supply the fluid to the plurality of spaces 4-520-1, 4-520-2, and 4-520-3. Specifically, the pressurizing mechanism 4-530 can adjust volumes of the plurality of spaces so that the pressure of the space 4-520-3 at the outermost periphery among the plurality of spaces 4-520-1, 4-520-2, and 4-520-3 becomes higher than the pressures of the other spaces 4-520-1 and 4-520-2. The pressurizing mechanism 4-530 can make the pressure of the space 4-520-3 at the outermost periphery be higher than the pressures of the other spaces 4-520-1 and 4-520-2 by independently controlling the supply amounts of the fluid to the plurality of spaces 4-520-1, 4-520-2, and 4-520-3, for example.

According to the present embodiment, the peripheral edge part 4-502*b* of the buff pad 4-502 is chamfered as illustrated in FIG. 36. That is, when the pressure of the space 4-520-3 at the outermost periphery becomes higher than the pressures of the other spaces 4-520-1 and 4-520-2, the conditioning (setting) amount becomes large at the peripheral edge part 4-502*b* of the buff pad 4-502 corresponding to the space 4-520-3 at the outermost periphery by the dresser 4-820 especially compared to the other parts. As a result, the peripheral edge part 4-502*b* of the buff pad 4-502 is chamfered as illustrated in FIG. 36.

Therefore, according to the present embodiment, even when the buff pad is brought into contact with the wafer W and relatively moved, since the peripheral edge part 4-502b is chamfered, the pressure concentration is not easily generated. As a result, deterioration of the uniformity within the surface of the wafer W of the buffing speed due to the contact pressure concentration of the wafer W and the buff pad 4-502 can be suppressed. Also, in the present embodiment, it is the system of performing chamfering by enhancing the conditioning of an edge part in particular while conditioning the entire surface of the buff pad 4-502, and it is the system that the dresser 4-820 itself performs the rotary movement. Thus, since the relative moving speed within the surface of the buff pad 4-502 can be uniformized during the conditioning, the uniformity of the conditioning within the surface of the buff pad 4-502 can be maintained, and the edge part of the buff pad 4-502 can be simultaneously chamfered. Further, in the present embodiment, as described above, since the supply of the DIW and the chemical is executed in the conditioning of the buff pad 4-502 and the rinsing is also performed after the conditioning, the cleanness of the surface of the buff pad 4-502 can be maintained.

In FIG. 39, an example of partitioning the bag body 4-520 into three spaces 4-520-1, 4-520-2, and 4-520-3 is illustrated, however, the number of the spaces to partition the bag body 4-520 is not limited thereto. Also, the buffing module 4-300A of the third embodiment can be executed alone, or can be executed in combination with the first embodiment or the second embodiment.

Above, together with FIG. 31-FIG. 39, the embodiment of the present invention is described on the basis of some embodiments, however, the embodiments of the invention described above are intended to facilitate understanding of the present invention, and do not limit the present invention. It is apparent that the present invention may be modified or improved without departing from the scope thereof, and the present invention includes equivalents thereof. Also, in the scope that at least part of the above-described problems can be solved or the scope that at least part of the effects is presented, various components described in the scope of claims and specifications can be arbitrarily combined, or omitted.

REFERENCE SIGNS LIST

1 . . . Housing
1a . . . Partition
2 . . . Loading/unloading unit
3, 3A, 3B, 3C, 3D . . . Polishing unit
4 . . . Cleaning unit
5 . . . Controller
6, 7 . . . Linear transporter
10 . . . Polishing pad
11 . . . Lifter
12 . . . Swing transporter
20 . . . Front loading unit
21 . . . Traveling mechanism
22 . . . Transport robot
30A, 30B, 30C, 30D . . . Polishing table
31A, 31B, 31C, 31D . . . Top ring
32A, 32B, 32C, 32D . . . Polishing liquid supply nozzle
33A, 33B, 33C, 33D . . . Dresser
34A, 34B, 34C, 34D . . . Atomizer
36 . . . Top ring shaft
180 . . . Temporary base
190 . . . Roll cleaning chamber
191 . . . First transport chamber
192 . . . Pen cleaning chamber
193 . . . Second transport chamber
194 . . . Drying chamber
195 . . . Third transport chamber
201A, 201B . . . Roll cleaning module
202A, 202B . . . Pen cleaning module
203, 204 . . . Temporary base
205A, 205B . . . Drying module
207 . . . Filter fan unit
209, 210, 213 . . . Transport robot
211 . . . Support shaft
300 . . . Buffing chamber
300A, 300B . . . Buffing module
400 . . . Buff table
500 . . . Buff head
500a . . . Inner head (first buff head)
500b . . . Outer head (second buff head)
502 . . . Buff pad
502a . . . First part (inner pad, first buff pad)
502b . . . Second part (outer pad, second buff pad)
504, 504a, 504b . . . Shaft
506 . . . Internal supply line
509, 510, 511 . . . Bearing
512, 514 . . . Actuator
521a, 521b . . . Groove
530 . . . Gap
600 . . . Buff arm
700 . . . Liquid supply system
710 . . . External nozzle
710 . . . Pure water external nozzle
712 . . . Pure water piping
712a . . . Branch pure water piping
714 . . . Pure water supply source
716 . . . On-off valve
718 . . . On-off valve
720 . . . Chemical external nozzle
722 . . . Chemical piping
722a . . . Branch chemical piping
724 . . . Chemical supply source
726 . . . On-off valve
728 . . . On-off valve
730 . . . Slurry external nozzle
732 . . . Slurry piping
732a . . . Branch slurry piping
734 . . . Slurry supply source
736 . . . On-off valve
740 . . . Liquid supply piping
800 . . . Conditioning unit
810 . . . Dress table
820 . . . Dresser
1000 . . . Substrate processing apparatus
2-1 . . . Housing
2-1a . . . Partition
2-2 . . . Loading/unloading unit
2-3, 2-3A, 2-3B, 2-3C, 2-3D . . . Polishing unit
2-4 . . . Cleaning unit
2-5 . . . Controller
2-6, 2-7 . . . Linear transporter
2-10 . . . Polishing pad
2-11 . . . Lifter
2-12 . . . Swing transporter
2-20 . . . Front loading unit
2-21 . . . Traveling mechanism
2-22 . . . Transport robot
2-30A, 2-30B, 2-30C, 2-30D . . . Polishing table
2-31A, 2-31B, 2-31C, 2-31D . . . Top ring 2-32A, 2-32B, 2-32C, 2-32D . . . Polishing liquid supply nozzle
2-33A, 2-33B, 2-33C, 2-33D . . . Dresser
2-34A, 2-34B, 2-34C, 2-34D . . . Atomizer
2-36 . . . Top ring shaft
2-180 . . . Temporary base
2-190 . . . Roll cleaning chamber
2-191 . . . First transport chamber
2-192 . . . Pen cleaning chamber
2-193 . . . Second transport chamber
2-194 . . . Drying chamber
2-195 . . . Third transport chamber
2-201A, 2-201B . . . Roll cleaning module
2-202A, 2-202B . . . Pen cleaning module
2-203, 2-204 . . . Temporary base
2-205A, 2-205B . . . Drying module
2-207 . . . Filter fan unit
2-209, 2-210, 2-213 . . . Transport robot
2-211 . . . Support shaft
2-300 . . . Buffing chamber
2-300A, 2-300B . . . Buffing module
2-400 . . . Buff table
2-500 . . . Buff head
2-500a . . . Inner head (first buff head)
2-500b . . . Outer head (second buff head)
2-502 . . . Buff pad
2-502a . . . Inner pad (first buff pad)
2-502b . . . Outer pad (second buff pad)
2-504, 2-504a, 2-504b . . . Shaft
2-506 . . . Internal supply line
2-507 . . . Jacket structure
2-508 . . . Opening
2-509, 2-510, 2-511 . . . Bearing
2-512, 2-514 . . . Actuator
2-600 . . . Buff arm
2-700 . . . Liquid supply system
2-710 . . . Process liquid supply source
2-711 . . . Process liquid piping
2-712 . . . Flow rate controller
2-713 . . . On-off vale
2-714 . . . Check valve
2-715 . . . Filter
2-720 . . . Cleaning liquid supply source
2-721 . . . Cleaning liquid piping
2-722 . . . Flow rate controller
2-723 . . . On-off vale
2-724 . . . Check valve
2-725 . . . Filter
2-730 . . . Process liquid supply source
2-731 . . . Process liquid piping
2-732 . . . Flow rate controller
2-733 . . . On-off vale
2-734 . . . Check valve
2-735 . . . Filter
2-740 . . . Cleaning liquid supply source
2-741 . . . Cleaning liquid piping
2-743 . . . On-off vale
2-750 . . . Rotary joint
2-751 . . . Floor surface
2-760 . . . Liquid discharge system
2-761 . . . Piping
2-762 . . . Branch piping
2-767 . . . On-off valve
2-800 . . . Conditioning unit
2-810 . . . Dress table
2-820 . . . Dresser
2-910 . . . Cover
2-920 . . . Exhaust system
2-921 . . . Filter
2-922 . . . Exhaust line
2-923 . . . Drain line
2-930 . . . Humidity sensor
2-1000 . . . Substrate processing apparatus
3-3 . . . Polishing unit
3-4 . . . Cleaning unit
3-5 . . . Controller
3-10 . . . Polishing pad
3-190 . . . Roll cleaning chamber
3-192 . . . Pen cleaning chamber
3-201A . . . Upper side roll cleaning module
3-201B . . . Lower side roll cleaning module
3-202A . . . Upper side pen cleaning module
3-202B . . . Lower side pen cleaning module
3-300 . . . Buffing chamber
3-300A . . . Upper side buffing module
3-300B . . . Lower side buffing module
3-400 . . . Buff table
3-410 . . . Drive mechanism
3-500 . . . Buff head
3-502 . . . Buff pad
3-510 . . . Base member
3-520 . . . Elastic member
3-522 . . . Side face
3-524 . . . Inner peripheral space
3-526 . . . Outer peripheral space
3-530 . . . Pressurizing mechanism
3-540 . . . Guide member
3-542 . . . Facing surface
3-550 . . . Buffing liquid passage
3-560 . . . Support plate
3-600 . . . Buff arm
4-300 . . . Buffing chamber
4-300A . . . Upper side buffing module
4-300B . . . Lower side buffing module
4-400 . . . Buff table
4-500 . . . Buff head
4-502 . . . Buff pad
4-502a . . . Contact surface
4-502b . . . Peripheral edge part
4-520 . . . Bag body
4-520-1, 4-520-2, and 4-520-3 . . . Space
4-530 . . . Pressurizing mechanism
4-600 . . . Buff arm
4-800 . . . Conditioning unit
4-810 . . . Dress table
4-820 . . . Dresser
4-820a . . . Projection
4-820b . . . Slope
4-820c . . . Contact surface
4-820d . . . Peripheral edge part
4-830a, 4-830b . . . Contact point
W . . . Wafer
MT . . . Mist

What is claimed is:
1. A buffing module adapted to buff a substrate, comprising:
a buff table adapted to support the substrate, the buff table being rotatable; and
a buff head to which a buff pad is attached, being rotatable and movable in a direction of approaching the buff table and a direction of moving away from the buff table;

wherein the buff head further includes:
an elastic member,
a support member attached to a surface of the elastic member, the surface facing toward the buff table,
a pressurizing mechanism which is capable of adjusting contact force of the buff pad to the substrate by supplying a fluid to the elastic member, and
a guide member that surrounds the elastic member, the guide member including an exposed end surface facing the substrate supported by the buff table when buffing the substrate, the end surface of the guide member configured to not contact with the substrate when buffing the substrate, the guide member formed by a resin material,
wherein the buff pad is attached to the elastic member through the support member.

2. The buff module according to claim 1, further comprising
a supply line adapted to supply a process liquid to the substrate through an opening defined in the buff head.

3. The buff module according to claim 1, wherein the guide member surrounds the elastic member at least while the fluid is supplied to the elastic member.

4. The buff module according to claim 1,
wherein the elastic member includes a bag body whose volume changes according to a supply amount of the fluid,
wherein the bag body includes a plurality of spaces where the fluid is not mutually communicated, and
wherein the pressurizing mechanism can independently supply the fluid to the plurality of spaces.

5. The buff module according to claim 4,
wherein the plurality of spaces are concentrically arranged.

6. The buff module according to claim 1, wherein the buff pad is smaller than the substrate in diameter, and the buff module further includes:
a driving mechanism capable of rotating the buff table, and
a buff arm capable of holding the buff head, rotating the buff head and also swinging the buff head along the buff table.

7. The buff module according to claim 1, wherein the support member is a support plate.

8. The buff module according to claim 1, wherein the support member is made of a metal.

9. The buff module according to claim 1, wherein the support member is made of a resin.

* * * * *